(12) United States Patent
Lawton et al.

(10) Patent No.: US 6,949,289 B1
(45) Date of Patent: Sep. 27, 2005

(54) IMPREGNATED GLASS FIBER STRANDS AND PRODUCTS INCLUDING THE SAME

(75) Inventors: Ernest L. Lawton, Clemmons, NC (US); Vedagiri Velpari, Monroeville, PA (US); William B. Rice, Clemmons, NC (US); Walter J. Robertson, Pittsburgh, PA (US); Bruce E. Novich, Barrington, RI (US); Xiang Wu, Littleton, CO (US); Kami Lammon-Hilinski, Pittsburgh, PA (US)

(73) Assignee: PPG Industries ohio, Inc., Cleveland, OH (US)

( * ) Notice: Subject to any disclaimer, the term of this patent is extended or adjusted under 35 U.S.C. 154(b) by 510 days.

(21) Appl. No.: 09/705,575

(22) Filed: Nov. 3, 2000

Related U.S. Application Data

(63) Continuation of application No. 09/620,523, filed on Jul. 20, 2000, which is a continuation of application No. 09/620,524, filed on Jul. 20, 2000, now abandoned, which is a continuation of application No. 09/620,525, filed on Jul. 20, 2000, now abandoned, which is a continuation of application No. 09/620,526, filed on Jul. 20, 2000, now abandoned, which is a continuation of application No. 09/568,916, filed on May 11, 2000, now abandoned, which is a continuation of application No. 09/548,379, filed on Apr. 12, 2000, now abandoned, which is a continuation of application No. 09/527,034, filed on Mar. 16, 2000, now abandoned, which is a continuation-in-part of application No. PCT/US99/21443, filed on Oct. 8, 1999, which is a continuation-in-part of application No. 09/170,578, filed on Oct. 13, 1998, now abandoned, which is a continuation-in-part of application No. 09/130,270, filed on Aug. 6, 1998, now abandoned, which is a continuation-in-part of application No. 09/034,525, filed on Mar. 3, 1998, now abandoned, which is a continuation-in-part of application No. 09/170,780, filed on Oct. 13, 1998, now abandoned, which is a continuation-in-part of application No. 09/034,525, filed on Mar. 3, 1998, now abandoned, which is a continuation-in-part of application No. 09/170,781, filed on Oct. 13, 1998, now abandoned, which is a continuation-in-part of application No. 09/034,663, filed on Mar. 3, 1998, now abandoned, which is a continuation-in-part of application No. 09/170,579, filed on Oct. 13, 1998, now abandoned, which is a continuation-in-part of application No. 09/034,078, filed on Mar. 3, 1998, now abandoned, which is a continuation-in-part of application No. PCT/US99/21442, filed on Oct. 8, 1999, which is a continuation-in-part of application No. 09/170,566, filed on Oct. 13, 1998, now abandoned, which is a continuation-in-part of application No. 09/034,077, filed on Mar. 3, 1998, now abandoned, which is a continuation-in-part of application No. 09/170,565, filed on Oct. 13, 1998, now abandoned, which is a continuation-in-part of application No. 09/034,056, filed on Mar. 3, 1998, now abandoned.

(51) Int. Cl.[7] ............................................. D02G 15/00
(52) U.S. Cl. ...................... 428/372; 428/375; 428/378; 428/392
(58) Field of Search ................................ 428/372, 375, 428/378, 392

(56) References Cited

U.S. PATENT DOCUMENTS

| | | | |
|---|---|---|---|
| 2,740,239 A | 4/1956 | Ball et al. | 51/185 |
| 2,793,478 A | 5/1957 | Rohowetz et al. | 51/188 |
| 2,797,469 A | 7/1957 | Kahn et al. | 28/80 |
| 3,146,560 A | 9/1964 | Hurst et al. | 51/188 |
| 3,312,569 A * | 4/1967 | Philipps et al. | 428/372 |
| 3,556,448 A | 1/1971 | Dobbs | 248/119 |
| 3,586,063 A | 6/1971 | Bell, Jr. et al. | 139/425 |
| 3,664,855 A | 5/1972 | Morrison et al. | 106/212 |
| 3,688,453 A | 9/1972 | Legacy et al. | 51/400 |
| 3,709,721 A | 1/1973 | King | 117/104 |
| 3,919,028 A | 11/1975 | Lewis | 156/148 |
| 4,009,317 A | 2/1977 | Chase et al. | 428/378 |
| 4,118,528 A * | 10/1978 | Lowry | 428/65 |
| 4,168,345 A | 9/1979 | de Massey et al. | 428/441 |
| 4,228,514 A | 10/1980 | Weiss | 364/475 |
| 4,247,364 A | 1/1981 | Culp | 162/136 |
| 4,282,011 A * | 8/1981 | Terpay | 51/298 |
| 4,370,157 A | 1/1983 | Barch et al. | 65/3.43 |
| 4,372,347 A | 2/1983 | Olson | 139/420 |
| 4,379,798 A | 4/1983 | Palmer | 428/113 |
| 4,383,785 A | 5/1983 | Rice | 409/131 |
| 4,390,647 A | 6/1983 | Girgis | 523/212 |
| 4,396,676 A | 8/1983 | Brannon et al. | 17/4 |
| 4,514,466 A | 4/1985 | Leon et al. | 428/383 |
| 4,530,876 A | 7/1985 | Brodmann et al. | 428/283 |
| 4,532,054 A | 7/1985 | Johnson | 252/12.4 |

| | | | | | | |
|---|---|---|---|---|---|---|
| 4,605,588 A | | 8/1986 | Simpson et al. ............. 428/288 | 5,449,480 A | 9/1995 | Kuriya et al. ................ 264/112 |
| 4,615,933 A | | 10/1986 | Traut .......................... 428/252 | 5,460,883 A * | 10/1995 | Barber, Jr. et al. .......... 428/370 |
| 4,642,271 A | | 2/1987 | Rice ............................ 428/698 | 5,507,603 A | 4/1996 | Nakano et al. ................. 408/1 |
| 4,643,936 A | | 2/1987 | Eidal ........................... 428/214 | 5,507,962 A | 4/1996 | Jahanmir et al. ........... 252/49.3 |
| 4,713,285 A * | | 12/1987 | Klein .......................... 428/283 | 5,508,096 A | 4/1996 | Van Skyhawk .............. 428/251 |
| 4,750,806 A | | 6/1988 | Biswas ....................... 350/96.3 | 5,520,999 A | 5/1996 | Van Skyhawk et al. .... 428/251 |
| 4,752,527 A | | 6/1988 | Sanzero et al. .............. 428/391 | 5,541,238 A | 7/1996 | Yamada et al. .............. 523/200 |
| 4,762,750 A | | 8/1988 | Girgis et al. ................. 428/378 | 5,552,215 A | 9/1996 | Tredway et al. ............. 428/298 |
| 4,762,751 A | | 8/1988 | Girgis et al. ................. 428/378 | 5,562,966 A | 10/1996 | Clarke et al. ................ 428/113 |
| 4,764,424 A * | | 8/1988 | Ganga et al. ................ 428/327 | 5,591,789 A | 1/1997 | Iruvanti et al. .............. 523/515 |
| 4,781,495 A | | 11/1988 | Hatch ............................ 408/1 | 5,593,767 A | 1/1997 | Noda et al. .................. 428/251 |
| 4,789,593 A | | 12/1988 | Das ............................. 428/391 | 5,616,411 A * | 4/1997 | Barber, Jr. et al. .......... 428/373 |
| 4,795,678 A | | 1/1989 | Girgis ......................... 428/391 | 5,672,297 A | 9/1997 | Soane ......................... 252/511 |
| 4,806,416 A * | | 2/1989 | Puzo ........................... 428/285 | 5,674,351 A | 10/1997 | Lovoi ......................... 156/629 |
| 4,820,575 A | | 4/1989 | Kolzer ........................ 428/240 | 5,677,045 A | 10/1997 | Nagai et al. ................. 428/260 |
| 4,826,365 A | | 5/1989 | White .......................... 408/144 | 5,690,715 A | 11/1997 | Schiwek ....................... 65/448 |
| 4,858,479 A | | 8/1989 | Voss ............................. 73/865 | 5,690,837 A | 11/1997 | Nakaso et al. ................ 216/17 |
| 4,863,787 A | | 9/1989 | Gawin ......................... 428/240 | 5,707,734 A | 1/1998 | Hawkins et al. ............. 428/372 |
| 4,869,954 A | | 9/1989 | Squitieri ...................... 428/283 | 5,719,090 A | 2/1998 | Appelt et al. .................. 442/19 |
| 4,872,787 A | | 10/1989 | Arai et al. ...................... 408/1 | 5,733,823 A | 3/1998 | Sugioka et al. .............. 442/110 |
| 4,894,105 A | | 1/1990 | Dyksterhouse et al. ...... 156/181 | 5,759,924 A | 6/1998 | Sahlin ........................... 442/60 |
| 4,913,740 A | | 4/1990 | Frederickson ............... 106/1.11 | 5,800,874 A | 9/1998 | Appelt et al. ................ 427/412 |
| 4,917,547 A | | 4/1990 | Frederickson et al. ......... 408/1 | 5,858,461 A | 1/1999 | Appelt et al. ................ 427/217 |
| 4,929,370 A | | 5/1990 | Hatch et al. ................ 252/12.2 | 5,869,173 A | 2/1999 | Zheng et al. ............. 428/313.3 |
| 4,933,381 A | | 6/1990 | Hager ......................... 523/414 | 5,871,819 A | 2/1999 | Appelt et al. ................ 427/381 |
| 4,935,294 A | | 6/1990 | Misevich et al. ............ 422/246 | 5,877,240 A | 3/1999 | Piret et al. ................... 523/415 |
| 4,943,606 A | | 7/1990 | Inoue et al. ................. 523/457 | 5,888,036 A | 3/1999 | Arai et al. ................... 408/230 |
| 4,948,662 A | | 8/1990 | Simpson et al. ............. 428/288 | 5,888,627 A | 3/1999 | Nakatani ..................... 428/901 |
| 4,960,634 A | | 10/1990 | Boyko et al. ................ 428/113 | 5,907,106 A | 5/1999 | Segar ....................... 73/62.338 |
| 4,971,779 A | | 11/1990 | Paine, Jr. et al. ............ 423/290 | 5,935,452 A | 8/1999 | Inada et al. ................... 216/20 |
| 4,997,702 A | | 3/1991 | Gazit et al. .................. 428/283 | 5,940,787 A | 8/1999 | Gelston ....................... 702/134 |
| 5,005,978 A | | 4/1991 | Skunes et al. ............... 365/372 | 5,984,523 A | 11/1999 | Houser et al. ................. 374/31 |
| 5,011,870 A | | 4/1991 | Peterson ..................... 523/220 | 5,998,237 A | 12/1999 | Conrod et al. .............. 438/106 |
| 5,024,890 A * | | 6/1991 | Pollet et al. ................. 428/372 | 6,000,886 A | 12/1999 | Washio et al. .................. 408/1 |
| 5,025,045 A | | 6/1991 | Gawin et al. ................ 523/113 | 6,060,150 A | 5/2000 | Nakatani et al. ............ 428/209 |
| 5,028,984 A | | 7/1991 | Ameen et al. ................ 357/72 | 6,124,220 A | 9/2000 | Nakata et al. ............... 442/278 |
| 5,038,555 A | | 8/1991 | Wu et al. ...................... 57/249 | 6,270,562 B1 * | 8/2001 | Jia ............................... 106/35 |
| 5,047,279 A | | 9/1991 | Nasu et al. .................. 428/156 | | | |
| 5,047,281 A | | 9/1991 | Betz et al. ................... 428/201 | FOREIGN PATENT DOCUMENTS | | |
| 5,082,402 A | | 1/1992 | Gaku et al. .................... 408/1 | CH | 670 105 A5 | 8/1986 |
| 5,126,532 A | | 6/1992 | Inagawa et al. ............. 219/121 | DE | 4-230625 | 3/1994 |
| 5,132,254 A | | 7/1992 | Stempin et al. ............... 501/32 | DE | 2-9609017 | 8/1996 |
| 5,151,146 A | | 9/1992 | Green ......................... 156/177 | EP | 468 476 A2 | 7/1991 |
| 5,188,757 A | | 2/1993 | Paine, Jr. et al. ....... 252/183.1 | FJ | 156587 | 9/1982 |
| 5,204,295 A | | 4/1993 | Paine, Jr. et al. ............ 501/96 | FR | 2 503 766 | 10/1982 |
| 5,206,085 A | | 4/1993 | Nakagawa et al. .......... 428/372 | GB | 2 236 540 A | 10/1991 |
| 5,217,778 A | | 6/1993 | LaCasse ...................... 428/64 | JP | 5-1070457 | 6/1976 |
| 5,219,656 A | | 6/1993 | Klett et al. .................. 428/378 | JP | 53-143582 | 12/1978 |
| 5,230,951 A | | 7/1993 | Birchall et al. ............. 428/292 | JP | 5-7045054 | 3/1982 |
| 5,232,970 A | | 8/1993 | Solc et al. ................... 524/404 | JP | 5-9064355 | 4/1984 |
| 5,236,777 A | | 8/1993 | Inoguchi et al. ............. 428/268 | JP | 6029072 A | 10/1985 |
| 5,240,770 A | | 8/1993 | Moriga et al. ............... 428/372 | JP | 61-213115 | 9/1986 |
| 5,246,746 A | | 9/1993 | Michalske et al. | JP | 6248572 A | 3/1987 |
| 5,281,441 A | | 1/1994 | Kasal et al. ..................... 3/12 | JP | 63224940 | 9/1988 |
| 5,284,807 A | | 2/1994 | Komori et al. ............... 501/35 | JP | 63270106 | 11/1988 |
| 5,286,562 A | | 2/1994 | Girgis ......................... 428/391 | JP | 1121361 | 5/1989 |
| 5,312,687 A * | | 5/1994 | Pollet et al. ................. 428/372 | JP | 1152138 | 6/1989 |
| 5,324,766 A | | 6/1994 | Ikejiri et al. ................. 524/451 | JP | 1202442 | 8/1989 |
| 5,326,410 A | | 7/1994 | Boyles ........................ 156/98 | JP | 1222950 | 9/1989 |
| 5,336,024 A | | 8/1994 | Nakagawa et al. ............ 408/1 | JP | 2-160944 | 6/1990 |
| 5,354,602 A | | 10/1994 | Stranford et al. ........... 428/220 | JP | 2160944 | 6/1990 |
| 5,358,741 A | | 10/1994 | Gat ............................. 427/249 | JP | 63-75856 | 6/1990 |
| 5,364,657 A | | 11/1994 | Throne ....................... 427/185 | JP | 3-115332 | 5/1991 |
| 5,370,911 A | | 12/1994 | Throne et al. ............... 427/185 | JP | 3-152808 | 6/1991 |
| 5,387,468 A * | | 2/1995 | Pollet et al. ................. 428/372 | JP | 3212987 | 9/1991 |
| 5,412,003 A | | 5/1995 | Akiyama et al. ............ 523/513 | JP | 3214685 | 9/1991 |
| 5,418,194 A | | 5/1995 | Dawes et al. ................. 501/52 | JP | 2251651 | 10/1991 |
| 5,427,986 A | | 6/1995 | Chyung et al. ............... 501/92 | JP | 4-2857 | 1/1992 |
| 5,431,995 A | | 7/1995 | Narita et al. ................ 428/285 | JP | 4-55437 | 2/1992 |
| 5,435,671 A | | 7/1995 | Weinreich .................... 408/1 | JP | 4125140 | 4/1992 |
| 5,443,906 A * | | 8/1995 | Pihl et al. .................... 428/370 | JP | 4255288 | 9/1992 |

| | | |
|---|---|---|
| JP | 4366628 | 12/1992 |
| JP | 4367763 | 12/1992 |
| JP | 3-87232 | 3/1993 |
| JP | 5-110218 | 4/1993 |
| JP | 5-174623 | 7/1993 |
| JP | 5-261855 | 10/1993 |
| JP | 5261870 | 10/1993 |
| JP | 5-286093 | 11/1993 |
| JP | 6-112611 | 4/1994 |
| JP | 6-302926 | 10/1994 |
| JP | 6-305078 | 11/1994 |
| JP | 7022718 | 1/1995 |
| JP | 7069683 | 3/1995 |
| JP | 7-102483 | 4/1995 |
| JP | 7176843 | 7/1995 |
| JP | 7-279055 | 10/1995 |
| JP | 8-012380 | 1/1996 |
| JP | 9-241397 | 3/1996 |
| JP | 8-118542 A | 5/1996 |
| JP | 8-119682 | 5/1996 |
| JP | 8309928 | 11/1996 |
| JP | 8-309928 | 11/1996 |
| JP | 8-325950 | 12/1996 |
| JP | 9-3770 | 1/1997 |
| JP | 4-307787 | 1/1997 |
| JP | 9-003217 A | 1/1997 |
| JP | 9-308809 | 2/1997 |
| JP | 9087992 A | 3/1997 |
| JP | 9-118759 | 5/1997 |
| JP | 9118759 | 5/1997 |
| JP | 9-208268 | 8/1997 |
| JP | 9-209233 | 8/1997 |
| JP | 9-241397 A | 9/1997 |
| JP | 9-268034 | 10/1997 |
| JP | 9-270584 | 10/1997 |
| JP | 9291474 A | 11/1997 |
| JP | 10-146916 | 6/1998 |
| JP | 1203247 A | 8/1998 |
| JP | 9255374 A | 9/1998 |
| JP | 10338758 | 12/1998 |
| JP | 11269752 | 10/1999 |
| JP | 11-286073 | 10/1999 |
| RU | 2072121 | 7/1991 |
| SU | 859400 B | 3/1996 |
| WO | WO90/01860 | 2/1990 | |
| WO | 90/01860 | 2/1990 | ............ H05K/1/03 |
| WO | WO96/39364 | 12/1996 | |
| WO | 96/39364 | 12/1996 | ............ C03C/25/02 |
| WO | 97/14280 | 4/1997 | |
| WO | WO 97/35457 | 9/1997 | |
| WO | 99/44955 | 9/1999 | ............ C03C/25/02 |
| WO | 99/44956 | 9/1999 | ............ C03C/25/02 |
| WO | 99/44958 | 9/1999 | ............ C03C/25/02 |
| WO | 99/44959 | 9/1999 | ............ C03C/25/02 |
| WO | 00/21899 | 4/2000 | ............ C03C/25/02 |
| WO | 00/21900 | 4/2000 | ............ C03C/25/10 |

OTHER PUBLICATIONS

COMPENDEX–EIX99284673861; J.Journal Article; "Glass Yarn: Sized For Better PCD Fabrication And Properties"; Novich, Bruce E.; *Printed Circuit Fabrication*; vol. 22, p. 52–53.

K. Loewenstein, *The Manufacturing Technology of Glass Fibers*, (3d Ed. 1993) at pp. 30–44, 115–122, 126–135, 237–291.

*Encyclopedia of Polymer Science and Technology*, vol. 6 (1967) at pp. 505–712.

R. Lewis, Sr., *Hawley's Condensed Chemical Dictionary*, (12th Ed. 1993) at pp. 609–610, 1075, 461, 425, 331, 793, 1113, 782–784, 305, 164, 141, 712, 435, 795.

F. Clauss, *Solid Lubricants and Self–Lubicating Solids*, (1972) at pp. 1, 19–22, 42–54, 75–77, 80–81, 82, 90–102, 113–120, 128.

K. Ludema, *Friction, Wear, Lubrication*, A Textbook in Tribology (1996) at pp. 129, 125. 27.

R. West (Ed.), *Handbook of Chemistry and Physics*, CRC Press (1975) at pp. F–22.

W. Campbell, "Solid Lubricants," *Boundary Lubrication; An Appraisal of World Literature*, ASME Research Committee on Lubrication (1969) at pp. 197–203.

"PolarTherm® Thermally Conductive Fillers for Polymeric Materials", a Technical Bulletin of Advanced Ceramics Corp. of Lakewood, Ohio (1996).

H. Katz et al. (Ed.), *Handbook of Fillers and Plastics*, "2. Principles of Filler Selection and Use" by T.H. Ferrigno (1987) at pp. 8–10, 28.

"Orpac Boron Nitride Releasecoat–Conc" , a technical bulletin of ZYP Coatings, Inc.

ASTM Designation: C–177–85 Standard Test Method for Steady–State Heat Flux Measujrements and Thermal Transmission Properties by Means of the Guarded–Hot–Plate Apparatus$^1$ (1993).

T. Perros, *Chemistry*, (1967) at pp. 186–187.

J. Mitchell, *Fundamentals of Soil Behavior*, (1976) at pp. 32–34.

H. Van Olphen, *Clay Colloid Chemistry*, (2d Ed. 1977) at pp. 57–63.

*Minerals in Soil Environments*, Soil Science Society of America (1977) at pp. 196–199.

R. Evans, *An Introduction to Crystal Chemistry*, (1948) at pp. 275–276.

*Electronic Materials Handbook*™, vol. 1, Packaging ASM International (1989) at pp. 534–537, 113–115.

*Webster New Collegiate Dictionary*, (1977) at pp. 1178.

R. Tummalas (Ed.), *Microelectronics Packaging Handbook*, 1989 at pp. 895–897, 905, 906, 36, 37, 3, 174.

I. Rubin, *Handbook of Plastic Materials and Technology*, (1990) at pp. 955–1062, 1179–1215 and 1225–1271.

R. Weast (Ed.), *CRC Handbook of Chemistry and Physics*, CRC Press (71st Ed. 1990) at pp. 4–158, 12–63.

ASTM Designation: C–518–91 Standard Test Method for Steady–State Heat Flux Measurements and Thermal Transmission Properties by Means of the Heat Flow Meter Apparatus$^1$.

G. Slack, "Nonmetallic Crystals with High Thermal Conductivity", *J. Phys. Chem. Solids*(1973) vol. 34, pp. 321–335.

A. Weimer (Ed.), *Carbide, Nitride and Boride Materials Synthesis and Processing*, (1997) at pp. 654, 653.

W. Callister, *Materials Science and Engineering An Introduction*, (2d Ed. 1991) at pp. 637, 662.

"WebElements" http:// www.shef.ac.uk/~chem/web–elents/ nofr–image–1/hardness–minerals–1.html (Feb. 26, 1998).

"Braze Stop–off Paint" ZYP Coatings, Inc. technical bulletin.

"Boron Nitride Lubricoat®" ZYP Coatings, Inc. technical bulletin.*

"Weld Spatter Release" ZYP Coatings, Inc. technical bulletin.*

"Boron Nitride Lubricoat®–BNW", ZYP Coatings, Inc. technical bulletin.*

"New Lubricating Materials Halves Friction", *Inside R&D/ Copyright* (Jun. 25, 1997) at pp. 1–2.

"Hollow Nanoparticles Excel in Lubrication", *C&EN* (Jun. 23, 1997) at pp. 9–10.

J. Halling, *Priniciples of Tribology*, (1975) at pp. 134–139.

J. Fernando et al., "Effect of Boron Nitride Coating on the Tensile Strength of Nextel 480™ Fiber", *Materials Science and Engineering* A154 (1992) 103–108.

R. Singh et al., "Effect of Boron Nitride Coating on Fiber-Matrix Interactions", *Advanced Ceramic Materials*, vol. 3, No. 3 (1988) 235–237.

E. Einset et al., "Processing Conditions for Boron Nitride Coatings in Fiber Bundles via Chemical Vapor Disposition", *J. Am. Ceram Society*, 77 [12 ](1994) 3081–3086.

S. Campbell et al., "In-situ Formation of Boron Nitride Interfaces on Nextel 312™ Continuous Ceramic Fiber I: Nitriding Process and Blackglas™ Ceramic Matrix Composite Properties" Allied Signal pp. 327–336.

Shen et al., "Characterization of Dip Coated Boron Nitride on Silicon Carbide Fibers", J. Am. Ceram Society, 77 [4] 1011–1016 (1994).

J. Brennan, "Interfaces in BN Coated Fiber Reinforced Glass–Ceramic Matrix Composites", 31 Soripta Metallurgica et Materialia, No. 8 (1994) pp. 959–964.

D. Cranmer, "Fiber Coating and Characterization", 68 *Ceramic Bulletin*, No. 2 (1989) pp. 415–419.

Kirk–Othmer Encyclopedia of Chemical Technology, 2d Ed., 1967, vol. 12, pp. 588–596.

R. Weast (Ed), Handbook of Chemistry and Physics, CRC Press 1975, pp. 12–54, F–166, D–171.

Kirk–Othmer Encyclopedia of Chemical Technology, 2d Ed, 1964, vol. 3, pp. 678–679.

Kirk–Othmer Encyclopedia of Chemical Technology, 2d Ed., 1964, vol. 4, pp. 158–162, 203, 217, 304–307, 330–331.

Sulzer Ruti L5000 Product Bulletin.

Sulzer Ruti L5200 Air–Jet Weaving Machine Product Bulletin.

IPC–EG–140 Specification for Finished Fabric Woven from "E" Glass for Printed Boards, p. 1, publication of the Institute for Interconnecting and Packaging Electronic Circuits (Jun. 1997).

IPC–TM–650 Test Methods Manual, The Institute for Interconnecting and Packaging Electronic Circuits (Dec. 1994).

"Fabrics Around the World", Technical Bulletin of Clark-Schwebel, Inc. (1995).

Microelectronics Packaging Handbook, R. Tummala et al. (Ed.) (1989) at pp. 25–43, 174, 858–861, and 885–909.

Printed Circuits Handbook, C. Coombs Jr., 3d Ed. by Hewlett–Packard Company, pp. 6.1–6.14.

Silane Coupling Agents by E. P. Plueddemann of Dow Cornig Corporation (1982), pp. 146–147.

IPC–4101 "Specification for Base Materials for Rigid and Multilayer Printed Boards" (Dec. 1997).

K. Loewenstein, *The Manufacturing Technology of Glass Fibers*, (3d Ed. 1993) at pp. 25, 27 and 47–60.

Database Inspec Institute of Electrical Engineers, Insp No. 624215, Bruce Novich entitled Hybon RCY Yarns: A Laminate Reinforcement Developed for Printed Circuit Broads, CircuiTree, Mar. 1999, vol. 12, No. 3, p. 44, 46, 51.

Patent Abstracts of Japan, vol. 14, No. 423, Sep. 1990, Pub. No. 02160944, Pub. Date Jun. 1990 entitled "Printed Circuit Board and Fabric Therefor".

* cited by examiner

*Primary Examiner*—Rena Dye
*Assistant Examiner*—J. M. Gray
(74) *Attorney, Agent, or Firm*—Andrew C. Siminerio

(57) ABSTRACT

The present invention provides an at least partially coated fiber strand comprising a plurality of glass fibers having a coating composition on at least a portion of at least one of the glass fibers, the coating composition comprising at least one coating comprising greater than 20 weight percent on a total solids basis of a plurality of particles selected from inorganic particles, organic hollow particles, composite particles, and mixtures of any of the foregoing, wherein the plurality of particles have a Mohs' hardness value which does not exceed the Mohs' hardness value of the glass fibers.

35 Claims, 7 Drawing Sheets

IMPREGNATED GLASS FIBER STRANDS AND PRODUCTS INCLUDING THE SAME

RELATED APPLICATIONS

This application is a continuing application of (a) U.S. patent application Ser. No. 09/620,523 of B. Novich et al. entitled "Inorganic Particle-Coated Glass Fiber Strands and Products Including the Same" filed Jul. 20, 2000; (b) U.S. patent application Ser. No. 09/620,524 of B. Novich et al. entitled "Inorganic Particle-Coated Glass Fiber Strands and Products Including the Same" filed Jul. 20, 2000, now abandoned; (c) U.S. patent application Ser. No. 09/620,525 of B. Novich et al. entitled "Inorganic Particle-Coated Glass Fiber Strands and Products Including the Same" filed Jul. 20, 2000, now abandoned; and (d) U.S. patent application Ser. No. 09/620,526 of B. Novich et al. entitled "Inorganic Particle-Coated Glass Fiber Strands and Products Including the Same" filed Jul. 20, 2000, now abandoned; which are continuing applications of U.S. patent application Ser. No. 09/568,916 of Novich et al. entitled "Impregnated Glass Fiber Strands and Products Including the Same", filed May 11, 2000, now abandoned, which is a continuing application of U.S. patent application Ser. No. 09/548,379 of B. Novich et al. entitled "Impregnated Glass Fiber Strands and Products Including the Same", filed Apr. 12, 2000, now abandoned, which is a continuing application of U.S. patent application Ser. No. 09/527,034 of Novich et al. entitled "Impregnated Glass Fiber Strands and Products Including the Same", filed Mar. 16, 2000, now abandoned, which is (a) a continuation-in-part of International Application PCT/US99/21443 of B. Novich et al. entitled "Glass Fiber-Reinforced Prepregs, Laminates, Electronic Circuit Boards and Methods for Assembling Fabric", with an international filing date of Oct. 8, 1999, which is a continuation-in-part of U.S. patent application Ser. No. 09/170,578 of B. Novich et al. entitled "Glass Fiber-Reinforced Laminates, Electronic Circuit Boards and Methods for Assembling a Fabric", filed Oct. 13, 1998, now abandoned, which is a continuation-in-part of U.S. patent application Ser. No. 09/130,270 of B. Novich et al. entitled "Glass Fiber-Reinforced Laminates, Electronic Circuit Boards and Methods for Assembling a Fabric", filed Aug. 6, 1998, now abandoned, which is a continuation-in-part application of U.S. Ser. No. 09/034,525 of B. Novich et al. entitled "Inorganic Lubricant-Coated Glass Fiber Strands and Products Including the Same" filed Mar. 3, 1998, now abandoned; (b) also a continuation-in-part of U.S. patent application Ser. No. 09/170,780 of B. Novich et al. entitled "Inorganic Lubricant-Coated Glass Fiber Strands and Products Including the Same" filed Oct. 13, 1998, now abandoned, which is a continuation-in-part application of U.S. patent application Ser. No. 09/034,525 of B. Novich et al. entitled "Inorganic Lubricant-Coated Glass Fiber Strands and Products Including the Same" filed Mar. 3, 1998, now abandoned; (c) also a continuation-in-part of U.S. patent application Ser. No. 09/170,781 of B. Novich et al. entitled "Glass Fiber Strands Coated With Thermally Conductive Inorganic Solid Particles and Products Including the Same" filed Oct. 13, 1998, now abandoned, which is a continuation-in-part application of U.S. application Ser. No. 09/034,663 filed Mar. 3, 1998, now abandoned; (d) also a continuation-in-part of U.S. patent application Ser. No. 09/170,579 of B. Novich et al. entitled "Methods for Inhibiting Abrasive Wear of Glass Fiber Strands" filed Oct. 13, 1998, now abandoned, which is a continuation-in-part application of U.S. patent application Ser. No. 09/034,078 filed Mar. 3, 1998, now abandoned; (e) also a continuation-in-part of International Application PCT/US99/21442 to B. Novich et al. entitled "Impregnated Glass Fiber Strands and Products Including the Same", with an international filing date of Oct. 8, 1999, which a continuation-in-part of U.S. patent application Ser. No. 09/170,566 of B. Novich et al. entitled "Impregnated Glass Fiber Strands and Products Including the Same" filed Oct. 13, 1998, now abandoned, which is a continuation-in-part application of U.S. patent application Ser. No. 09/034,077 filed Mar. 3, 1998, now abandoned; and (f) also a continuation-in-part of U.S. patent application Ser. No. 09/170,565 of B. Novich et al. entitled "Inorganic Particle-Coated Glass Fiber Strands and Products Including the Same" filed Oct. 13, 1998, now abandoned, which is a continuation-in-part application of U.S. patent application Ser. No. 09/034,056 filed Mar. 3, 1998, now abandoned.

This application 09/020,523 filed Jul. 20, 2000 claims the benefit of U.S. Provisional Application Nos. 60/133,075 filed May 7, 1999; 60/133,076 filed May 7, 1999; 60/136,110 filed May 26, 1999; 60/146,337 filed Jul. 30, 1999; 60/146,605 filed Jul. 30, 1999; 60/146862 filed Aug. 3, 1999; and 60/183,562 filed Feb. 18, 2000.

This invention relates generally to coated fiber strands for reinforcing composites and, more specifically, to coated fiber strands that are compatible with a matrix material that the strands are incorporated into.

In thermosetting molding operations, good wet-through (penetration of a polymeric matrix material through the mat or fabric) and "wet-through" (penetration of a polymeric matrix material through the individual bundles or strands of fibers in the mat or fabric) properties are desirable. In contrast, good dispersion properties (i.e., good distribution properties of fibers within a thermoplastic material) are of predominant concern in typical thermoplastic molding operations.

In the case of composites or laminates formed from fiber strands woven into fabrics, in addition to providing good wet-through and good wet-out properties of the strands, it is desirable that the coating on the surfaces of the fibers strands protect the fibers from abrasion during processing, provide for good weavability, particularly on air-jet looms and be compatible with the polymeric matrix material into which the fiber strands are incorporated. However, many sizing components are not compatible with the polymeric matrix materials and can adversely affect adhesion between the glass fibers and the polymeric matrix material. For example, starch, which is a commonly used sizing component for textile fibers, is generally not compatible with polymeric matrix material. As a result, these incompatible materials must be removed from the fabric prior to impregnation with the polymeric matrix material.

The removal of such non-resin compatible sizing materials, i.e., de-greasing or de-oiling the fabric, can be accomplished through a variety of techniques. The removal of these non-resin compatible sizing materials is most commonly accomplished by exposing the woven fabric to elevated temperatures for extended periods of time to thermally decompose the sizing(s) (commonly referred to as heat-cleaning). A conventional heat-cleaning process involves heating the fabric at 380° C. for 60–80 hours. However, such heat cleaning steps are detrimental to the strength of the glass fibers, are not always completely successful in removing the incompatible materials and can further contaminate the fabric with sizing decomposition products. Other methods of removing sizing materials have been tried, such as water washing and/or chemical removal. However, such methods generally require significant reformulation of the sizing compositions for compatibility with such water washing and/or chemical removal operations and are generally not as effective as heat-cleaning in removing all the incompatible sizing materials.

In addition, since the weaving process can be quite abrasive to the fiber glass yarns, those yarns used as warp yarns are typically subjected to a secondary coating step prior to weaving, commonly referred to as "slashing", to coat the warp yarns with an abrasion resistance coating (commonly referred to as a "slashing size") to help minimize abrasive wear of the glass fibers. The slashing size is generally applied over the primary size that was previously applied to the glass fibers during the fiber forming operation. However, since typical slashing sizes are also not generally compatible with the polymeric matrix materials, they too must be removed from the woven fabric prior to its incorporation into the resin.

Furthermore, to improve adhesion between the decreased or de-oiled fabric and the polymeric resin, a finishing size, typically a silane coupling agent and water, is applied to the fabric to re-coat the glass fibers in yet another processing step (commonly called "finishing").

All of these non-value added processing steps: slashing, decreasing or de-oiling, and finishing, increase fabric production cycle time and cost. Additionally, they generally require significant investment in capital equipment and labor. Moreover, the added handling of the fabric associated with these processing steps can lead to fabric damage and decreased quality.

Efforts have been directed toward improving the efficiency or effectiveness of some of these processing steps. There nevertheless remains a need for coatings that can accomplish one or more of the following: inhibit abrasion and breakage of glass fibers; be compatible with a wide variety of matrix materials; and provide for good wet-out and wet-through by the matrix material. In addition, it would be particularly advantageous if the coatings were compatible with modern air-jet weaving equipment to increase productivity. Furthermore, it would be advantageous to eliminate the non-value added processing steps in a fabric forming operation while maintaining the fabric quality required for electronic support applications and providing for good laminate properties.

The foregoing summary, as well as the following detailed description of the preferred embodiments, will be better understood when read in conjunction with the appended drawings. In the drawings.

Figure 1:
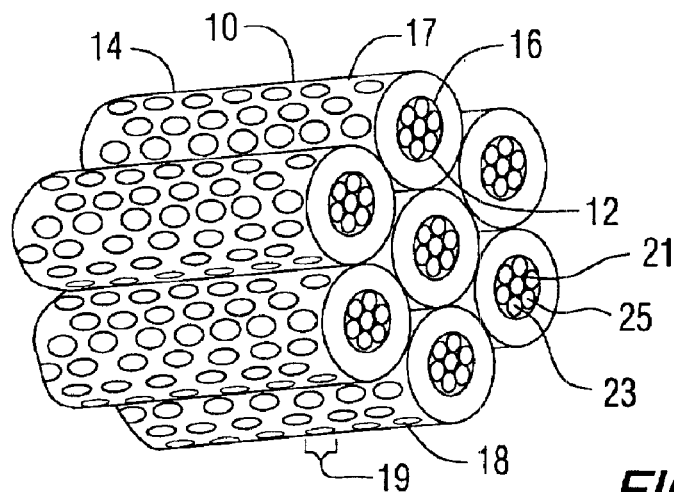
FIG. 1 is a perspective view of a coated fiber strand at least partially coated with a coating composition according to the present invention.

The fiber strands of the present invention have a unique coating that not only preferably inhibits abrasion and breakage of the fibers during processing but also provides at least one of the following properties: good wet-through, wet-out and dispersion properties in formation of composites. As fully defined below, a "strand" comprises a plurality of individual fibers, i.e., at least two fibers. As used herein, "composite" means the combination of the coated fiber strand of the present invention with an additional material, for example, but not limited to, one or more layers of a fabric incorporating the coated fiber strand combined with a polymeric matrix material to form a laminate. Good laminate strength, good thermal stability, good hydrolytic stability (i.e. resistance to migration of water along the fiber/polymeric matrix material interface), low corrosion and reactivity in the presence of high humidity, reactive acids and alkalies and compatibility with a variety of polymeric matrix materials, which can eliminate the need for removing the coating, and in particular heat or pressurized water cleaning, prior to lamination, are other desirable characteristics which can be exhibited by the coated fiber strands of the present invention.

Preferably, the coated fiber strands of the present invention provide good processability in weaving and knitting. Low fuzz and halos, low broken filaments, low strand tension, high Liability and low insertion time are preferred characteristics, individually or in combination, provided by the coated glass fiber strands of the present invention that preferably facilitate weaving and knitting and consistently provide a fabric with few surface defects for printed circuit board applications. In addition, coated fiber strands of the present invention can be suitable for use in an air jet weaving process. As used herein, "air jet weaving" means a type of fabric weaving in which the fill yarn (weft) is inserted into the warp shed by a blast of compressed air from one or more air jet nozzles.

The coated fiber strands of the present invention preferably have a unique coating that can facilitate thermal conduction along coated surfaces of the fibers. When used as a continuous reinforcement for an electronic circuit board, such coated glass fibers of the present invention can provide a mechanism to promote heat dissipation from a heat source (such as a chip or circuit) along the reinforcement to conduct heat away from the electronic components and thereby inhibit thermal degradation and/or deterioration of the circuit components, glass fibers and polymeric matrix material. The coated glass fibers of the present invention preferably provide a higher thermal conductivity phase than the matrix material, i.e., a preferential path for heat dissipation and distribution, thereby reducing differential thermal expansion and warpage of the electronic circuit board and improving solder joint reliability.

The coated glass fiber strands of the present invention preferably lessen or eliminate the need for incorporating thermally conductive materials in the matrix resin, which improves laminate manufacturing operations and lowers costly matrix material supply tank purging and maintenance.

The coated fiber strands of the present invention preferably possess high strand openness. As used herein, the term "high strand openness" means that the strand has an enlarged cross-sectional area and that the filaments of the strand are not tightly bound to one another. The high strand openness can facilitate penetration or wet out of matrix materials into the strand bundles.

Composites, and in particular laminates, of the present invention, made from the fiber strands of the present invention, preferably possess at least one of the following properties: low coefficient of thermal expansion; good flexural strength; good interlaminar bond strength; and good hydrolytic stability, i.e., the resistance to migration of water along the fiber/matrix interface. Additionally, electronic supports and printed circuit boards of the present invention made from the fiber strands in accordance with the present invention preferably have at least one of the following properties: good drillability; and resistance to metal migration (also referred to as cathodic-anodic filament formation or CAF). See Tummala (Ed.) et al., *Microelectronics Packaging Handbook*, (1989) at pages 896–897 and IPC-TR476B, "Electrochemical Migration: Electrochemically Induced Failures in Printed Wiring Boards and Assemblies", (1997) which are specifically incorporated by reference herein. Fiber strands in accordance with the present invention with good drillability have at least one of low tool wear during drilling and good locational accuracy of drilled holes.

As described above, typical fabric forming operations involve subjecting fiber glass yarns and fabric made therefrom to several non-value added processing steps, such as slashing, heat-cleaning and finishing. The present invention preferably provides methods of forming fabrics, laminates, electronic supports and printed circuit boards that eliminate non-value added processing steps from the fabric forming process while providing fabrics having quality suitable for use in electronic packaging applications. Other advantages of preferred embodiments of the present invention include reduced production cycle time, elimination of capital equipment, reduced fabric handling and labor costs, good fabric quality and good final product properties.

The present invention also provides methods to inhibit abrasive wear of fiber strands from contact with other solid objects, such as portions of a winding, weaving or knitting device, or by interfilament abrasion by selecting fiber strands having a unique coating of the present invention.

For the purposes of this specification, other than in the operating examples, or where otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical value, however, inherently contain certain errors necessarily resulting from the standard deviation found in their respective testing measurements.

Referring now to FIG. 1, wherein like numerals indicate like elements throughout, there is shown in FIG. 1 a coated fiber strand 10 comprising a plurality of fibers 12, according to the present invention. As used herein, "strand" means a plurality of individual fibers, i.e., at least two fibers, and the strand can comprise fibers made of different fiberizable materials. (The bundle of fibers can also be referred to as "yarn".) The term "fiber" means an individual filament. Although not limiting the present invention, the fibers 12 preferably have an average nominal fiber diameter ranging from 3 to 35 micrometers. Preferably, the average nominal fiber diameter of the present invention is 5 micrometers and greater. For "fine yarn" applications, the average nominal fiber diameter preferably ranges from 5 to 7 micrometers.

The fibers 12 can be formed from any type of fiberizable material known to those skilled in the art including fiberizable inorganic materials, fiberizable organic materials and mixtures of any of the foregoing. The inorganic and organic materials can be either man-made or naturally occurring materials. One skilled in the art will appreciate that the fiberizable inorganic and organic materials can also be polymeric materials. As used herein, the term "polymeric material" means a material formed from macromolecules composed of long chains of atoms that are linked together and that can become entangled in solution or in the solid state[1]. As used herein, the term "fiberizable" means a material capable of being formed into a generally continuous filament, fiber, strand or yarn.

[1] James Mark et al. Inorganic Polymers, Prentice Hall Polymer Science and Engineering Series, (1992) at page 1 which is hereby incorporated by reference.

Preferably, the fibers 12 are formed from an inorganic, fiberizable glass material. Fiberizable glass materials useful in the present invention include but are not limited to those prepared from fiberizable glass compositions such as "E-glass", "A-glass", "C-glass", "D-glass", "R-glass", "S-glass", and E-glass derivatives. As used herein, "E-glass derivatives" means glass compositions that include minor amounts of fluorine and/or boron and most preferably are fluorine-free and/or boron-free. Furthermore, as used herein, "minor amounts of fluorine" means less than 0.5 weight percent fluorine, preferably less than 0.1 weight percent fluorine, and "minor amounts of boron" means less than 5 weight percent boron, preferably less than 2 weight percent boron. Basalt and mineral wool are examples of other fiberizable glass materials useful in the present invention. Preferred glass fibers are formed from E-glass or E-glass derivatives. Such compositions are well known to those skilled in the art and further discussion thereof is not believed to be necessary in view of the present disclosure.

The glass fibers of the present invention can be formed in any suitable method known in the art, for forming glass fibers. For example, glass fibers can be formed in a direct-melt fiber forming operation or in an indirect, or marble-melt, fiber forming operation. In a direct-melt fiber forming operation, raw materials are combined, melted and homogenized in a glass melting furnace. The molten glass moves from the furnace to a forehearth and into fiber forming apparatuses where the molten glass is attenuated into continuous glass fibers. In a marble-melt glass forming operation, pieces or marbles of glass having the final desired glass composition are preformed and fed into a bushing where they are melted and attenuated into continuous glass fibers. If a premelter is used, the marbles are fed first into the premelter, melted, and then the melted glass is fed into a fiber forming apparatus where the glass is attenuated to form continuous fibers. In the present invention, the glass fibers are preferably formed by the direct-melt fiber forming operation. For additional information relating to glass compositions and methods of forming the glass fibers, see K. Loewenstein, *The Manufacturing Technology of Continuous Glass Fibres*, (3d Ed. 1993) at pages 30–44, 47–103, and 115–165; U.S. Pat. Nos. 4,542,106 and 5,789,329; and IPC-EG-140 "Specification for Finished Fabric Woven from 'E' Glass for Printed Boards" at page 1, a publication of The Institute for Interconnecting and Packaging Electronic Circuits (June 1997), which are specifically incorporated by reference herein.

Non-limiting examples of suitable non-glass fiberizable inorganic materials include ceramic materials such as silicon carbide, carbon, graphite, mullite, aluminum oxide and piezoelectric ceramic materials. Non-limiting examples of suitable fiberizable organic materials include cotton, cellulose, natural rubber, flax, ramie, hemp, sisal and wool. Non-limiting examples of suitable fiberizable organic polymeric materials include those formed from polyamides (such as nylon and aramids), thermoplastic polyesters (such as polyethylene terephthalate and polybutylene terephthalate), acrylics (such as polyacrylonitriles), polyolefins, polyurethanes and vinyl polymers (such as polyvinyl alcohol). Non-glass fiberizable materials useful in the present invention and methods for preparing and processing such fibers are discussed at length in the *Encyclopedia of Polymer Science and Technology*, Vol. 6 (1967) at pages 505–712, which is specifically incorporated by reference herein.

It is understood that blends or copolymers of any of the above materials and combinations of fibers formed from any of the above materials can be used in the present invention, if desired. Moreover, the term strand encompasses at least two different fibers made from differing fiberizable materials. In a preferred embodiment, the fiber strands of the present invention contain at least one glass fiber, although they may contain other types of fibers.

The present invention will now be discussed generally in the context of glass fiber strands, although one skilled in the art would understand that the strand 10 can comprise fibers 12 formed from any fiberizable material known in the art as discussed above. Thus, the discussion that follows in terms of glass fibers applies generally to the other fibers discussed above.

With continued reference to FIG. 1, in a preferred embodiment, at least one and preferably all of the fibers 12 of fiber strand 10 of the present invention have a layer 14 of a coating composition, preferably a residue of a coating composition, on at least a portion 17 of the surfaces 16 of the fibers 12 to protect the fiber surfaces 16 from abrasion during processing and inhibit fiber breakage. Preferably, the layer 14 is present on the entire outer surface 16 or periphery of the fibers 12.

The coating compositions of the present invention are preferably aqueous coating compositions and more preferably aqueous, resin compatible coating compositions. Although not preferred for safety reasons, the coating compositions can contain volatile organic solvents such as alcohol or acetone as needed, but preferably are free of such solvents. Additionally, the coating compositions of the present invention can be used as primary sizing compositions and/or secondary sizing or coating compositions.

As used herein, in a preferred embodiment the terms "size", "sized" or "sizing" refers to any coating composition applied to the fibers. The terms "primary size" or "primary sizing" refer to a coating composition applied to the fibers immediately after formation of the fibers. The terms "secondary size", "secondary sizing" or "secondary coating" mean coating compositions applied to the fibers after the application of a primary size. The terms "tertiary size", "tertiary sizing" or "tertiary coating" mean coating compositions applied to the fibers after the application of a secondary size. These coatings can be applied to the fiber before the fiber is incorporated into a fabric or it can be applied to the fiber after the fiber is incorporated into a fabric, e.g. by coating the fabric. In an alternative embodiment, the terms "size", "sized" and "sizing" additionally refer to a coating composition (also known as a "finishing size") applied to the fibers after at least a portion, and preferably all of a conventional, non-resin compatible sizing composition has been removed by heat or chemical treatment, i.e., the finishing size is applied to bare glass fibers incorporated into a fabric form.

As used herein, the term "resin compatible" means the coating composition applied to the glass fibers is compatible with the matrix material into which the glass fibers will be incorporated such that the coating composition (or selected coating components) achieves at least one of the following properties: does not require removal prior to incorporation into the matrix material (such as by de-greasing or de-oiling), facilitates good wet-out and wet-through of the matrix material during conventional processing and results in final composite products having desired physical properties and hydrolytic stability.

The coating composition of the present invention comprises one or more, and preferably a plurality of particles 18 that when applied to at least one fiber 23 of the plurality of fibers 12 adhere to the outer surface 16 of the at least one fiber 23 and provide one or more interstitial spaces 21 between adjacent glass fibers 23, 25 of the strand 10 as shown in FIG. 1. These interstitial spaces 21 correspond generally to the size 19 of the particles 18 positioned between the adjacent fibers.

The particles 18 of the present invention are preferably discrete particles. As used herein, the term "discrete" means that the particles do not tend to coalesce or combine to form continuous films under conventional processing conditions, but instead substantially retain their individual distinctness, and generally retain their individual shape or form. The discrete particles of the present invention may undergo shearing, i.e., the removal of a layer or sheet of atoms in a particle, necking, i.e., a second order phase transition between at least two particles, and partial coalescence during conventional fiber processing, and still be considered to be "discrete" particles.

The particles 18 of the present invention are preferably dimensionally stable. As used herein, the term "dimensionally stable particles" means that the particles will generally maintain their average particle size and shape under conventional fiber processing conditions, such as the forces generated between adjacent fibers during weaving, roving and other processing operations, so as to maintain the desired interstitial spaces 21 between adjacent fibers 23, 25. In other words, dimensionally stable particles preferably will not crumble, dissolve or substantially deform in the coating composition to form a particle having a maximum dimension less than its selected average particle size under typical glass fiber processing conditions, such as exposure to temperatures of up to 25° C., preferably up to 100° C., and more preferably up to 140° C. Additionally, the particles 18 should not substantially enlarge or expand in size under glass fiber processing conditions and, more particularly, under composite processing conditions where the processing temperatures can exceed 150° C. As used herein, the phrase "should not substantially enlarge in size" in reference to the particles means that the particles should not expand or increase in size to more than approximately three times their initial size during processing. Furthermore, as used herein, the term "dimensionally stable particles" covers both crystalline and non-crystalline particles.

Preferably, the coating compositions of the present invention are substantially free of heat expandable particles. As used herein, the term "heat expandable particles" means particles filled with or containing a material, which, when exposed to temperatures sufficient to volatilize the material, expand or substantially enlarge in size. These heat expandable particles therefore expand due to a phase change of the material in the particles, e.g., a blowing agent, under normal processing conditions. Consequently, the term "non-heat expandable particle" refers to a particle that does not expand due a phase change of the material in the particle under normal fiber processing conditions, and, in one embodiment of the present invention, the coating compositions comprise at least one non-heat expandable particle.

Generally, the heat expandable particles are hollow particles with a central cavity. In a non-limiting embodiment of the present invention, the cavity can be at least partial filled with a non-solid material such as a gas, liquid, and/or a gel.

As used herein, the term "substantially free of heat expandable particles" means less than 50 weight percent of heat expandable particles on a total solids basis, more preferably less than 35 weight percent. More preferably, the coating compositions of the present invention are essentially free of heat expandable particles. As used herein, the term "essentially free of heat expandable particles" means the sizing composition comprises less than 20 weight percent of heat expandable particles on a total solids basis, more preferably less than 5 weight percent, and most preferably less than 0.001 weight percent.

The particles 18 are preferably non-waxy. The term "non-waxy" means the materials from which the particles are formed are not wax-like. As used herein, the term "wax-like" means materials composed primarily of unentangled hydrocarbons chains having an average carbon chain length ranging from 25 to 100 carbon atoms[2,3].

[2] L. H. Sperling Introduction of *Physical Polymer Science*, John Wiley and Sons, Inc. (1986) at pages 2–5, which are specifically incorporated by reference herein.
[3] W. Pushaw, et al. "Use of Micronised Waxes and Wax Dispersions in Waterborne Systems" *Polymers, Paint, Colours Journal*, V.189, No. 4412 January 1999 at pages 18–21 which are specifically incorporated by reference herein.

In one preferred embodiment of the present invention, the particles 18 in the present invention are discrete, dimensionally stable, non-waxy particles.

The particles 18 can have any shape or configuration desired. Although not limiting in the present invention, examples of suitable particle shapes include spherical (such as beads, microbeads or hollow spheres), cubic, platy or acicular (elongated or fibrous). Additionally, the particles 18 can have an internal structure that is hollow, porous or void free, or a combination thereof, e.g. a hollow center with porous or solid walls. For more information on suitable particle characteristics see H. Katz et al. (Ed.), *Handbook of Fillers and Plastics* (1987) at pages 9–10, which are specifically incorporated by reference herein.

The particles 18 can be formed from materials selected from polymeric and non-polymeric inorganic materials, polymeric and non-polymeric organic materials, composite materials, and mixtures of any of the foregoing. As used herein, the term "polymeric inorganic material" means a polymeric material having a backbone repeat unit based on an element or elements other than carbon. For more information see J. E. Mark et al. at page 5, which is specifically incorporated by reference herein. As used herein, the term "polymeric organic materials" means synthetic polymeric materials, semisynthetic polymeric materials and natural polymeric materials having a backbone repeat unit based on carbon.

An "organic material", as used herein, means carbon containing compounds wherein the carbon is typically bonded to itself and to hydrogen, and often to other elements as well, and excludes binary compounds such as the carbon oxides, the carbides, carbon disulfide, etc.; such ternary compounds as the metallic cyanides, metallic carbonyls, phosgene, carbonyl sulfide, etc.; and carbon-containing ionic compounds such as the metallic carbonates, such as calcium carbonate and sodium carbonate. See R. Lewis, Sr., *Hawley's Condensed Chemical Dictionary*, (12th Ed. 1993) at pages 761–762, and M. Silberberg, Chemistry *The Molecular Nature of Matter and Change* (1996) at page 586, which are specifically incorporated by reference herein.

As used herein, the term "inorganic materials" means any material that is not an organic material.

As used herein, the term "composite material" means a combination of two or more differing materials. The particles formed from composite materials generally have a hardness at their surface that is different from the hardness of the internal portions of the particle beneath its surface. More specifically, the surface of the particle can be modified in any manner well known in the art, including, but not limited to, chemically or physically changing its surface characteristics using techniques known in the art, such that the surface hardness of the particle is equal to or less than the hardness of the glass fibers while the hardness of the particle beneath the surface is greater than the hardness of the glass fibers. For example, a particle can be formed from a primary material that is coated, clad or encapsulated with one or more secondary materials to form a composite particle that has a softer surface. In yet another alternative embodiment, particles formed from composite materials can be formed from a primary material that is coated, clad or encapsulated with a different form of the primary material. For more information on particles useful in the present invention, see G. Wypych, *Handbook of Fillers,* 2nd Ed. (1999) at pages 15–202, which are specifically incorporated by reference herein.

Representative non-polymeric, inorganic materials useful in forming the particles 18 of the present invention include inorganic materials selected from graphite, metals, oxides, carbides, nitrides, borides, sulfides, silicates, carbonates, sulfates and hydroxides. A non-limiting example of a suitable inorganic nitride from which the particles 18 are formed is boron nitride, a preferred embodiment of the present invention. Boron nitride particles having a hexagonal crystal structure are particularly preferred. A non-limiting example of a useful inorganic oxide is zinc oxide. Suitable inorganic sulfides include molybdenum disulfide, tantalum disulfide, tungsten disulfide and zinc sulfide. Useful inorganic silicates include aluminum silicates and magnesium silicates, such as vermiculite. Suitable metals include molybdenum, platinum, palladium, nickel, aluminum, copper, gold, iron, silver, alloys, and mixtures of any of the foregoing.

In one non-limiting embodiment of the invention, the particles 18 are formed from solid lubricant materials. As used herein, the term "solid lubricant" means any solid used between two surfaces to provide protection from damage during relative movement and/or to reduce friction and wear. In one embodiment, the solid lubricants are inorganic solid lubricants. As used herein, "inorganic solid lubricant" means that the solid lubricants have a characteristic crystalline habit which causes them to shear into thin, flat plates which readily slide over one another and thus produce an antifriction lubricating effect between the fiber surfaces, preferably the glass fiber surface, and an adjacent solid surface, at least one of which is in motion. See R. Lewis, Sr., *Hawley's Condensed Chemical Dictionary*, (12th Ed. 1993) at page 712, which is specifically incorporated by reference herein. Friction is the resistance to sliding one solid over another. F. Clauss, *Solid Lubricants and Self-Lubricating Solids* (1972) at page 1, which is specifically incorporated by reference herein.

In one non-limiting embodiment of the invention, the particles 18 have a lamellar structure. Particles having a lamellar structure are composed of sheets or plates of atoms in hexagonal array, with strong bonding within the sheet and weak van der Waals bonding between sheets, providing low shear strength between sheets. A non-limiting example of a lamellar structure is a hexagonal crystal structure. K. Ludema, *Friction, Wear, Lubrication* (1996) at page 125, *Solid Lubricants and Self-Lubricating Solids* at pages 19–22, 42–54, 75–77, 80–81, 82, 90–102, 113–120 and 128; and W. Campbell, "Solid Lubricants", *Boundary Lubrication; An Appraisal of World Literature*, ASME Research Committee on Lubrication (1969) at pages 202–203, which are specifically incorporated by reference herein. Inorganic solid particles having a lamellar fullerene (buckyball) structure are also useful in the present invention.

Non-limiting examples of suitable materials having a lamellar structure that are useful in forming the particles 18 of the present invention include boron nitride, graphite, metal dichalcogenides, mica, talc, gypsum, kaolinite, calcite, cadmium iodide, silver sulfide, and mixtures of any of the foregoing. Preferred materials include boron nitride, graphite, metal dichalcogenides, and mixtures of any of the foregoing. Suitable metal dichalcogenides include molybdenum disulfide, molybdenum diselenide, tantalum disulfide, tantalum diselenide, tungsten disulfide, tungsten diselenide, and mixtures of any of the foregoing.

In one embodiment, the particles 18 are formed from an inorganic solid lubricant material having a lamellar structure. A non-limiting example of an inorganic solid lubricant material having a lamellar structure for use in the coating composition of the present invention is boron nitride, preferably boron nitride having a hexagonal crystal structure. Particles formed from boron nitride, zinc sulfide and montmorillonite also provide good whiteness in composites with polymeric matrix materials such as nylon 6,6.

Non-limiting examples of particles formed from boron nitride that are suitable for use in the present invention are POLARTHERM® 100 Series (PT 120, PT 140, PT 160 and PT 180); 300 Series (PT 350) and 600 Series (PT 620, PT 630, PT 640 and PT 670) boron nitride powder particles, commercially available from Advanced Ceramics Corporation of Lakewood, Ohio. "PolarTherm® Thermally Conductive Fillers for Polymeric Materials", a technical bulletin of Advanced Ceramics Corporation of Lakewood, Ohio (1996), which is specifically incorporated by reference herein. These particles have a thermal conductivity of 250300 Watts per meter °K at 25° C., a dielectric constant of 3.9 and a volume resistivity of $10^{15}$ ohm-centimeters. The 100 Series powder particles have an average particle size ranging from 5 to 14 micrometers, the 300 Series powder particles have an average particle size ranging from 100 to 150 micrometers and the 600 Series powder particles have an average particle size ranging from 16 to greater than 200 micrometers. In particular, as reported by its supplier, POLARTHERM 160 particles have an average particle size of 6 to 12 micrometers, a particle size range of submicrometer to 70 micrometers, and a particle size distribution as follows:

| | % > | | |
|---|---|---|---|
| | 10 | 50 | 90 |
| Size ($\mu$m) | 18.4 | 7.4 | 0.6 |

According to this distribution, ten percent of the POLARTHERM® 160 boron nitride particles that were measured had an average particle size greater than 18.4 micrometers. As used herein, the "average particle size" refers to the mean particle size of the particles.

The average particle size of the particles according to the present invention can be measured according to known laser scattering techniques. In one non-limiting embodiment of the present invention, the particles size is measured using a Beckman Coulter LS 230 laser diffraction particle size instrument, which uses a laser beam with a wave length of 750 nm to measure the size of the particles and assumes the particle has a spherical shape, i.e., the "particle size" refers to the smallest sphere that will completely enclose the particle. For example, particles of POLARTHERM® 160 boron nitride particles measured using the Beckman Coulter LS 230 particle size analyzer were found to have an average particle size was 11.9 micrometers with particles ranging from submicrometer to 35 micrometers and having the following distribution of particles:

| | % > | | |
|---|---|---|---|
| | 10 | 50 | 90 |
| Size ($\mu$m) | 20.6 | 11.3 | 4.0 |

According to this distribution, ten percent of the POLARTHERM® 160 boron nitride particles that were measured had an average particle size greater than 20.6 micrometers.

In another non-limiting embodiment of the present invention, the particles 18 are formed from inorganic materials that are non-hydratable. As used herein, "non-hydratable" means that the inorganic particles do not react with molecules of water to form hydrates and do not contain water of hydration or water of crystallization. A "hydrate" is produced by the reaction of molecules of water with a substance in which the H—OH bond is not split. See R. Lewis, Sr., *Hawley's Condensed Chemical Dictionary*, (12th Ed. 1993) at pages 609–610 and T. Pyrros, *Chemistry*, (1967) at pages 186–187, which are specifically incorporated by reference herein. In the formulas of hydrates, the addition of the water molecules is conventionally indicated by a centered dot, e.g., $3MgO \cdot 4SiO_2 \cdot H_2O$ (talc), $Al_2O_3 \cdot 2SiO_2 \cdot 2H_2O$ (kaolinite). Structurally, hydratable inorganic materials include at least one hydroxyl group within a layer of a crystal lattice (but not including hydroxyl groups in the surface planes of a unit structure or materials which absorb water on their surface planes or by capillary action), for example as shown in the structure of kaolinite given in FIG. 3.8 at page 34 of J. Mitchell, *Fundamentals of Soil Behavior* (1976) and as shown in the structure of 1:1 and 2:1 layer minerals shown in FIGS. 18 and 19, respectively, of H. van Olphen, *Clay Colloid Chemistry*, (2d Ed. 1977) at page 62, which are specifically incorporated by reference herein. A "layer" of a crystal lattice is a combination of sheets, which is a combination of planes of atoms. (See *Minerals in Soil Environments*, Soil Science Society of America (1977) at pages 196–199, which is specifically incorporated by reference herein). The assemblage of a layer and interlayer material (such as cations) is referred to as a unit structure.

Hydrates contain coordinated water, which coordinates the cations in the hydrated material and cannot be removed without the breakdown of the structure, and/or structural water, which occupies interstices in the structure to add to the electrostatic energy without upsetting the balance of charge. R. Evans, *An Introduction to Crystal Chemistry* (1948) at page 276, which is specifically incorporated by reference herein. Generally, the coating compositions contain no more than 50 weight percent hydratable particles. In one non-limiting embodiment of the present invention, the coating composition is preferably essentially free of hydratable particles. As used herein, the term "essentially free of hydratable particles" means the coating composition comprises less than 20 weight percent of hydratable particles on a total solids basis, more preferably less than 5 weight percent, and most preferably less than 0.001 weight percent. In one embodiment of the present invention, the particles 18 are formed from a non-hydratable, inorganic solid lubricant material.

The coating compositions according to the present invention can contain particles formed from hydratable or hydrated inorganic materials in lieu of or in addition to the non-hydratable inorganic materials discussed above. Non-limiting examples of such hydratable inorganic materials are clay mineral phyllosilicates, including micas (such as muscovite), talc, montmorillonite, kaolinite and gypsum. As explained above, particles formed from such hydratable or hydrated materials generally constitute no more than 50 weight percent of the particles in the coating composition.

In another embodiment of the present invention, the particles 18 can be formed from non-polymeric, organic materials. Examples of non-polymeric, organic materials useful in the present invention include but are not limited to stearates (such as zinc stearate and aluminum stearate), carbon black and stearamide.

In yet another embodiment of the present invention, the particles 18 can be formed from inorganic polymeric materials. Non-limiting examples of useful inorganic polymeric materials include polyphosphazenes, polysilanes, polysiloxane, polygeremanes, polymeric sulfur, polymeric selenium, silicones, and mixtures of any of the foregoing. A specific non-limiting example of a particle formed from an inorganic polymeric material suitable for use in the present invention is TOSPEARL[4], which is a particle formed from cross-linked siloxanes and Is commercially available from Toshiba Silicones Company, Ltd. of Japan.

[4] See R. J. Perry "Applications for Cross-Linked Siloxane Particles" *Chemtech.* February 1999 at pages 39–44.

In still another embodiment of the present invention, the particles 18 can be formed from synthetic, organic polymeric materials. Suitable organic polymeric materials include, but are not limited to, thermosetting materials and thermoplastic materials. Suitable thermosetting materials include thermosetting polyesters, vinyl esters, epoxy materials, phenolics, aminoplasts, thermosetting polyurethanes, and mixtures of any of the foregoing. A specific, non-limiting example of a preferred synthetic polymeric particle formed from an epoxy material is an epoxy microgel particle.

Suitable thermoplastic materials include thermoplastic polyesters, polycarbonates, polyolefins, acrylic polymers, polyamides, thermoplastic polyurethanes, vinyl polymers, and mixtures of any of the foregoing. Preferred thermoplastic polyesters include, but are not limited to, polyethylene terephthalate, polybutylene terephthalate and polyethylene naphthalate. Preferred polyolefins include, but are not limited to, polyethylene, polypropylene and polyisobutene. Preferred acrylic polymers include copolymers of styrene and an acrylic acid monomer and polymers containing methacrylate. Non-limiting examples of synthetic polymeric particles formed from an acrylic copolymer are RHOPLEX® B-85[5], which is an opaque, non-crosslinking solid acrylic particle emulsion, ROPAQUE® HP-1055[6], which is an opaque, non-film-forming, styrene acrylic polymeric synthetic pigment having a 1.0 micrometer particle size, a solids content of 26.5 percent by weight and a 55 percent void volume, ROPAQUE® OP-96[7] and ROPAQUE® HP-543P[8], which are identical, each being an opaque, non-film-forming, styrene acrylic polymeric synthetic pigment dispersion having a particle size of 0.55 micrometers and a solids content of 30.5 percent by weight, and ROPAQUE® OP-62 LO[9] which is also an opaque, non-film-forming, styrene acrylic polymeric synthetic pigment dispersion having a particles size of 0.40 micrometers and a solids content of 36.5 percent by weight. Each of these specific particles is commercially available from Rohm and Haas Company of Philadelphia, Pa.

[5] See "Chemicals for the Textile Industry" September 1987, available from Rohm and Haas Company, Philadelphia, Pa.
[6] See product property sheet entitled: "ROPAQUE® HP-1055, Hollow Sphere Pigment for Paper and Paperboard Coatings" October 1994, available from Rohm and Haas Company, Philadelphia, Pa. at page 1, which is hereby incorporated by reference.
[7] See product technical bulletin entitled: "Architectural Coatings-ROPAQUE® OP-96, The All Purpose Pigment", April 1997 available from Rohm and Haas Company, Philadelphia, Pa. at page 1 which is hereby incorporated by reference.
[8] ROPAQUE® HP-543P and ROPAQUE® OP-96 are the same material; the material is identified as ROPAQUE® HP-543P in the paint industry and as ROPAQUE® OP-96 in the coatings industry.
[9] See product technical bulletin entitled: "Architectural Coatings-ROPAQUE® OP-96, The All Purpose Pigment", April 1997 available from Rohm and Haas Company, Philadelphia, Pa. at page 1, which is hereby incorporated by reference.

The particles 18 according to the present invention can also be formed from semisynthetic, organic polymeric materials and natural polymeric materials. As used herein, a "semisynthetic material" is a chemically modified, naturally occurring material. Suitable semisynthetic, organic polymeric materials from which the particles 18 can be formed include, but are not limited to, cellulosics, such as methylcellulose and cellulose acetate; and modified starches, such as starch acetate and starch hydroxyethyl ethers. Suitable natural polymeric materials from which the particles 18 can be formed include, but are not limited to, polysaccharides, such as starch; polypeptides, such as casein; and natural hydrocarbons, such as natural rubber and gutta percha.

In one non-limiting embodiment of the present invention, the polymeric particles 18 are formed from hydrophobic polymeric materials to reduce or limit moisture absorption by the coated strand. Non-limiting examples of such hydrophobic polymeric materials include but are not limited to polyethylene, polypropylene, polystyrene and polymethylmethacrylate. Non-limiting examples of polystyrene copolymers include ROPAQUE® HP-1055, ROPAQUE® OP-96, ROPAQUE® HP-543P, and ROPAQUE® OP-62 LO pigments (each discussed above).

In another non-limiting embodiment of the present invention, polymeric particles 18 are formed from polymeric materials having a glass transition temperature ($T_g$) and/or melting point greater than 25° C. and preferably greater than 50° C.

In still another non-limiting embodiment of the present invention, the particles 18 can be hollow particles formed from materials selected from polymeric and non-polymeric inorganic materials, polymeric and non-polymeric organic materials, composite materials, and mixtures of any of the foregoing. Non-limiting examples of suitable materials from which the hollow particles can be formed are described above. Non-limiting examples of a hollow polymeric particle useful in present invention are ROPAQUE® HP-1055, ROPAQUE® OP-96, ROPAQUE® HP-543P, and ROPAQUE® OP-62 LO pigments (each discussed above). For other non-limiting examples of hollow particles that can be useful in the present invention see H. Katz et al. (Ed.) (1987) at pages 437–452, which are specifically incorporated by reference herein.

The particles 18 useful in the coating composition present invention can be present in a dispersion, suspension or emulsion in water. Other solvents, such as mineral oil or alcohol (preferably less than 5 weight percent), can be included in the dispersion, suspension or emulsion, if desired. A non-limiting example of a preferred dispersion of particles formed from an inorganic material is ORPAC BORON NITRIDE RELEASECOAT-CONC, which is a dispersion of 25 weight percent boron nitride particles in water and is commercially available from ZYP Coatings, Inc. of Oak Ridge, Tennessee. "ORPAC BORON NITRIDE RELEASECOAT-CONC", a technical bulletin of ZYP Coatings, Inc., is specifically incorporated by reference herein. According to this technical bulletin, the boron nitride particles in this product have an average particle size of less than 3 micrometers and include 1 percent of magnesium-aluminum silicate to bind the boron nitride particles to the substrate to which the dispersion is applied. Independent testing of the ORPAC BORON NITRIDE RELEASECOAT-CONC 25 boron nitride using the Beckman Coulter LS 230 particle size analyzer found an average particle size of 6.2 micrometers, with particles ranging from submicrometer to 35 micrometers and having the following distribution of particles:

|  | % > | | |
|---|---|---|---|
|  | 10 | 50 | 90 |
| Size ($\mu$m) | 10.2 | 5.5 | 2.4 |

According to this distribution, ten percent of the ORPAC BORON NITRIDE RELEASECOAT-CONC 25 boron nitride particles that were measured had an average particle size greater than 10.2 micrometers.

Other useful products which are commercially available from ZYP Coatings include BORON NITRIDE LUBRI-COAT® paint, and BRAZE STOP and WELD RELEASE products. Specific, non-limiting examples of emulsions and dispersions of synthetic polymeric particles formed from acrylic polymers and copolymers include: RHOPLEX® B-85 acrylic emulsion (discussed above), RHOPLEX® GL-623[10] which is an all acrylic firm polymer emulsion having a solids content of 45 percent by weight and a glass transition temperature of 98° C.; EMULSION E-2321[11] which is a hard, methacrylate polymer emulsion having a solids content of 45 percent by weight and a glass transition temperature of 105° C.; ROPAQUE® OP-96 and ROPAQUE® HP-543P (discussed above), which are supplied as a dispersion having a particle size of 0.55 micrometers and a solids content of 30.5 percent by weight; ROPAQUE® OP-62 LO (discussed above), which is supplied as a dispersion having a particles size of 0.40 micrometers and a solids content of 36.5 percent by weight; and ROPAQUE® HP-1055 (discussed above), which is supplied as a dispersion having a solids content of 26.5 percent by weight; all of which are commercially available from Rohm and Haas Company of Philadelphia, Pa.

[10]See product property sheet entiled: "Rhoplex® GL-623, Self-Crosslinking Acrylic Binder of Industrial Nonwovens, March 1997 available from Rohm and Haas Company, Philadelphia, Pa., which is hereby Incorporated by reference.
[11]See product property sheet entitled: "Building Products Industrial Coatings-Emulsion E-2321", 1990, available from Rohm and Haas Company, Philadelphia, Pa., which is hereby incorporated by reference.

In a particularly preferred embodiment of the present invention, the coating composition comprises a mixture of at least one inorganic particle, particularly boron nitride, and more particularly a boron nitride available under the tradename POLARTHERM® and/or ORPAC BORON NITRIDE RELEASECOAT-CONC, and at least one thermoplastic material, particularly a copolymer of styrene and an acrylic monomer, and more particularly a copolymer available under the tradename ROPAQUE®.

The particles 18 are selected to achieve an average particle size 19 sufficient to effect the desired spacing between adjacent fibers. For example, the average size 19 of the particles 18 incorporated into a sizing composition applied to fibers 12 to be processed on air-jet looms is preferably selected to provide sufficient spacing between at least two adjacent fibers to permit air-jet transport of the fiber strand 10 across the loom. As used herein, "air-jet loom" means a type of loom in which the fill yarn (weft) is inserted into the warp shed by a blast of compressed air from one or more air jet nozzles in a manner well known to those skilled in the art. In another example, the average size 19 of the particles 18 incorporated into a sizing composition applied to fibers 12 to be impregnated with a polymeric matrix material is selected to provide sufficient spacing between at least two adjacent fibers to permit good wet-out and wet-through of the fiber strand 10.

Although not limiting in the present invention, the particles 18 preferably have an average size, measured using laser scattering techniques, of no greater than 1000 micrometers, more preferably 0.001 to 100 micrometers, and most preferably an average size of from 0.1 to 25 micrometers.

In a specific, non-limiting embodiment of the present invention, the average particle size 19 of the particles 18 is at least 0.1 micrometers, preferably at least 0.5 micrometers, and ranges from 0.1 micrometers to 5 micrometers and preferably from 0.5 micrometers to 2 micrometers. In an embodiment of the present invention, the particles 18 have an average particle size 19 that is generally smaller than the average diameter of the fibers 12 to which the coating composition is applied. It has been observed that twisted yarns made from fiber strands 10 having a layer 14 of a residue of a primary sizing composition comprising particles 18 having average particles sizes 19 discussed above can advantageously provide sufficient spacing between adjacent fibers 23, 25 to permit air-jet weavability (i.e., air-jet transport across the loom) while maintaining the integrity of the fiber strand 10 and providing acceptable wet-through and wet-out characteristics when impregnated with a polymeric matrix material.

In another specific, non-limiting embodiment of the present invention, the average particles size 19 of particles 18 is at least 3 micrometers, preferably at least 5 micrometers, and ranges from 3 to 1000 micrometers, preferably 5 to 1000 micrometers, and more preferably 10 to 25 micrometers. It is also preferred in this embodiment that the average particle size 19 of the particles 18 corresponds generally to the average nominal diameter of the glass fibers. It has been observed that fabrics made with strands coated with particles falling within the sizes discussed above exhibit good wet-through and wet-out characteristics when impregnated with a polymeric matrix material.

It will be recognized by one skilled in the art that mixtures of one or more particles 18 having different average particle sizes 19 can be incorporated into the coating composition in accordance with the present invention to impart the desired properties and processing characteristics to the fiber strands 10 and to the products subsequently made therefrom. More specifically, different sized particles can be combined in appropriate amounts to provide strands having good air-jet transport properties as well to provide a fabric exhibiting good wet-out and wet-through characteristics.

Fibers are subject to abrasive wear by contact with asperities of adjacent fibers and/or other solid objects or materials which the glass fibers contact during forming and subsequent processing, such as weaving or roving. "Abrasive wear", as used herein, means scraping or cutting off of bits of the fiber surface or breakage of fibers by frictional contact with particles, edges or entities of materials which are hard enough to produce damage to the fibers. See *K. Ludema* at page 129, which is specifically incorporated by reference herein. Abrasive wear of fiber strands causes detrimental effects to the fiber strands, such as strand breakage during processing and surface defects in products such as woven cloth and composites, which increases waste and manufacturing cost.

In the forming step, for example, fibers, particularly glass fibers, contact solid objects such as a metallic gathering shoe and a traverse or spiral before being wound into a forming package. In fabric assembly operations, such as knitting or weaving, the glass fiber strand contacts solid objects such as portions of the fiber assembly apparatus (e.g. a loom or knitting device) which can abrade the surfaces 16 of the contacting glass fibers 12. Examples of portions of a loom which contact the glass fibers include air jets and shuttles. Surface asperities of these solid objects that have a hardness value greater than that of the glass fibers can cause abrasive wear of the glass fibers. For example, many portions of the twist frame, loom and knitting device are formed from metallic materials such as steel, which has a Mohs' hardness up to $8.5^{12}$. Abrasive wear of glass fiber strands from contact with asperities of these solid objects causes strand breakage during processing and surface defects in products such as woven cloth and composites, which increases waste and manufacturing cost.

[12] *Handbook of Chemistry and Physics* at page F-22.

To minimize abrasive wear, in one non-limiting embodiment of the present invention, the particles 18 have a hardness value which does not exceed, i.e., is less than or equal to, a hardness value of the glass fiber(s). The hardness values of the particles and glass fibers can be determined by any conventional hardness measurement method, such as Vickers or Brinell hardness, but is preferably determined according to the original Mohs' hardness scale which indicates the relative scratch resistance of the surface of a material on a scale of one to ten. The Mohs' hardness value of glass fibers generally ranges from 4.5 to 6.5, and is generally 6. R. Weast (Ed.), *Handbook of Chemistry and Physics*, CRC Press (1975) at page F-22, which is specifically incorporated by reference herein. In this embodiment, the Mohs' hardness value of the particles 18 preferably ranges from 0.5 to 6. The Mohs' hardness values of several non-limiting examples of particles formed from inorganic materials suitable for use in the present invention are given in Table A below.

TABLE A

| Particle material | Mohs' hardness (original scale) |
| --- | --- |
| boron nitride | $2^{13}$ |
| graphite | $0.5-1^{14}$ |
| molybdenum disulfide | $1^{15}$ |
| talc | $1-1.5^{16}$ |
| mica | $2.8-3.2^{17}$ |
| kaolinite | $2.0-2.5^{18}$ |
| gypsum | $1.6-2^{19}$ |
| calcite (calcium carbonate) | $3^{20}$ |
| calcium fluoride | $4^{21}$ |
| zinc oxide | $4.5^{22}$ |
| aluminum | $2.5^{23}$ |
| copper | $2.5-3^{24}$ |
| iron | $4-5^{25}$ |
| gold | $2.5-3^{26}$ |
| nickel | $5^{27}$ |
| palladium | $4.8^{28}$ |
| platinum | $4.3^{29}$ |
| silver | $2.5-4^{30}$ |
| zinc sulfide | $3.5-4^{31}$ |

[13] K. Ludema, Friction, Wear, Lubrication, (1996) at page 27, which is hereby incorporated by reference.
[14] R. Weast (Ed.), Handbook of Chemistry and Physics, CRC Press (1975) at page F-22.
[15] R. Lewis, Sr., Hawley's Condensed Chemical Dictionary, (12th Ed. 1993) at page 793, which is hereby incorporated by reference.
[16] Hawley's Condensed Chemical Dictionary, (12th Ed. 1993) at page 1113, which is hereby incorporated by reference.
[17] Hawley's Condensed Chemical Dictionary, (12th Ed. 1993) at page 784, which is hereby incorporated by reference.
[18] Handbook of Chemistry and Physics at page F-22.
[19] Handbook of Chemistry and Physics at page F-22.
[20] Friction, Wear, Lubrication at page 27.
[21] Friction, Wear, Lubrication at page 27.
[22] Friction, Wear, Lubrication at page 27.
[23] Friction, Wear, Lubrication at page 27.
[24] Handbook of Chemistry and Physics at page F-22.
[25] Handbook of Chemistry and Physics at page F-22.
[26] Handbook of Chemistry and Physics at page F-22.
[27] Handbook of Chemistry and Physics at page F-22.
[28] Handbook of Chemistry and Physics at page F-22.
[29] Handbook of Chemistry and Physics at page F-22.
[30] Handbook of Chemistry and Physics at page F-22.
[31] R. Weast (Ed.), Handbook of Chemistry and Physics, CRC Press (71st Ed. 1990) at page 4–158.

As mentioned above, the Mohs' hardness scale relates to the resistance of a material to scratching. The instant invention therefore further contemplates particles that have a hardness at their surface that is different from the hardness of the internal portions of the particle beneath its surface. More specifically, and as discussed above, the surface of the particle can be modified in any manner well known in the art, including, but not limited to, chemically changing the particle's surface characteristics using techniques known in the art such that the surface hardness of the particle is less than or equal to the hardness of the glass fibers while the hardness of the particle beneath the surface is greater than the hardness of the glass fibers. As another alternative, a particle can be formed from a primary material that is coated, clad or encapsulated with one or more secondary materials to form a composite material that has a softer surface. Alternatively, a particle can be formed from a primary material that is coated, clad or encapsulated with a differing form of the primary material to form a composite material that has a softer surface.

In one example, and without limiting the present invention, an inorganic particle formed from an inorganic material such as silicon carbide or aluminum nitride can be provided with a silica, carbonate or nanoclay coating to form a useful composite particle. In another embodiment, the inorganic particles can be reacted with a coupling agent having functionality capable of covalently bonding to the inorganic particles and functionality capable of crosslinking into the film-forming material or crosslinkable resin. Such coupling agents are described in U.S. Pat. No. 5,853,809 at column 7, line 20 through column 8, line 43, which is incorporated herein by reference. Useful silane coupling agents include glycidyl, isocyanato, amino or carbamyl functional silane coupling agents. In another non-limiting example, a silane coupling agent with alkyl side chains can be reacted with the surface of an inorganic particle formed from an inorganic oxide to provide a useful composite particle having a "softer" surface. Other examples include cladding, encapsulating or coating particles formed from non-polymeric or polymeric materials with differing non-polymeric or polymeric materials. A specific non-limiting example of such composite particles is DUALITE, which is a synthetic polymeric particle coated with calcium carbonate that is commercially available from Pierce and Stevens Corporation of Buffalo, N.Y.

In one embodiment of the present invention, the particles 18 are thermally conductive, i.e., preferably have a thermal conductivity of at least 0.2 Watts per meter K, more preferably at least 0.5 Watts per meter K, measured at a temperature of 300 K. In a non-limiting embodiment, the particles 18 have a thermal conductivity of at least 1 Watt per meter K, more preferably at least 5 Watts per meter K, measured at a temperature of 300 K. In a preferred embodiment, the thermal conductivity of the particles is at least 25 Watts per meter K, more preferably at least 30 Watts per meter K, and even more preferably at least 100 Watts per meter K, measured at a temperature of 300 K. In another preferred embodiment, the thermal conductivity of the particles ranges from 5 to 2000 Watts per meter K, preferably from 25 to 2000 Watts per meter K, more preferably from 30 to 2000 Watts per meter K, and most preferably from 100 to 2000 Watts per meter K, measured at a temperature of 300 K. As used herein, "thermal conductivity" means the property of the particle that describes its ability to transfer heat through itself. See R. Lewis, Sr., *Hawley's Condensed Chemical Dictionary*, (12th Ed. 1993) at page 305, which is specifically incorporated by reference herein.

The thermal conductivity of a material can be determined by any method known to one skilled in the art. For example, if the thermal conductivity of the material to be tested ranges from 0.001 Watts per meter K to 100 Watts per meter K, the thermal conductivity of the material can be determined using the preferred guarded hot plate method according to ASTM C-177-85 (which is specifically incorporated by reference herein) at a temperature of 300 K. If the thermal conductivity of the material to be tested ranges from 20 Watts per meter K to 1200 Watts per meter K, the thermal conductivity of the material can be determined using the guarded hot flux sensor method according to ASTM C-518-91 (which is specifically incorporated by reference herein). In other words, the guarded hot plate method is to be used if the thermal conductivity ranges from 0.001 Watts per meter K to 20 Watts per meter K. If the thermal conductivity is over 100 Watts per meter K, the guarded hot flux sensor method is to be used. For ranges from 20 to 100 Watts per meter K, either method can be used.

In the guarded hot plate method, a guarded hot plate apparatus containing a guarded heating unit, two auxiliary heating plates, two cooling units, edge insulation, a temperature controlled secondary guard, and a temperature sensor read-out system is used to test two essentially identical samples. The samples are placed on either side of the guarded heating unit with the opposite faces of the specimens in contact with the auxiliary heating units. The apparatus is then heated to the desired test temperature and held for a period of time required to achieve thermal steady state. Once the steady state condition is achieved, the heat flow (Q) passing through the samples and the temperature difference ($\Delta T$) across the samples are recorded. The average thermal conductivity ($K_{TC}$) of the samples is then calculated using the following formula (1):

$$K_{TC} = Q\, L/A \cdot \Delta T \qquad (I)$$

wherein L is the average thickness of the samples and A is the average of the combined area of the samples.

It is believed that the materials with higher thermal conductivity will more quickly dissipate the heat generated during a drilling operation from the hole area, resulting in prolonged drill tip life. The thermal conductivity of selected material in Table A is included in Table B.

Although not required, in another embodiment useful in the present invention, the particles are electrically insulative or have high electrical resistivity, i.e., have an electrical resistivity greater than 1000 microohm-cm. Use of particles having high electrical resistivity is preferred for conventional electronic circuit board applications to inhibit loss of electrical signals due to conduction of electrons through the reinforcement. For specialty applications, such as circuit boards for microwave, radio frequency interference and electromagnetic interference applications, particles having high electrical resistivity are not required. The electrical resistance of selected materials in Table A is included in Table B.

TABLE B

| Inorganic Solid Material | Thermal conductivity (W/m K at 300K) | Electrical Resistance (micro ohm-centimeters) | Mohs' hardness (original scale) |
| --- | --- | --- | --- |
| boron nitride | 200[32] | 1.7 × 10[19] [33] | 2[34] |
| boron phosphide | 350[35] | — | 9.5[36] |
| aluminum phosphide | 130[37] | — | — |
| aluminum nitride | 200[38] | greater than 10[19] [39] | 9[40] |
| gallium nitride | 170[41] | — | — |
| gallium phosphide | 100[42] | — | — |
| silicon carbide | 270[43] | 4 × 10$^5$ to 1 × 10$^6$ [44] | greater than 9[45] |
| silicon nitride | 30[46] | 10[19] to 10[20] [47] | 9[48] |
| beryllium oxide | 240[49] | — | 9[50] |
| zinc oxide | 26 | — | 4.5[51] |
| zinc sulfide | 25[52] | 2.7 × 10$^5$ to 1.2 × 10$^{12}$ [53] | 3.5–4[54] |

TABLE B-continued

| Inorganic Solid Material | Thermal conductivity (W/m K at 300K) | Electrical Resistance (micro ohm-centimeters) | Mohs' hardness (original scale) |
| --- | --- | --- | --- |
| diamond | $2300^{55}$ | $2.7 \times 10^{8\ 56}$ | $10^{57}$ |
| silicon | $84^{58}$ | $10.0^{59}$ | $7^{60}$ |
| graphite | up to $2000^{61}$ | $100^{62}$ | $0.5-1^{63}$ |
| molybdenum | $138^{64}$ | $5.2^{65}$ | $5.5^{68}$ |
| platinum | $69^{67}$ | $10.6^{68}$ | $4.3^{69}$ |
| palladium | $70^{70}$ | $10.8^{71}$ | $4.8^{72}$ |
| tungsten | $200^{73}$ | $5.5^{74}$ | $7.5^{75}$ |
| nickel | $92^{76}$ | $6.8^{77}$ | $5^{78}$ |
| aluminum | $205^{79}$ | $4.3^{80}$ | $2.5^{81}$ |
| chromium | $66^{82}$ | $20^{83}$ | $9.0^{84}$ |
| copper | $398^{85}$ | $1.7^{86}$ | $2.5-3^{87}$ |
| gold | $297^{88}$ | $2.2^{89}$ | $2.5-3^{90}$ |
| iron | $74.5^{91}$ | $9^{92}$ | $4-5^{93}$ |
| silver | $418^{94}$ | $1.6^{95}$ | $2.5-4^{96}$ |

[32] G. Slack, "Nonmetallic Crystals with High Thermal Conductivity, J. Phys. Chem. Solids (1973) Vol. 34, p. 322, which is hereby incorporated by reference.
[33] A. Weimer (Ed.), Carbide, Nitride and Boride Materials Synthesis and Processing, (1997) at page 654.
[34] Friction, Wear, Lubrication at page 27.
[35] G. Slack, "Nonmetallic Crystals with High Thermal Conductivity, J. Phys. Chem. Solids (1973) Vol. 34, p. 325, which is hereby incorporated by reference.
[36] R. Lewis, Sr., Hawley's Condensed Chemical Dictionary, (12th Ed. 1993) at page 164, which is hereby incorporated by reference.
[37] G. Slack, "Nonmetallic Crystals with High Thermal Conductivity, J. Phys. Chem. Solids (1973) Vol. 34, p. 333, which is hereby incorporated by reference.
[38] G. Slack, "Nonmetallic Crystals with High Thermal Conductivity, J. Phys. Chem. Solids (1973) Vol. 34, p. 329, which is hereby incorporated by reference.
[39] A. Weimer (Ed.), Carbide, Nitride and Boride Materials Synthesis and Processing, (1997) at page 654.
[40] Friction, Wear, Lubrication at page 27.
[41] G. Slack, "Nonmetallic Crystals with High Thermal Conductivity, J. Phys. Chem. Solids (1973) Vol. 34, p. 333
[42] G. Slack, "Nonmetallic Crystals with High Thermal Conductivity, J. Phys. Chem. Solids (1973) Vol. 34, p. 321, which is hereby incorporated by reference.
[43] Microelectronics Packaging Handbook at page 36, which is hereby incorporated by reference.
[44] A. Weimer (Ed.), Carbide, Nitride and Boride Materials Synthesis and Processing, (1997) at page 653, which is hereby incorporated by reference.
[45] Friction, Wear, Lubrication at page 27.
[46] Microelectronics Packaging Handbook at page 36, which is hereby incorporated by reference.
[47] A. Weimer (Ed.), Carbide, Nitride and Boride Materials Synthesis and Processing, (1997) at page 654.
[48] Friction, Wear, Lubrication at page 27.
[49] Microelectronics Packaging Handbook at page 905, which is hereby incorporated by reference.
[50] Hawley's Condensed Chemical Dictionary, (12th Ed. 1993) at page 141, which is hereby incorporated by reference.
[51] Friction, Wear, Lubrication at page 27.
[52] Handbook of Chemistry and Physics, CRC Press (1975) at pages 12–54.
[53] Handbook of Chemistry and Physics, CRC Press (71st Ed. 1990) at pages 12–63, which is hereby incorporated by reference.
[54] Handbook of Chemistry and Physics, CRC Press (71st Ed. 1990) at page 4-158, which is hereby incorporated by reference.
[55] Microelectronics Packaging Handbook at page 36.
[56] Handbook of Chemistry and Physics, CRC Press (71st Ed. 1990) at pages 12–63, which is hereby incorporated by reference.
[57] Handbook of Chemistry and Physics at page F-22.
[58] Microelectronics Packaging Handbook at page 174.
[59] Handbook of Chemistry and Physics at page F-166, which is hereby incorporated by reference.
[60] Friction, Wear, Lubrication at page 27.
[61] G. Slack, "Nonmetallic Crystals with High Thermal Conductivity, J. Phys. Chem. Solids (1973) Vol. 34, p. 322, which is hereby incorporated by reference.
[62] See W. Callister, Materials Science and Engineering An Introduction, (2d ed. 1991) at page 637, which is hereby incorporated by reference.
[63] Handbook of Chemistry and Physics at page F-22.
[64] Microelectronics Packaging Handbook at page 174.
[65] Microelectronics Packaging Handbook at page 37.
[66] According to "Web Elements" http://www.shef.ac.uk/-chem/web-elents/nofr-image-l/hardness-minerals-l.html (Feb. 26, 1998).
[67] Microelectronics Packaging Handbook at page 174.
[68] Microelectronics Packaging Handbook at page 37.
[69] Handbook of Chemistry and Physics at page F-22.
[70] Microelectronics Packaging Handbook at page 37.
[71] Microelectronics Packaging Handbook at page 37.
[72] Handbook of Chemistry and Physics at page F-22.
[73] Microelectronics Packaging Handbook at page 37.

TABLE B-continued

| Inorganic Solid Material | Thermal conductivity (W/m K at 300K) | Electrical Resistance (micro ohm-centimeters) | Mohs' hardness (original scale) |
|---|---|---|---|

[74] Microelectronics Packaging Handbook at page 37.
[75] According to "Web Elements" http://www.shef.ac.uk/-chem/web-elents/nofr-image-l/hardness-minerals-l.html (Feb. 26, 1998).
[76] Microelectronics Packaging Handbook at page 174.
[77] Microelectronics Packaging Handbook at page 37.
[78] Handbook of Chemistry and Physics at page F-22.
[79] Microelectronics Packaging Handbook at page 174.
[80] Microelectronics Packaging Handbook at page 37.
[81] Friction, Wear, Lubrication at page 27.
[82] Microelectronics Packaging Handbook at page 37.
[83] Microelectronics Packaging Handbook at page 37.
[84] Handbook of Chemistry and Physics at page F-22.
[85] Microelectronics Packaging Handbook at page 174.
[86] Microelectronics Packaging Handbook at page 37.
[87] Handbook of Chemistry and Physics, at page F-22.
[88] Microelectronics Packaging Handbook at page 174.
[89] Microelectronics Packaging Handbook at page 37.
[90] Handbook of Chemistry and Physics at page F-22.
[91] Microelectronics Packaging Handbook at page 174.
[92] Handbook of Chemistry and Physics, CRC Press (1975) at page D-171, which is hereby incorporated by reference.
[93] Handbook of Chemistry and Physics at page F-22.
[94] Microelectronics Packaging Handbook at page 174.
[95] Microelectronics Packaging Handbook at page 37.
[96] Handbook of Chemistry and Physics at page F-22.

It will be appreciated by one skilled in the art that particles 18 of the coating composition of the present invention can include any combination or mixture of particles 18 discussed above. More specifically, and without limiting the present invention, the particles 18 can include any combination of additional particles made from any of the materials described above. Thus, all particles 18 do not have to be the same; they can be chemically different and/or chemically the same but different in configuration or properties. The additional particles can generally comprise up to half of the particles 18, preferably up to 15 percent of the particles 18.

In one embodiment, the particles 18 comprise 0.001 to 99 weight percent of the coating composition on a total solids basis, preferably 50 to 99 weight percent, and more preferably 75 to 99 weight percent. In this embodiment, particularly preferred coatings include, but are not limited to: i) coatings comprising an organic component and lamellar particles having a thermal conductivity of at least 1 Watt per meter K at a temperature of 300 K; ii) coatings comprising an organic component and non-hydratable, lamellar particles; iii) coatings comprising at least one boron-free lamellar particle having a thermal conductivity of at least 1 Watt per meter K at a temperature of 300 K; iv) a residue of an aqueous composition comprising lamellar particles having a thermal conductivity of at least 1 Watt per meter K at a temperature of 300 K, i.e., lamellar particles on the fiber; and v) a residue of an aqueous composition comprising alumina-free, non-hydratable particles having a thermal conductivity of at least 1 Watt per meter K at a temperature of 300 K, i.e., alumina-free, non-hydratable particles on the fiber.

In another embodiment, the particles 18 comprise 0.001 to 99 weight percent of the coating composition on a total solids basis, preferably 1 to 80 weight percent, and more preferably 1 to 40 weight percent. In addition, in the particular embodiment wherein the particles 18 are non-hydratable inorganic particles, the particles preferably comprise 1 to 50 weight percent of the coating composition on a total solids basis, and more preferably up to 25 weight percent of the coating composition.

In yet another embodiment, the particles 18 comprise greater than 20 weight percent of the coating composition on a total solids basis, preferably ranging from 20 to 99 weight percent, more preferably ranging from 25 to 80 weight percent, and most preferably ranging from 50 to 60 weight percent. In this embodiment, particularly preferred coatings include resin compatible coating compositions comprising greater than 20 weight percent on a total solids basis of at least one particle selected from inorganic particles, organic hollow particles and composite particles, the at least one particle having a Mohs' hardness value which does not exceed the Mohs' hardness value of at least one glass fiber.

In another embodiment, the particles 18 comprise 1 to 80 weight percent of the coating composition on a total solids basis, preferably 1 to 60 weight percent. In one embodiment, the coating composition contains 20 to 60 weight percent of particles 18 on total solids basis, and preferably 35 to 55 weight percent, and more preferably 30 to 50 weight percent. Preferred coatings further to this embodiment include a resin compatible coating comprising (a) a plurality of discrete particles formed from materials selected from non-heat expandable organic materials, inorganic polymeric materials, non-heat expandable composite materials and mixtures thereof, the particles having an average particle size sufficient to allow strand wet out without application of external heat; (b) at least one lubricious material different from said plurality of discrete particles; and (c) at least one film-forming material.

In addition to the particles, the coating composition preferably comprises one or more film-forming materials, such as organic, inorganic and natural polymeric materials. Useful organic materials include but are not limited to polymeric materials selected from synthetic polymeric materials, semisynthetic polymeric materials, natural polymeric materials, and mixtures of any of the foregoing. Synthetic polymeric materials include but are not limited to thermoplastic materials and thermosetting materials. Preferably, the polymeric film-forming materials form a generally continuous film when applied to the surface 16 of the glass fibers.

Generally, the amount of film-forming materials ranges from 1 to 99 weight percent of the coating composition on a total solids basis. In one embodiment, the amount of film-forming materials preferably ranges from 1 to 50 weight percent, and more preferably from 1 to 25 weight percent. In another embodiment, the amount of film-forming materials ranges from 20 to 99 weight percent, and more preferably ranges from 60 to 80 weight percent.

In another embodiment, the amount of film-forming materials preferably ranges from 20 to 75 weight percent of the coating composition on a total solids basis, and more preferably 40 to 50 weight percent. In this embodiment, particularly preferred coatings comprise a film-forming material and greater than 20 weight percent on a total solids basis of at least one particle selected from inorganic particles, organic hollow particles and composite particles, the at least one particle having a Mohs' hardness value which does not exceed the Mohs' hardness value of at the least one glass fiber.

In yet another embodiment, the amount of polymeric film-forming materials can range from 1 to 60 weight percent of the coating composition on a total solids basis, preferably 5 to 50 weight percent, and more preferably 10 to 30 weight percent Preferred coatings further to this embodiment include a resin compatible coating comprising (a) a plurality of discrete particles formed from materials selected from non-heat expandable organic materials, inorganic polymeric materials, non-heat expandable composite materials and mixtures thereof, the particles having an average particle size sufficient to allow strand wet out without application of external heat; (b) at least one lubricious material different from said plurality of discrete particles; and (c) at least one film-forming material.

In one non-limiting embodiment of the present invention, thermosetting polymeric film-forming materials are the preferred polymeric film-forming materials for use in the coating composition for coating glass fiber strands. Such materials are compatible with thermosetting matrix materials used as laminates for printed circuit boards, such as FR-4 epoxy resins, which are polyfunctional epoxy resins and in one particular embodiment of the invention is a difunctional brominated epoxy resins. See *Electronic Materials Handbook*™, ASM International (1989) at pages 534–537, which are specifically incorporated by reference herein.

Useful thermosetting materials include thermosetting polyesters, epoxy materials, vinyl esters, phenylics, aminoplasts, thermosetting polyurethanes, carbamate-functional polymers and mixtures of any of the foregoing. Suitable thermosetting polyesters include STYPOL polyesters that are commercially available from Cook Composites and Polymers of Kansas City, Mo., and NEOXIL polyesters that are commercially available from DSM B.V. of Como, Italy.

A non-limiting example of a thermosetting polymeric material is an epoxy material. Useful epoxy materials contain at least one epoxy or oxirane group in the molecule, such as polyglycidyl ethers of polyhydric alcohols or thiols. Examples of suitable epoxy film-forming polymers include EPON® 826 and EPON® 880 epoxy resins, commercially available from Shelf Chemical Company of Houston, Tex.

Useful carbamate-functional polymers include carbamate-functional acrylic polymers in which pendent and/or terminal carbamate functional groups can be incorporated into the acrylic polymer by copolymerizing the acrylic monomer with a carbamate functional vinyl monomer, such as a carbamate functional alkyl ester of methacrylic acid. As is preferred, carbamate groups can also be incorporated into the acrylic polymer by a "transcarbamoylation" reaction in which a hydroxyl functional acrylic polymer is reacted with a low molecular weight carbamate derived from an alcohol or a glycol ether. The carbamate groups exchange with the hydroxyl groups yielding the carbamate functional acrylic polymer and the original alcohol or glycol ether. The carbamate functional group-containing acrylic polymer typically has a Mn ranging from 500 to 30,000 and a calculated carbamate equivalent weight typically within the range of 15 to 150 based on equivalents of reactive carbamate groups.

It should be understood that the preferred carbamate functional group-containing polymers typically contain residual hydroxyl functional groups which provide additional crosslinking sites. Preferably, the carbamate/hydroxyl functional group-containing polymer has a residual hydroxyl value ranging from 0.5 to 10 mg KOH per gram.

Useful thermoplastic polymeric materials include vinyl polymers, thermoplastic polyesters, polyolefins, polyamides (e.g. aliphatic polyamides or aromatic polyamides such as aramid), thermoplastic polyurethanes, acrylic polymers (such as polyacrylic acid), and mixtures of any of the foregoing.

In another non-forming embodiment of the present invention, the preferred polymeric film-forming material is a vinyl polymer. Useful vinyl polymers in the present invention include, but are not limited to, polyvinyl pyrrolidones such as PVP K-15, PVP K-30, PVP K-60 and PVP K-90, each of which is commercially available from International Specialty Products Chemicals of Wayne, N.J. Other suitable vinyl polymers include RESYN 2828 and RESYN 1037 vinyl acetate copolymer emulsions which are commercially available from National Starch and Chemical of Bridgewater, N.J., other polyvinyl acetates such as are commercially available from H. B. Fuller and Air Products and Chemicals Company of Allentown, Pa., and polyvinyl alcohols which are also available from Air Products and Chemicals Company.

Thermoplastic polyesters useful in the present invention include DESMOPHEN 2000 and DESMOPHEN 2001KS, both of which are commercially available from Bayer Corp. of Pittsburgh, Pa. Preferred polyesters include RD-847A polyester resin, which is commercially available from Borden Chemicals of Columbus, Ohio, and DYNAKOLL Si 100 chemically modified rosin, which is commercially available from Eka Chemicals AB, Sweden. Useful polyamides include the VERSAMID products that are commercially available from Cognis Corp. of Cincinnati, Ohio, and EUREDOR products that are available from Ciba Geigy, Belgium. Useful thermoplastic polyurethanes include WITCOBOND® W-290H, which is commercially available from CK Witco Corp. of Greenwich, Conn., and RUCOTHANE® 2011L polyurethane latex, which is commercially available from Ruco Polymer Corp. of Hicksville, New York.

The coating compositions of the present invention can comprise a mixture of one or more thermosetting polymeric materials with one or more thermoplastic polymeric materials. In one non-limiting embodiment of the present invention particularly useful for laminates for printed circuit boards, the polymeric materials of the aqueous sizing composition comprise a mixture of RD-847A polyester resin, PVP K-30 polyvinyl pyrrolidone, DESMOPHEN 2000 polyester and VERSAMID polyamide. In an alternative non-limiting embodiment suitable for laminates for printed circuit boards, the polymeric materials of the aqueous sizing composition comprise PVP K-30 polyvinyl pyrrolidone, optionally combined with EPON 826 epoxy resin.

Semisynthetic polymeric materials suitable for use as polymeric film-forming materials include but are not limited to cellulosics such as hydroxypropylcellulose and modified starches such as KOLLOTEX 1250 (a low viscosity, low amylose potato-based starch etherified with ethylene oxide) which is commercially available from AVEBE of The Netherlands.

Natural polymeric materials suitable for use as polymeric film-forming materials include but are not limited to starches prepared from potatoes, corn, wheat; waxy maize, sago, rice, milo, and mixtures of any of the foregoing.

It should be appreciated that depending on the nature of the starch, the starch can function as both a particle 18 and/or a film-forming material. More specifically, some starches will dissolve completely in a solvent, and in particular water, and function as a film forming material while others will not completely dissolve and will maintain a particular grain size and function as a particle 18. Although starches (both natural and semisynthetic) can be used in accordance with the present invention, the coating composition of the present invention is preferably substantially free of starch materials. As used herein, the term "substantially free of starch materials" means that the coating composition comprises less than 50 weight percent on a total solids basis of the coating composition, preferably less than 35 weight of starch materials. More preferably, the coating composition of the present invention is essentially free of starch materials. As used herein, the term "essentially free of starch materials" means that the coating composition comprises less than 20 weight percent on a total solids basis of the coating composition, preferably less than weight percent and more preferably is free of starch materials.

Typical primary sizing compositions containing starches that are applied to fiber strands to be incorporated into laminates for printed circuit boards are not resin compatible and must be removed prior to incorporation into the polymeric matrix material. As previously discussed, preferably the coating compositions of the present invention are resin compatible and do not require removal from the fiber strands or fibers prior to fabric processing. More preferably, the coating compositions of the present invention are compatible with matrix materials used to make printed circuit boards (discussed below) and most preferably are epoxy resin compatible.

The polymeric film-forming materials can be water soluble, emulsifiable, dispersible and/or curable. As used herein, "water soluble" means that the polymeric materials are capable of being essentially uniformly blended and/or molecularly or ionically dispersed in water to form a true solution. See Hawley's at page 1075, which is specifically incorporated by reference herein. "Emulsifiable" means that the polymeric materials are capable of forming an essentially stable mixture or being suspended in water in the presence of an emulsifying agent. See Hawley's at page 461, which is specifically incorporated by reference herein. Non-limiting examples of suitable emulsifying agents are set forth below. "Dispersible" means that any of the components of the polymeric materials are capable of being distributed throughout water as finely divided particles, such as a latex. See Hawley's at page 435, which is specifically incorporated by reference herein. The uniformity of the dispersion can be increased by the addition of wetting, dispersing or emulsifying agents (surfactants), which are discussed below. "Curable" means that the polymeric materials and other components of the sizing composition are capable of being coalesced into a film or crosslinked to each other to change the physical properties of the polymeric materials. See Hawley's at page 331, which is specifically incorporated by reference herein.

In addition to or in lieu of the film forming materials discussed above, the coating compositions of the present invention preferably comprises one or more glass fiber coupling agents such as organo-silane coupling agents, transition metal coupling agents, phosphonate coupling agents, aluminum coupling agents, amino-containing Werner coupling agents, and mixtures of any of the foregoing. These coupling agents typically have dual functionality. Each metal or silicon atom has attached to it one or more groups which can either react with or compatibilize the fiber surface and/or the components of the resin matrix. As used herein, the term "compatibilize" means that the groups are chemically attracted, but not bonded, to the fiber surface and/or the components of the coating composition, for example by polar, wetting or solvation forces. In one non-limiting embodiment, each metal or silicon atom has attached to it one or more hydrolyzable groups that allow the coupling agent to react with the glass fiber surface, and one or more functional groups that allow the coupling agent to react with components of the resin matrix. Examples of hydrolyzable groups include:

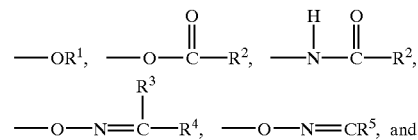

the monohydroxy and/or cyclic $C_2$–$C_3$ residue of a 1,2- or 1,3 glycol, wherein $R^1$ is $C_1$–$C_3$ alkyl; $R^2$ is H or $C_1$–$C_4$ alkyl; $R^3$ and $R^4$ are independently selected from H, $C_1$–$C_4$ alkyl or $C_6$–$C_8$ aryl; and $R^5$ is $C_4$–$C_7$ alkylene. Examples of suitable compatibilizing or functional groups include epoxy, glycidoxy, mercapto, cyano, allyl, alkyl, urethano, carbamate, halo, isocyanato, ureido, imidazolinyl, vinyl, acrylato, methacrylato, amino or polyamino groups.

Functional organo-silane coupling agents are preferred for use in the present invention. Examples of useful functional organo silane coupling agents include gamma-aminopropyltrialkoxysilanes, gamma-isocyanatopropyltriethoxysilane, vinyl-trialkoxysilanes, glycidoxypropyltrialkoxysilanes and ureidopropyltrialkoxysilanes.

Preferred functional organo-silane coupling agents include A-187 gamma-glycidoxy-propyltrimethoxysilane, A-174 gamma-methacryloxypropyltrimethoxysilane, A-1100 gamma-aminopropyltriethoxysilane silane coupling agents, A-1108 amino silane coupling agent and A-1160 gamma-ureidopropyltriethoxysilane (each of which is commercially available from CK Witco Corporation of Tarrytown, New York). The organo silane coupling agent can be at least partially hydrolyzed with water prior to application to the fibers, preferably at a 1:1 stoichiometric ratio or, if desired, applied in unhydrolyzed form. The pH of the water can be modified by the addition of an acid or a base to initiate or speed the hydrolysis of the coupling agent as is well known in the art.

Suitable transition metal coupling agents include titanium, zirconium, yttrium and chromium coupling agents. Suitable titanate coupling agents and zirconate coupling agents are commercially available from Kenrich Petrochemical Company. Suitable chromium complexes are commercially available from E.I. DuPont de Nemours of Wilmington, Del. The amino-containing Werner-type coupling agents are complex compounds in which a trivalent nuclear atom such as chromium is coordinated with an organic acid having amino functionality. Other metal chelate and coordinate type coupling agents known to those skilled in the art can be used herein.

The amount of coupling agent generally ranges from 1 to 99 weight percent of the coating composition on a total solids basis. In one embodiment, the amount of coupling agent ranges from 1 to 30 weight percent of the coating composition on a total solids basis, preferably 1 to 10 weight percent, and more preferably 2 to 8 weight percent.

The coating compositions of the present invention can further comprise one or more softening agents or surfactants that impart a uniform charge to the surface of the fibers causing the fibers to repel from each other and reducing the friction between the fibers, so as to function as a lubricant. Although not required, preferably the softening agents are chemically different from other components of the coating composition. Such softening agents include cationic, non-ionic or anionic softening agents and mixtures thereof, such as amine salts of fatty acids, alkyl imidazoline derivatives such as CATION X, which is commercially available from Rhone Poulenc/Rhodia of Princeton, N.J., acid solubilized fatty acid amides, condensates of a fatty acid and polyethylene imine and amide substituted polyethylene imines, such as EMERY® 6717, a partially amidated polyethylene imine commercially available from Cognis Corporation of Cincinnati, Ohio. While the coating composition can comprise up to 60 weight percent of softening agents, preferably the coating composition comprises less than 20 weight percent and more preferably less than 5 weight percent of the softening agents. For more information on softening agents, see A. J. Hall, *Textile Finishing,* 2nd Ed. (1957) at pages 108–115, which are specifically incorporated by reference herein.

The coating compositions of the present invention can further include one or more lubricious materials that are chemically different from the polymeric materials and softening agents discussed above to impart desirable processing characteristics to the fiber strands during weaving. Suitable lubricious materials can be selected from oils, waxes, greases, and mixtures of any of the foregoing. Non-limiting examples of wax materials useful in the present invention include aqueous soluble, emulsifiable or dispersible wax materials such as vegetable, animal, mineral, synthetic or petroleum waxes, e.g. paraffin. Oils useful in the present invention include both natural oils, semisynthetic oils and synthetic oils. Generally, the amount of wax or other lubricious material can range from 0 to 80 weight percent of the sizing composition on a total solids basis, preferably from 1 to 50 weight percent, more preferably from 20 to 40 weight percent, and most preferably from 25 to 35 weight percent.

Preferred lubricious materials include waxes and oils having polar characteristics, and more preferably include highly crystalline waxes having polar characteristics and melting points above 35° C. and more preferably above 45° C. Such materials are believed to improve the wet-out and wet-through of polar resins on fiber strands coated with sizing compositions containing such polar materials as compared to fiber strands coated with sizing compositions containing waxes and oils that do not have polar characteristics. Preferred lubricious materials having polar characteristics include esters formed from reacting (1) a monocarboxlyic acid and (2) a monohydric alcohol. Non-limiting examples of such fatty acid esters useful in the present invention include cetyl palmitate, which is preferred (such as is available from Stepan Company of Maywood, N.J. as KESSCO 653 or STEPANTEX 653), cetyl myristate (also available from Stepan Company as STEPANLUBE 654), cetyl laurate, octadecyl laurate, octadecyl myristate, octadecyl palmitate and octadecyl stearate. Other fatty acid ester, lubricious materials useful in the present invention include trimethylolpropane tripelargonate, natural spermaceti and triglyceride oils, such as but not limited to soybean oil, linseed oil, epoxidized soybean oil, and epoxidized linseed oil.

The lubricious materials can also include water-soluble polymeric materials. Non-limiting examples of useful materials include polyalkylene polyols and polyoxyalkylene polyols, such as MACOL E-300 which is commercially available from BASF Corporation of Parsippany, New Jersey, and CARBOWAX 300 and CARBOWAX 400 which is commercially available from Union Carbide Corporation, Danbury, Conn. Another non-limiting example of a useful lubricious material is POLYOX WSR 301 which is a poly (ethylene oxide) commercially available from Union Carbide Corporation, Danbury, Conn.

The coating compositions of the present invention can additionally include one or more other lubricious materials, such as non-polar petroleum waxes, in lieu of or in addition to of those lubricious materials discussed above. Non-limiting examples of non-polar petroleum waxes include MICHEM® LUBE 296 microcrystalline wax, POLY-MEKON® SPP-W microcrystalline wax and PETROLITE 75 microcrystalline wax which are commercially available from Michelman Inc. of Cincinnati, Ohio and Baker Petrolite, Polymer Division, of Cumming, Ga., respectively. Generally, the amount of this type of wax can be up to 10 weight percent of the total solids of the sizing composition.

The coating compositions of the present invention can also include a resin reactive diluent to further improve lubrication of the coated fiber strands of the present invention and provide good processability in weaving and knitting by reducing the potential for fuzz, halos and broken filaments during such manufacturing operations, while maintaining resin compatibility. As used herein, "resin reactive diluent" means that the diluent includes functional groups that are capable of chemically reacting with the same resin with which the coating composition is compatible. The diluent can be any lubricant with one or more functional groups that react with a resin system, preferably functional groups that react with an epoxy resin system, and more preferably functional groups that react with an FR-4 epoxy resin system. Non-limiting examples of suitable lubricants include lubricants with amine groups, alcohol groups, anhydride groups, acid groups or epoxy groups. A non-limiting example of a lubricant with an amine group is a modified polyethylene amine, e.g. EMERY 6717, which is a partially amidated polyethylene imine commercially available from Cognis Corporation of Cincinnati, Ohio. A non-limiting example of a lubricant with an alcohol group is polyethylene glycol, e.g. CARBOWAX 300, which is a polyethylene glycol that is commercially available from Union Carbide Corp. of Danbury, Conn. A non-limiting example of a lubricant with an acid group is fatty acids, e.g. stearic acid and salts of stearic acids. Non-limiting examples of lubricants with an epoxy group include epoxidized soybean oil and epoxidized linseed oil, e.g. FLEXOL LOE, which is an epoxidized linseed oil, and FLEXOL EPO, which is an epoxidized soybean oil, both commercially available from Union Carbide Corp. of Danbury, Conn., and LE-9300 epoxidized silicone emulsion, which is commercially available from CK Witco Corporation of Tarrytown, New York. Although not limiting in the present invention, the sizing composition can include a resin reactive diluent as discussed above in an amount up to 15 weight percent of the sizing composition on a total solids basis.

In another embodiment, the coating compositions of the present invention can comprise at least one anionic, nonionic or cationic surface active agent. As used herein, "surface active agent" means any material which tends to lower the solid surface tension or surface energy of the cured composition or coating. For purposes of the present invention, solid surface tension can be measured according to the Owens-Wendt method using a Rame'-Hart Contact Angle Goniometer with distilled water and methylene iodide as reagents.

The at least one surface active agent can be selected from amphiphilic, reactive functional group-containing polysiloxanes, amphiphilic fluoropolymers, polyacrylates and mixtures of any of the foregoing. With reference to water-soluble or water-dispersible amphiphilic materials, the term "amphiphilic" means a polymer having a generally hydrophilic polar end and a water-insoluble generally hydrophobic end. Nonlimiting examples of suitable amphiphilic fluoropolymers include fluoroethylene-alkyl vinyl ether alternating copolymers (such as those described in U.S. Pat. No. 4,345,057) available from Asahi Glass Company under the tradename LUMIFLON; fluorosurfactants, fluoroaliphatic polymeric esters commercially available from 3M of St. Paul, Minn. under the tradename FLUORAD; functionalized perfluorinated materials, such as 1H,1H-perfluoro-nonanol commercially available from Fluoro-Chem USA; and perfluorinated (meth)acrylate resins. Other nonlimiting examples of suitable anionic surface active agents include sulfates or sulfonates.

Nonlimiting examples of suitable nonionic surface active agents include those containing ether linkages and which are represented by the following general formula: $RO(R'O)_nH$; wherein the substituent group R represents a hydrocarbon group containing 6 to 60 carbon atoms, the substituent group R' represents an alkylene group containing 2 or 3 carbon atoms, and mixtures of any of the foregoing, and n is an integer ranging from 2 to 100, inclusive of the recited values such as SURFYNOL nonionic polyoxyethylene surface active agents from Air Products Chemicals, Inc.; PLURONIC or TETRONIC from BASF Corporation; TERGITOL from Union Carbide; and SURFONIC from Huntsman Corporation. Other examples of suitable nonionic surface active agents include block copolymers of ethylene oxide and propylene oxide based on a glycol such as ethylene glycol or propylene glycol including those available from BASF Corporation under the general trade designation PLURONIC.

Nonlimiting examples of suitable cationic surface active agents include acid salts of alkyl amines; Imidazoline derivatives; ethoxylated amines or amides, a cocoamine ethoxylate; ethoxylated fatty amines; and glyceryl esters.

Other examples of suitable surface active agents include homopolymers and copolymers of acrylate monomers, for example polybutylacrylate and copolymers derived from acrylate monomers (such as ethyl (meth)acrylate, 2-ethylhexylacrylate, butyl (meth)acrylate and isobutyl acrylate), and hydroxy ethyl(meth)acrylate and (meth) acrylic acid monomers.

The amount of surface active agent can range from 1 to 50 weight percent of the coating composition on a total solids basis.

The coating compositions can additionally include one or more emulsifying agents for emulsifying or dispersing components of the coating compositions, such as the particles 18 and/or lubricious materials. Non-limiting examples of suitable emulsifying agents or surfactants include polyoxyalkylene block copolymers (such as PLURONIC™ F-108 polyoxypropylene-polyoxyethylene copolymer which is commercially available from BASF Corporation of Parsippany, New Jersey, (PLURONIC F-108 copolymer is available in Europe under the tradename SYNPERONIC F-108), ethoxylated alkyl phenyls (such as IGEPAL CA-630 ethoxylated octylphenoxyethanol which is commercially available from GAF Corporation of Wayne, New Jersey), polyoxyethylene octylphenyl glycol ethers, ethylene oxide derivatives of sorbitol esters (such as TMAZ 81 which is commercially available BASF of Parsippany, New Jersey), polyoxyethylated vegetable oils (such as ALKAMULS EL-719, which is commercially available from Rhone-Poulenc/Rhodia), ethoxylated alkylphenyls (such as MACOL OP-10 SP which is also commercially available from BASF) and nonylphenyl surfactants (such as MACOL NP-6 and ICONOL NP-6 which are also commercially available from BASF, and SERMUL EN 668 which is commercially available from CON BEA, Benelux). Generally, the amount of emulsifying agent can range from 1 to 30 weight percent of the coating composition on a total solids basis, preferably from 1 to 15 weight percent.

Crosslinking materials, such as melamine formaldehyde, and plasticizers, such as phthalates, trimellitates and adipates, can also be included in the coating compositions. The amount of crosslinker or plasticizer can range from 1 to 5 weight percent of the coating composition on a total solids basis.

Other additives can be included in the coating compositions, such as silicones, fungicides, bactericides and anti-foaming materials, generally in an amount of less than 5 weight percent. Organic and/or inorganic acids or bases in an amount sufficient to provide the coating composition with a pH of 2 to 10 can also be included in the coating composition. A non-limiting example of a suitable silicone mulsion is LE-9300 epoxidized silicone emulsion, which is commercially available from CK Witco Corporation of Tarrytown, New York. An example of a suitable bactericide is BIOMET 66 antimicrobial compound, which is commercially available from M & T Chemicals of Rahway, N.J. Suitable anti-foaming materials are the SAG materials, which are commercially available CK Witco Corporation of Greenwich, Conn. and MAZU DF-136, which is available from BASF Company of Parsippany, New Jersey. Ammonium hydroxide can be added to the coating composition for coating stabilization, if desired. Preferably, water, and more preferably deionized water, is included in the coating composition in an amount sufficient to facilitate application of a generally uniform coating upon the strand. The weight percentage of solids of the coating composition generally ranges from 1 to 20 weight percent.

In one embodiment, the coating compositions of the present invention are substantially free of glass materials. As used herein, "substantially free of glass materials" means that the coating compositions comprise less than 50 volume percent of glass matrix materials for forming glass composites, preferably less than 35 volume percent. In a more preferred embodiment, the coating compositions of the present invention are essentially free of glass materials. As used herein, "essentially free of glass materials" means that the coating compositions comprise less than 20 volume percent of glass matrix materials for forming glass composites, preferably less than 5 volume percent, and more preferably is free of glass materials. Examples of such glass matrix materials include black glass ceramic matrix materials or aluminosilicate matrix materials such as are well known to those skilled in the art.

In one embodiment of the present invention, a fiber strand comprising a plurality of fibers is at least partially coated with a coating comprising an organic component and lamellar particles having a thermal conductivity of at least 1 Watt per meter K at a temperature of 300 K. In another embodiment, a fiber strand comprising a plurality of fibers is at least partially coated with a coating comprising an organic component and non-hydratable, lamellar particles. In each of these embodiments, the organic component and the lamellar particles can be selected from the coating components discussed above. The organic component and the lamellar particles can be the same or different, and the coating can be a residue of an aqueous coating composition or a powdered coating composition.

In yet another embodiment, a fiber strand comprising a plurality of fibers is at least partially coated with a coating comprising at least one boron-free lamellar particle having a thermal conductivity of at least 1 Watt per meter K at a temperature of 300 K. In another embodiment, a fiber strand comprising a plurality of fibers is at least partially coated with a residue of an aqueous composition comprising lamellar particles having a thermal conductivity of at least 1 Watt per meter K at a temperature of 300 K. In still another embodiment, a fiber strand comprising a plurality of fibers is at least partially coated with a residue of an aqueous composition comprising alumina-free, non-hydratable particles having a thermal conductivity of at least 1 Watt per meter K at a temperature of 300 K.

The components in these embodiments can be selected from the coating components discussed above, and additional components can also be selected from those recited above.

In another embodiment of the present invention, a fiber strand comprising a plurality of fibers is at least partially coated with a resin compatible coating composition on at least a portion of a surface of at least one of said fibers, the resin compatible coating composition comprising: (a) a plurality of discrete particles formed from materials selected from non-heat expandable organic materials, inorganic polymeric materials, non-heat expandable composite materials and mixtures thereof, the particles having an average particle size sufficient to allow strand wet out; (b) at least one lubricious material different from said plurality of discrete particles; and (c) at least one film-forming material. The components in these embodiments can be selected from the coating components discussed above. In a further embodiment, the plurality of discrete particles provide an interstitial space between the at least one of said fibers and at least one adjacent fiber.

In another embodiment, a fiber strand comprising a plurality of fibers is at least partially coated with a resin compatible coating composition on at least a portion of a surface of at least one of said fibers, the resin compatible coating composition comprising: (a) a plurality of particles comprising (i) at least one particle formed from an organic material; and (ii) at least one particle formed from an inorganic material selected from boron nitride, graphite and metal dichalcogenides, wherein the plurality of particles have an average particle size sufficient to allow strand wet out; (b) at least one lubricious material different from said plurality of discrete particles; and (c) at least one film-forming material.

In yet another embodiment, a fiber strand comprising a plurality of fibers is at least partially coated with a resin compatible coating composition on at least a portion of a surface of at least one of said fibers, the resin compatible coating composition comprising: (a) a plurality of discrete particles formed from materials selected from organic materials, inorganic polymeric materials, composite materials and mixtures thereof, the particles having an average particle size, measured according to laser scattering techniques, ranging from 0.1 to 5 micrometers; (b) at least one lubricious material different from said plurality of discrete particles; and (c) at least one film-forming material.

In a further embodiment, the resin compatible coating compositions set forth above contain (a) 20 to 60 weight percent of the plurality of discrete particles on total solids basis, preferably 35 to 55 weight percent, and more preferably 30 to 50 weight percent, (b) 0 to 80 weight percent of the at least one lubricious material on a total solids basis, preferably from 1 to 50 weight percent, and more preferably from 20 to 40 weight percent, and (c) 1 to 60 weight percent of the at least one film-forming material on total solids basis, preferably 5 to 50 weight percent, and more preferably 10 to 30 weight percent.

In another embodiment of the present invention, a fiber strand comprising a plurality of fibers is at least partially coated with a resin compatible coating composition on at least a portion of a surface of at least one of said fibers, the resin compatible coating composition comprising: (a) a plurality of discrete, non-waxy particles formed from materials selected from organic materials, composite materials and mixtures thereof, the particles having an average particle size, measured according to laser scattering techniques, ranging from 0.1 to 5 micrometers; and (b) at least one lubricious material different from said plurality of discrete particles.

In still another embodiment of the present invention, a fiber strand comprising a plurality of fibers is at least partially coated with a resin compatible coating composition on at least a portion of a surface of at least one of said fibers, the resin compatible coating composition comprising greater than 20 weight percent on a total solids basis of at least one particle selected from inorganic particles, organic hollow particles and composite particles, the at least one particle having a Mohs' hardness value which does not exceed the Mohs' hardness value of at least one of said fibers.

In another embodiment of the present invention, a fiber strand comprising a plurality of fibers is at least partially coated with a resin compatible coating composition on at least a portion of a surface of at least one of said fibers, the resin compatible coating composition comprising (a) at least one lamellar, inorganic particles having a Mohs' hardness value which does not exceed the Mohs' hardness value of at least one of said fibers; and (b) at least one polymeric material.

In an additional embodiment of the present invention, a fiber strand comprising a plurality of fibers is at least partially coated with a resin compatible coating composition on at least a portion of a surface of at least one of said fibers, the resin compatible coating composition comprising (a) at least one hollow, non-heat expandable organic particle; and (b) at least one lubricious material different from the at least one hollow organic particle.

The components in each of the foregoing embodiments can be selected from the coating components discussed above, and additional components can also be selected from those recited above.

In one embodiment of the present invention, a fiber is coated with a composition comprising an organic component and lamellar particles having a thermal conductivity of at least 1 Watt per meter K at a temperature of 300 K. In another embodiment, a fiber is coated with a composition comprising an organic component and non-hydratable, lamellar particles. In yet another embodiment, a fiber is coated with a composition comprising at least one boron-free lamellar particle having a thermal conductivity greater than 1 Watt per meter K at a temperature of 300 K. In still another embodiment, a fiber is coated with a composition comprising at least one lamellar particle having a thermal conductivity greater than 1 Watt per meter K at a temperature of 300 K. In yet another embodiment, a fiber is coated with a composition comprising at least one alumina-free, non-hydratable inorganic particle having a thermal conductivity greater than 1 Watt per meter K at a temperature of 300 K.

In another embodiment of the present invention, a fiber is coated with a composition comprising (a) a plurality of discrete particles formed from materials selected from non-heat expandable organic materials, inorganic polymeric materials, non-heat expandable composite materials and mixtures thereof, the particles having an average particle size sufficient to allow strand wet out, (b) at least one lubricious material different from said plurality of discrete particles, and (c) at least one film-forming material. In yet another embodiment, a fiber is coated with a composition comprising (a) a plurality of particles comprising (i) at least one particle formed from an organic material, and (ii) at least one particle formed from an inorganic material selected from boron nitride, graphite and metal dichalcogenides, wherein the plurality of particles have an average particle size sufficient to allow strand wet out, (b) at least one lubricious material different from said plurality of discrete particles, and (c) at least one film-forming material.

In still another embodiment, a fiber is coated with a composition comprising (a) a plurality of discrete particles formed from materials selected from organic materials, inorganic polymeric materials, composite materials and mixtures thereof, the particles having an average particle size, measured according to laser scattering techniques, ranging from 0.1 to 5 micrometers, (b) at least one lubricious material different from said plurality of discrete particles, and (c) at least one film-forming material.

In another embodiment of the present invention, a fiber is coated with a composition comprising (a) a plurality of discrete, non-waxy particles formed from materials selected from organic materials, composite materials and mixtures thereof, the particles having an average particle size, measured according to laser scattering techniques, ranging from 0.1 to 5 micrometers, and (b) at least one lubricious material different from said plurality of discrete particles. In yet another embodiment, a fiber is coated with a composition comprising a resin compatible coating composition comprising at least one coating comprising greater than 20 weight percent on a total solids basis of a plurality of particles selected from inorganic particles, organic hollow particles and composite particles, said particles having a Mohs' hardness value which does not exceed the Mohs' hardness value of said glass fiber.

In another embodiment of the present invention, a fiber is coated with a composition comprising (a) a plurality of lamellar, inorganic particles, and (b) at least one polymeric material. In still another embodiment, a fiber is coated with a composition comprising (a) a plurality of hollow, non-heat expandable organic particles, and (b) at least one polymeric material different from the at least one hollow organic particle. In an additional embodiment, the present invention, a fiber is coated with a resin compatible coating composition having a primary coating of a sizing composition on at least a portion of a surface of said fibers and a secondary coating comprising a residue of an aqueous coating composition comprising a plurality of discrete particles applied over at least a portion of the primary coating of the sizing composition.

The components in each of the foregoing embodiments can be selected from the coating components discussed above, and additional components can also be selected from those recited above.

In one non-limiting embodiment of the present invention, at least a portion of at least one of said fibers of the fiber strand of the present invention has applied thereto an aqueous coating composition comprising POLARTHERM® 160 boron nitride powder and/or BORON NITRIDE RELEASECOAT dispersion, EPON 826 epoxy film-forming material, PVP K-30 polyvinyl pyrrolidone, A-187 epoxy-functional organo silane coupling agent, ALKAMULS EL-719 polyoxyethylated vegetable oil, IGEPAL CA-630 ethoxylated octylphenoxyethanol, KESSCO PEG 600 polyethylene glycol monolaurate ester which is commercially available from Stepan Company of Chicago, Ill. and EMERY® 6717 partially amidated polyethylene imine.

In another non-limiting embodiment of the present invention for weaving cloth, at least a portion of at least one of said glass fibers of the fiber strand of the present invention has applied thereto a dried residue of an aqueous sizing composition comprising POLARTHERM® 160 boron nitride powder and/or BORON NITRIDE RELEASECOAT dispersion, RD-847A polyester, PVP K-30 polyvinyl pyrrolidone, DESMOPHEN 2000 polyester, A-174 acrylic-functional organo silane coupling agents and A-187 epoxy-functional organo silane coupling agents, PLURONIC F-108 polyoxypropylene-polyoxyethylene copolymer, MACOL NP-6 nonylphenyl surfactant, VERSAMID 140 and LE-9300 epoxidized silicone emulsion.

In another non-limiting embodiment of a fabric for use in electronic circuit boards of the present invention, at least a portion of at least one of said glass fibers of the fiber strand of the present invention has applied thereto an aqueous coating composition comprising POLARTHERM® PT 160 boron nitride powder and/or ORPAC BORON NITRIDE RELEASECOAT-CONC 25 dispersion, PVP K-30 polyvinyl pyrrolidone, A-174 acryic-functional organo silane coupling agent, A-187 epoxy-functional organo silane coupling agent, ALKAMULS EL-719 polyoxyethylated vegetable oil, EMERY® 6717 partially amidated polyethylene imine, RD-847A polyester, DESMOPHEN 2000 polyester, PLURONIC F-108 polyoxypropylene-polyoxyethylene copolymer, ICONOL NP-6 alkoxylated nonyl phenyl and SAG 10 anti-foaming material. If desired, this particular embodiment can optional further include ROPAQUE® HP-1055 and/or ROPAQUE® OP-96 styrene-acrylic copolymer hollow spheres.

In another non-limiting embodiment of fabric for use in electronic circuit boards of the present invention, at least a portion of at least one of said glass fibers of the fiber strand of the present invention has applied thereto a residue of an aqueous sizing composition comprising POLARTHERM® PT 160 boron nitride powder and/or ORPAC BORON NITRIDE RELEASECOAT-CONC 25 dispersion, RD-847A polyester, PVP K-30 polyvinyl pyrrolidone, DESMOPHEN 2000 polyester, A-174 acrylic-functional organo silane coupling agent, A-187 epoxy-functional organo silane coupling agent, PLURONIC F-108 polyoxypropylene-polyoxyethylene copolymer, VERSAMID 140 polyamide, and MACOL NP-6 nonyl phenyl. If desired, this particular embodiment can optional further include ROPAQUE® HP-1055 and/or ROPAQUE® OP-96 styrene-acrylic copolymer hollow spheres.

In still another non-limiting embodiment for weaving fabric for use in laminated printed circuit boards, at least a portion of at least one of said glass fibers of the fiber strand of the present invention has applied thereto a residue of an aqueous primary coating composition comprising ROPAQUE® HP-1055 and/or ROPAQUE® OP-96 styrene-acrylic copolymer hollow spheres, PVP K-30 polyvinyl pyrrolidone, A-174 acrylic-functional organo silane coupling agents and A-187 epoxy-functional organo silane coupling agents, EMERY® 6717 partially amidated polyethylen imine, STEPANTEX 653 cetyl palmitate, TMAZ 81 ethylene oxide derivatives of sorbitol esters, MACOL OP-10 ethoxylated alkylphenyl and MAZU DF-136 anti-foaming material. Although not required, this particular embodiment preferably further includes POLARTHERM® PT 160 boron nitride powder and/or ORPAC BORON NITRIDE RELEASECOAT-CONC 25 dispersion.

In yet another non-limiting embodiment of fabric for use in electronic circuit boards of the present invention, at least a portion of at least one of said glass fibers of the fiber strand of the present invention has applied thereto a residue of an aqueous coating composition comprising DESMOPHEN 2000 polyester, A-174 acrylic-functional organo silane coupling agent, A-187 epoxy-functional organo silane coupling agent, PLURONIC F-108 polyoxypropylene-polyoxyethylene copolymer, VERSAMID 140 polyamide, MACOL NP-6 nonyl phenyl, POLYOX WSR 301 poly (ethylene oxide) and DYNAKOLL Si 100 rosin. In addition, this particular embodiment further includes ROPAQUE® HP-1055 and/or ROPAQUE® OP-96 styrene-acrylic copolymer hollow spheres, and/or POLARTHERM® PT 160 boron nitride powder and/or ORPAC BORON NITRIDE RELEASECOAT-CONC 25 dispersion.

In another non-limiting embodiment of fabric for use in electronic circuit boards of the present invention, at least a portion of at least one of said glass fibers of the fiber strand of the present invention has applied thereto a residue of an aqueous coating composition comprising DESMOPHEN 2000 polyester, A-174 acrylic-functional organo silane coupling agent, A-187 epoxy-functional organo silane coupling agent, SYNPERONIC F-108 polyoxypropylene-polyoxyethylene copolymer, EUREDUR 140 polyamide, MACOL NP-6 nonyl phenyl, SERMUL EN 668 ethoxylated nonylphenyl, POLYOX WSR 301 poly(ethylene oxide) and DYNAKOLL Si 100 rosin. In addition, this particular embodiment further includes ROPAQUE® HP-1055 and/or ROPAQUE® OP-96 styrene-acrylic copolymer hollow spheres, and/or POLARTHERM® PT 160 boron nitride powder and/or ORPAC BORON NITRIDE RELEASECOAT-CONC 25 dispersion.

While not preferred, fiber strands having a residue of a coating composition similar to those described above that are free of particles 18 can be made in accordance with the present invention. In particular, it is contemplated that resin compatible coating compositions including one or more film-forming materials, such as PVP K-30 polyvinyl pyrrolidone; one or more silane coupling agents, such as A-174 acrylic-functional organo silane coupling agents and A-187 epoxy-functional organo silane coupling agents; and at least 25 percent by weight of the sizing composition on a total solids basis of a lubricious material having polar characteristics, such as STEPANTEX 653 cetyl palmitate, can be made in accordance with the present invention. It will be further appreciated by those skilled in the art that fiber strands having a resin compatible coating composition that is essentially free of particles 18 can be woven into fabrics and made into electronic supports and electronic circuit boards (as described below) in accordance with the present invention.

The coating compositions of the present invention can be prepared by any suitable method such as conventional mixing well known to those skilled in the art. Preferably, the components discussed above are diluted with water to have the desired weight percent solids and mixed together. The particles 18 can be premixed with water, emulsified or otherwise added to one or more components of the coating composition prior to mixing with the remaining components of the coating.

Coating compositions according to the present invention can be applied in many ways, for example by contacting the filaments with a roller or belt applicator, spraying or other means. The coated fibers are preferably dried at room temperature or at elevated temperatures. The dryer removes excess moisture from the fibers and, if present, cures any curable sizing composition components. The temperature and time for drying the glass fibers will depend upon such variables as the percentage of solids in the coating composition, components of the coating composition and type of fiber.

As used herein, the term "cure" as used in connection with a composition, e.g., "a cured composition," shall mean that any crosslinkable components of the composition are at least partially crosslinked. In certain embodiments of the present invention, the crosslink density of the crosslinkable components, i.e., the degree of crosslinking, ranges from 5% to 100% of complete crosslinking. In other embodiments, the crosslink density ranges from 35% to 85% of full crosslinking. In other embodiments, the crosslink density ranges from 50% to 85% of full crosslinking. One skilled in the art will understand that the presence and degree of crosslinking, i.e., the crosslink density, can be determined by a variety of methods, such as dynamic mechanical thermal analysis (DMTA) using a Polymer Laboratories MK III DMTA analyzer conducted under nitrogen. This method determines the glass transition temperature and crosslink density of free films of coatings or polymers. These physical properties of a cured material are related to the structure of the crosslinked network.

According to this method, the length, width, and thickness of a sample to be analyzed are first measured, the sample is tightly mounted to the Polymer Laboratories MK III apparatus, and the dimensional measurements are entered into the apparatus. A thermal scan is run at a heating rate of 3° C./min, a frequency of 1 Hz, a strain of 120%, and a static force of 0.01N, and sample measurements occur every two seconds. The mode of deformation, glass transition temperature, and crosslink density of the sample can be determined according to this method. Higher crosslink density valves indicate a higher degree of crosslinking in the coating.

The amount of the coating composition present on the fiber strand is preferably less than 30 percent by weight, more preferably less than 10 percent by weight and most preferably between 0.1 to 5 percent by weight as measured by loss on ignition (LOI). The coating composition on the fiber strand can be a residue of an aqueous coating composition or a powdered coating composition. In one embodiment of the invention, the LOI is less than 1 percent by weight. As used herein, the term "loss on ignition" means the weight percent of dried coating composition present on the surface of the fiber strand as determined by Equation 1:

$$LOI = 100 \times [(W_{dry} - W_{bars})/W_{dry}] \tag{Eq. 1}$$

wherein $W_{dry}$ is the weight of the fiber strand plus the weight of the coating composition after drying in an oven at 220° F. (about 104° C.) for 60 minutes and $W_{bars}$ is the weight of the bare fiber strand after heating the fiber strand in an oven at 1150° F. (about 621° C.) for 20 minutes and cooling to room temperature in a dessicator.

After the application of a primary size, i.e., the initial size applied after fiber formation, the fibers are gathered into strands having 2 to 15,000 fibers per strand, and preferably 100 to 1600 fibers per strand.

A secondary coating composition can be applied to the primary size in an amount effective to coat or impregnate the portion of the strands, for example by dipping the coated strand in a bath containing the secondary coating composition, spraying the secondary coating composition upon the coated strand or by contacting the coated strand with an applicator as discussed above. The coated strand can be passed through a die to remove excess coating composition from the strand and/or dried as discussed above for a time sufficient to at least partially dry or cure the secondary coating composition. The method and apparatus for applying the secondary coating composition to the strand is determined in part by the configuration of the strand material. The strand is preferably dried after application of the secondary coating composition in a manner well known in the art.

Suitable secondary coating compositions can include one or more film-forming materials, lubricants and other additives such as are discussed above. The secondary coating is preferably different from the primary sizing composition, i.e., it (1) contains at least one component which is chemically different from the components of the sizing composition; or (2) contains at least one component in an amount which is different from the amount of the same component contained in the sizing composition. Non-limiting examples of suitable secondary coating compositions including polyurethane are disclosed in U.S. Pat. Nos. 4,762,750 and 4,762,751, which are specifically incorporated by reference herein.

Figure 2:
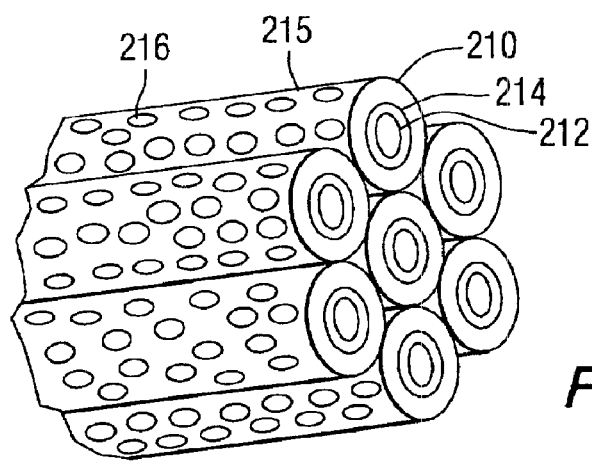
FIG. 2 is a perspective view of a coated fiber strand at least partially coated with a sizing composition and a secondary coating composition according to the present invention on at least a portion of the sizing composition.

Referring now to FIG. 2, in an alternative embodiment according to the present invention, the glass fibers 212 of the coated fiber strand 210 can having applied thereto a primary layer 214 of a primary sizing composition which can include any of the sizing components in the amounts discussed above. Examples of suitable sizing compositions are set forth in *Loewenstein* at pages 237–291 (3d Ed. 1993) and U.S. Pat. Nos. 4,390,647 and 4,795,678, each of which is specifically incorporated by reference herein. A secondary layer 215 of a secondary coating composition is applied to at least a portion, and preferably over the entire outer surface, of the primary layer 214. The secondary coating composition comprises one or more types of particles 216 such as are discussed in detail above as particles 18. In one embodiment, the secondary coating is a residue of an aqueous secondary coating composition, and, in particular, a residue of an aqueous secondary coating composition comprising lamellar particles on at least a portion of the primary coating. In another embodiment, the secondary coating is a powdered coating composition, and, in particular, a powdered coating composition comprising lamellar particles on at least a portion of the primary coating.

In an alternative embodiment, the particles of the secondary coating composition comprise hydrophilic inorganic solid particles that absorb and retain water in the interstices of the hydrophilic particles. The hydrophilic inorganic solid particles can absorb water or swell when in contact with water or participate in a chemical reaction with the water to form, for example, a viscous gel-like solution which blocks or inhibits further ingress of water into the interstices of a telecommunications cable which the coated glass fiber strand is used to reinforce. As used herein, "absorb" means that the water penetrates the inner structure or interstices of the hydrophilic material and is substantially retained therein.

See *Hawley's Condensed Chemical Dictionary* at page 3, which is specifically incorporated by reference herein. "Swell" means that the hydrophilic particles expand in size or volume. See *Webster's New Collegiate Dictionary* (1977) at page 1178, which is specifically incorporated by reference herein. Preferably, the hydrophilic particles swell after contact with water to at least one and one-half times their original dry weight, and more preferably two to six times their original weight. Non-limiting examples of hydrophilic inorganic solid lubricant particles that swell include smectites such as vermiculite and montmorillonite, absorbent zeolites and inorganic absorbent gels. Preferably, these hydrophilic particles are applied in powder form over tacky sizing or other tacky secondary coating materials.

In one embodiment of the present invention, a fiber strand comprising a plurality of fibers is at least partially coated with a resin compatible coating composition on at least a portion of a surface of the at least one fiber, the resin compatible coating composition having a primary coating of a sizing composition on at least a portion of a surface of the at least one fiber, and a secondary coating comprising a residue of an aqueous coating composition comprising at least one discrete particle applied over at least a portion of the primary coating of the sizing composition. In a preferred embodiment, the at least one discrete particle is selected from a hydrophilic particle which absorbs and retains water in interstices of the hydrophilic particle.

Further to these embodiments, the amount of particles in the secondary coating composition can range from 1 to 99 weight percent on a total solids basis, preferably from 20 to 90, more preferably from 25 to 80 weight percent, and even more preferably from 50 to 60 weight percent.

Figure 3:
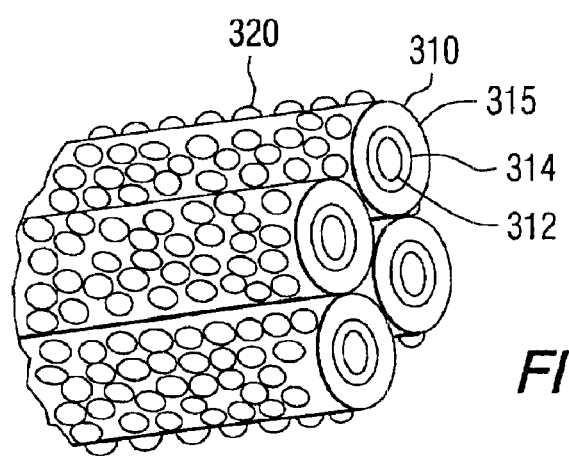
FIG. 3 is a perspective view of a coated fiber strand at least partially coated with a sizing composition, a secondary coating composition on at least a portion of the sizing composition, and a tertiary coating composition according to the present invention on at least a portion of the secondary coating composition.

In an alternative embodiment shown in FIG. 3, a tertiary layer 320 of a tertiary coating composition can be applied to at least a portion of the surface, and preferably over the entire surface, of a secondary layer 315, i.e., such a fiber strand 312 would have a layer 314 of a primary sizing, a secondary layer 315 of a secondary coating composition and a tertiary, outer layer 320 of the tertiary coating. The tertiary coating of the coated fiber strand 310 is preferably different from the primary sizing composition and the secondary coating composition, i.e., the tertiary coating composition (1) contains at least one component which is chemically different from the components of the primary sizing and secondary coating composition; or (2) contains at least one component in an amount which is different from the amount of the same component contained in the primary sizing or secondary coating composition.

In this embodiment, the secondary coating composition comprises one or more polymeric materials discussed above, such as polyurethane, and the tertiary powdered coating composition comprises solid particles, such as the POLARTHERM® boron nitride particles, and hollow particles, such as ROPAQUE® pigments, which are discussed above. Preferably, the powdered coating is applied by passing the strand having a liquid secondary coating composition applied thereto through a fluidized bed or spray device to adhere the powder particles to the tacky secondary coating composition. Alternatively, the strands can be assembled into a fabric 912 before the layer of tertiary coating 920 is applied, as shown in FIG. 9. Composite or laminate 910, which combines fabric 912 with a resin 914, also includes an electrically conductive layer 922, similar to the construction shown in FIG. 8 which will be discussed later in greater detail. The weight percent of powdered solid particles adhered to the coated fiber strand 310 can range from 0.1 to 75 weight percent of the total weight of the dried strand, and preferably 0.1 to 30 weight percent.

The tertiary powdered coating can also include one or more polymeric materials such as are discussed above, such as acrylic polymers, epoxies, or polyolefins, conventional stabilizers and other modifiers known in the art of such coatings, preferably in dry powder form.

In one embodiment, a fiber strand comprising a plurality of fibers is at least partially coated with a primary coating of a sizing composition applied to at least a portion of a surface of the at least one fiber, a secondary coating composition comprising a polymeric material applied to at least a portion of the primary composition, and a tertiary coating composition comprising discrete particles applied to at least a portion of the secondary coating. In another embodiment, a fiber strand comprising a plurality of fibers is at least partially coated with a primary coating of a sizing composition applied to at least a portion of a surface of at least one of said fibers, a secondary coating composition comprising a polymeric material applied to at least a portion of the primary composition, and a tertiary coating composition comprising lamellar particles applied to at least a portion of the secondary coating.

In one preferred embodiment, at least one of the coatings in each of the foregoing embodiments is different. In another preferred embodiment, at least two of the coatings in each of the foregoing embodiments are the same. Additionally, the tertiary coating can be a residue of an aqueous emulsion or a powdered coating composition. The coating compositions comprise one or more coating components discussed above.

The various embodiments of the coated fiber strands discussed above can be used as continuous strand or further processed into diverse products such as chopped strand, twisted strand, roving and/or fabric, such as wovens, non-wovens (including but not limited to unidirectional, biaxial and triaxial fabrics), knits, mats (both chopped and continuous strand mats) and multilayered fabrics (i.e. overlaying layers of fabric held together by stitching or some other material to form a three-dimensional fabric structure). In addition, the coated fiber strands used as warp and weft (i.e. fill) strands of a fabric can be non-twisted (also referred to as untwisted or zero twist) or twisted prior to weaving and the fabric can include various combinations of both twisted and non-twisted warp and weft strands.

Preferred embodiments of the present invention include an at least partially coated fabric comprising at least one of the fiber strands comprising a plurality of fibers discussed in detail above. Thus, an at least partially coated fabric made from each of the disclosed fiber strands comprising a plurality of fibers is, therefore, contemplated in the present invention. For example, one preferred embodiment of the present invention is directed to an at least partially coated fabric comprising at least one strand comprising plurality of fibers, the coating comprising an organic component and lamellar particles having a thermal conductivity of at least 1 Watt per meter K at a temperature of 300 K.

In one embodiment of the present invention, the coating compositions according to the present invention are applied to an individual fiber. In another embodiment, the coating is applied to at least one fiber strand. In another embodiment, the coating composition according to the present invention is applied to the fabric. These alternative embodiments are fully discussed below.

Although the prior discussion is generally directed toward applying the coating composition of the present invention directly on glass fibers after fiber forming and subsequently incorporating the fibers into a fabric, the present invention also includes embodiments wherein the coating composition of the present invention is applied to a fabric. The coating composition can be applied to a fabric, for example, by applying the coating to a fiber strand before the fabric is manufactured, or by applying the coating to the fabric after it has been manufactured using various techniques well known in the art. Depending on the processing of the fabric, the coating composition of the present invention can be applied either directly to the glass fibers in the fabric or to another coating already on the glass fibers and/or fabric. For example, the glass fibers can be coated with a conventional starch-oil sizing after forming and woven into a fabric. The fabric can then be treated to remove starch-oil sizing prior to applying the coating composition of the present invention. This sizing removal can be accomplished using techniques well known in the art, such as thermal treatment or washing of the fabric. In this instance, the coating composition would directly coat the surface of the fibers of the fabric. If any portion of the sizing composition initially applied to the glass fibers after forming is not removed, the coating composition of the present invention would then be applied over the remaining portion of the sizing composition rather than directly to the fiber surface.

In another embodiment of the present invention, selected components of the coating composition of the present invention can be applied to the glass fibers immediately after forming and the remaining components of the coating composition can be applied to the fabric after it is made. In a manner similar to that discussed above, some or all of the selected components can be removed from the glass fibers prior to coating the fibers and fabric with the remaining components. As a result, the remaining components will either directly coat the surface of the fibers of the fabric or coat those selected components that were not removed from the fiber surface.

In another preferred embodiment according to the present invention, a fabric comprising at least one strand comprising a plurality of fibers is at least partially coated with a primary coating and a secondary coating on at least a portion of the primary coating, the secondary coating comprising particles of an inorganic material having a thermal conductivity greater than 1 Watts per meter K at a temperature of 300 K.

In another embodiment, a fabric comprising at least one strand comprising a plurality of fibers is at least partially coated with coating comprising (a) lamellar, inorganic particles having a Mohs' hardness value which does not exceed the Mohs' hardness value of the at least one glass fiber, and (b) a film-forming material.

In yet another embodiment, a fabric comprising at least one strand comprising a plurality of fibers is at least partially coated with a coating comprising (a) metallic particles having a Mohs' hardness value which does not exceed the Mohs' hardness value of the at least one glass fiber, the metallic particles being selected from indium, thallium, tin, copper, zinc, gold and silver, and (b) a film-forming material.

In another embodiment, a fabric comprising at least one strand comprising a plurality of fibers is at least partially coated with a primary coating and a secondary coating on at least a portion of the primary coating, the secondary coating comprising a plurality of hydrophilic particles which absorb and retain water in the interstices of the hydrophilic particles.

In still another embodiment of the present invention, a fabric comprising at least one strand comprising a plurality of fibers has a resin compatible coating composition on at least a portion of a surface of the fabric, the resin compatible coating composition comprising (a) a plurality of discrete particles formed from materials selected from organic materials, inorganic polymeric materials, composite materials and mixtures thereof, the particles having an average particle size, measured according to laser scattering, ranging from 0.1 to 5 micrometers, (b) at least one lubricious material different from said plurality of discrete particles, and (c) at least one film-forming material.

In another embodiment, a fabric comprising at least one strand comprising a plurality of fibers has a resin compatible coating composition on at least a portion of a surface of the fabric, the resin compatible coating composition comprising (a) a plurality of discrete, non-waxy particles formed from materials selected from organic materials, composite materials and mixtures thereof, and at least one lubricious material different from said plurality of discrete particles.

In another embodiment of the present invention, a fabric comprising at least one strand comprising a plurality of fibers has a resin compatible coating composition on at least a portion of a surface of the fabric, the resin compatible coating composition comprising (a) a plurality of hollow organic particles, and (b) at least one polymeric material different from the hollow organic particles.

Another embodiment of present invention is directed to a fabric comprising at least one strand comprising a plurality of fibers, wherein at least a portion of the fabric has a resin compatible coating with a loss on ignition of ranging from 0.1 to 1.6, and an air permeability, measured according to ASTM D 737, of no greater than 10 standard cubic feet per minute per square foot.

As used herein, "air permeability" means how permeable the fabric is to flow of air therethrough. Air permeability can be measured by ASTM D 737 Standard Test Method for Air Permeability of Textile Fabrics, which is specifically incorporated by reference herein.

These components used in these various embodiments can be selected from the coating components discussed above, and additional components can also be selected from those recited above.

In a preferred embodiment of the present invention, a fabric adapted to reinforce an electronic support is made by a method comprising the steps of:
  (a) obtaining at least one fill yarn comprising a plurality of fibers and having a first resin compatible coating on at least a portion of the at least one fill yarn;
  (b) obtaining at least one warp yarn comprising a plurality of fibers and having a second resin compatible coating on at least a portion of the at least one warp yarn; and
  (c) weaving the at least one fill yarn and the at least one warp yarn having a loss on ignition of less than 2.5 percent by weight to form a fabric adapted to reinforce an electronic support.

In an additional embodiment of the present invention, a fabric is assembled by (a) slidingly contacting at least a portion of a first glass fiber strand comprising a plurality of glass fibers having on at least a portion of surfaces thereof a coating according to any of the previous embodiments, either individually or in combination, which inhibit abrasive wear of the surfaces of the plurality of glass fibers, in sliding contact with surface asperities of a portion of a fabric assembly device, the surface asperities having a Mohs' hardness value which is greater than a Mohs' hardness value of glass fibers of the first glass fiber strand; and (b) interweaving the first glass fiber strand with a second fiber strand to form a fabric.

Further embodiments of the present invention are directed to methods for inhibiting abrasive wear of a fiber strand comprising at least one glass fiber by sliding contact with surface asperities of a solid object comprising:
  (a) applying a coating composition according to any of the previous embodiments, either individually or in combination, to at least a portion of a surface of at least one glass fiber of a glass fiber strand;
  (b) at least partially drying the composition to form a sized glass fiber strand having a residue of the composition upon at least a portion of the surface of the at least one glass fiber; and
  (c) sliding at least a portion of the glass fiber strand to contact surface asperities of a solid object, the surface asperities having a hardness value which is greater than a hardness value of the at least one glass fiber, such that abrasive wear of the at least one glass fiber of the glass fiber strand by contact with the surface asperities of the solid object is inhibited by the coating composition.

As above, the components of the coatings used in these embodiments can be selected from the coating components discussed above, and additional components can also be selected from those recited above.

Figure 4:
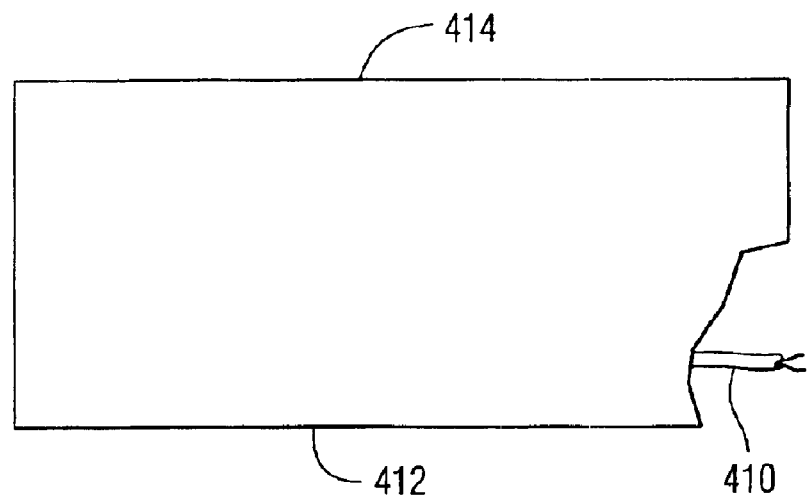
FIG. 4 is a top plan view of a composite product according to the present invention.

The coated fiber strands 10, 210, 310 and products formed therefrom, such as the coated fabrics recited above, can be used in a wide variety of applications, but are preferably used as reinforcements 410 for reinforcing polymeric matrix materials 412 to form a composite 414, such as is shown in FIG. 4, which will be discussed in detail below. Such applications include but are not limited to laminates for printed circuit boards, reinforcements for telecommunications cables, and various other composites.

The coated strands and fabrics of the present invention are preferably compatible with typical polymeric matrix resins used to make electronic supports and printed circuit boards. In addition, the coated fiber strands are suitable for use on air-jet looms, which are commonly used to make the reinforcing fabrics for such applications. Conventional sizing compositions applied to fibers to be woven using air-jet looms include components such as starches and oils that are generally not compatible with such resin systems. It has been observed that weaving characteristics of fiber strands coated with a coating composition comprising particles 18 in accordance with the present invention approximate the weaving characteristics of fiber strands coated with conventional starch/oil based sizing compositions and are compatible with FR-4 epoxy resins. Although not meant to be bound by any particular theory, it is believed that the particles 18 of the instant invention function in a manner similar to the starch component of conventional starch/oil sizing compositions during processing and air-jet weaving by providing the necessary fiber separation and air drag for the air jet weaving operation but function in a manner different from the conventional compositions by providing compatibility with the epoxy resin system. For example, the particles 18 contribute a dry, powder characteristic to the coating similar to the dry lubricant characteristics of a starch coating.

In the coated strands of the present invention, the particles can advantageously provide interstices between the fibers of the strand which facilitate flow of the matrix materials therebetween to more quickly and/or uniformly wet-out and wet-through the fibers of the strand. Additionally, the strands preferably have high strand openness (discussed above) which also facilitates flow of the matrix material into the bundles. Surprisingly, in certain embodiments, the amount of particles can exceed 20 weight percent of the total solids of the coating composition applied to the fibers, yet still be adequately adhered to the fibers and provide strands having handling characteristics at least comparable to strands without the particle coating.

Figure 8:
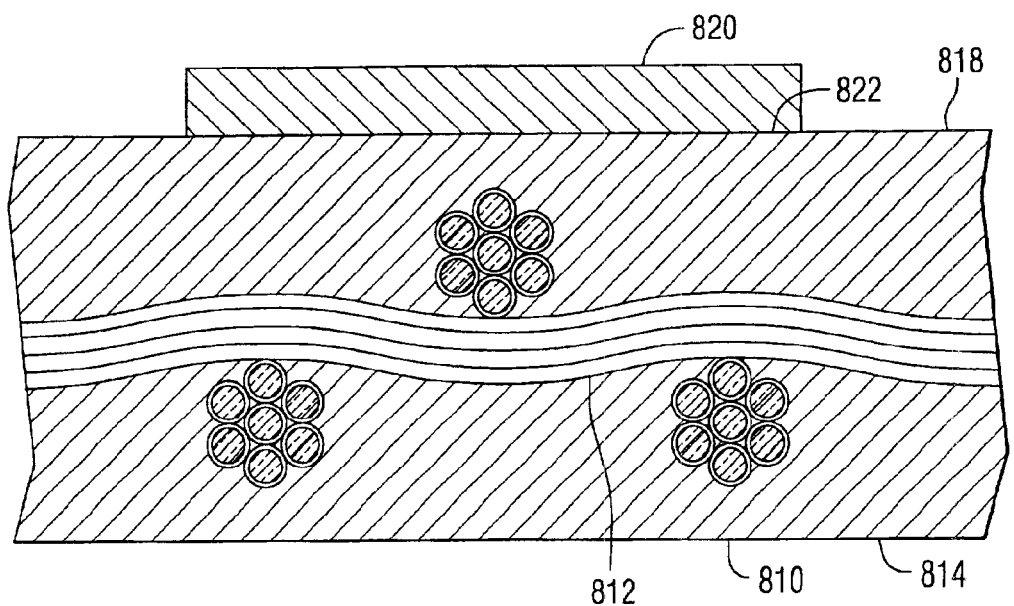
FIGS. 8 and 9 are cross-sectional views of alternate embodiments of an electronic support according to the present invention.
Figure 9:
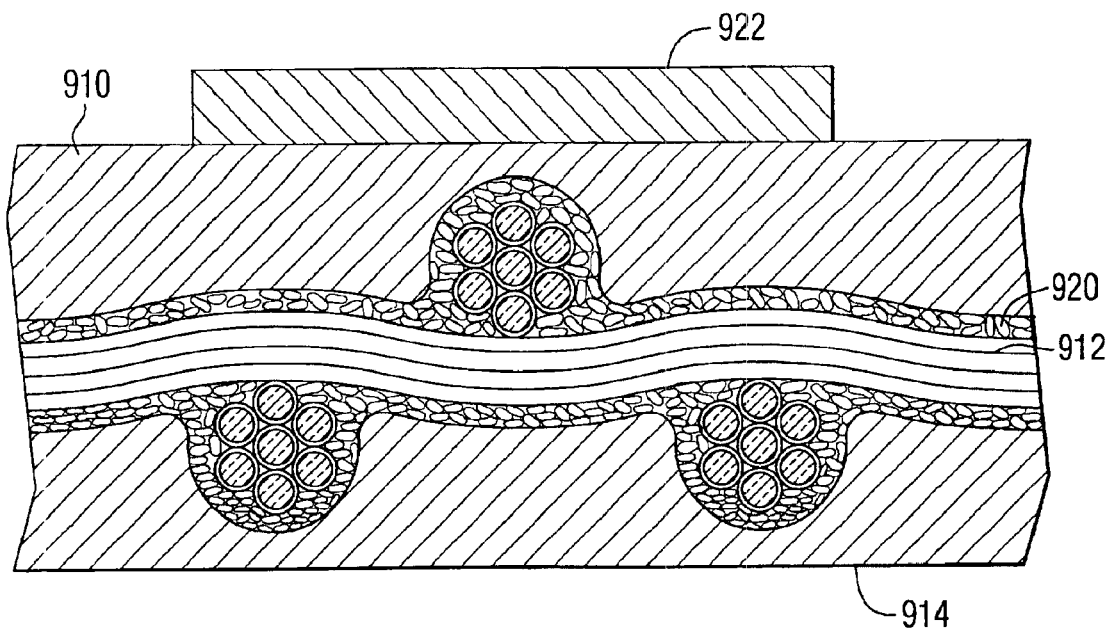

Referring now to FIG. 8, one advantage of the coated strands of the present invention is that laminates 810 made from fabrics 812 incorporating the coated strands can have good coupling at the interface between the fabric 812 and the polymeric matrix material 814. Good interfacial coupling can provide for good hydrolytic stability and resistance to metal migration (previously discussed) in electronic supports 818 made from laminates 810.

Figure 5:
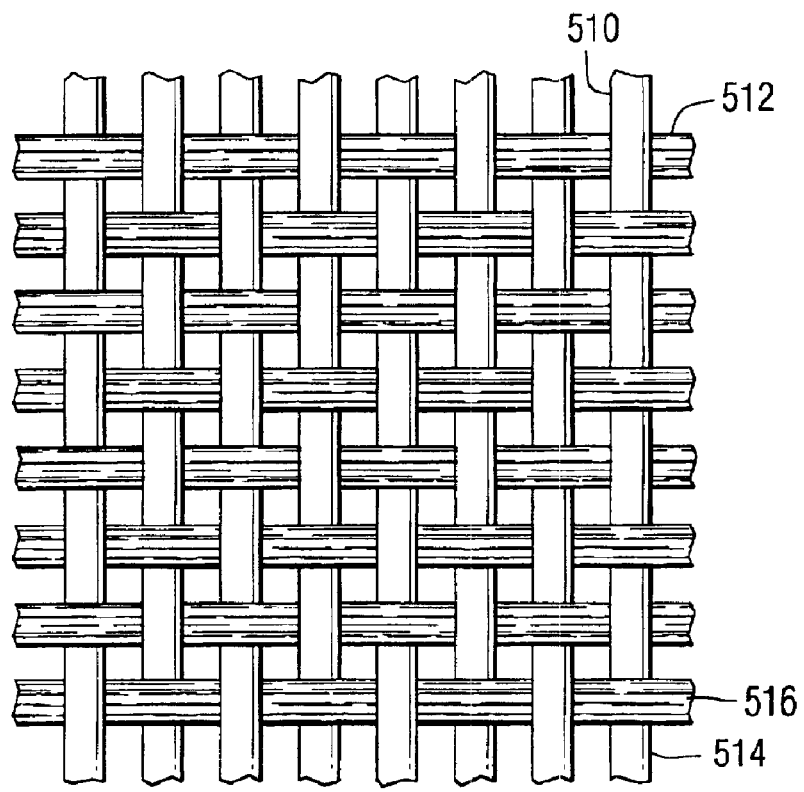
FIG. 5 is a top plan view of a fabric according to the present invention.
Figure 7:
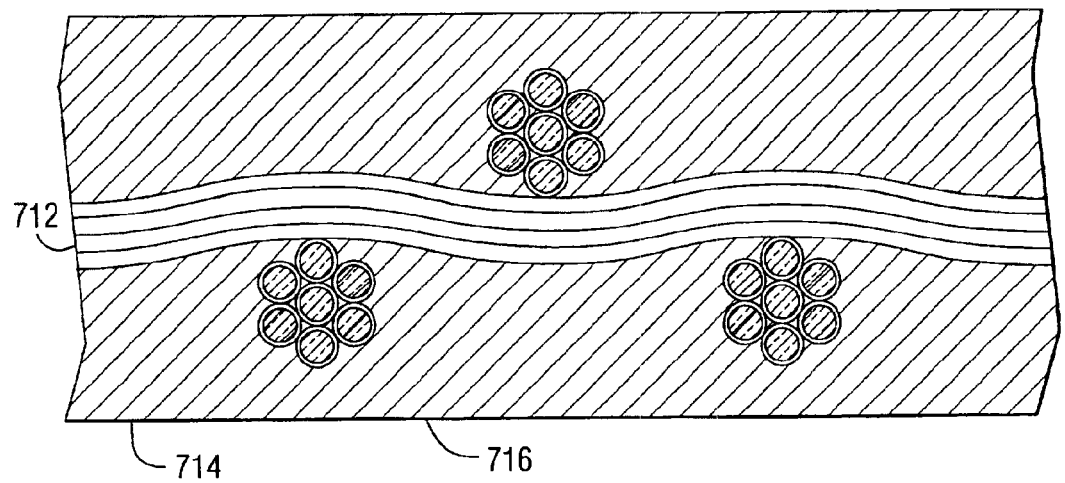
FIG. 7 is a cross-sectional view of an electronic support according to the present invention.

In another non-limiting embodiment shown in FIG. 5, coated fiber strands 510 made according to the present invention can be used as warp and/or weft strands 514, and 516 in a knit or woven fabric 512 reinforcement, preferably to form a laminate for a printed circuit board (shown in FIGS. 7–9). Although not required, the warp strands 514 can be twisted prior to use by any conventional twisting technique known to those skilled in the art. One such technique uses twist frames to impart twist to the strand at 0.5 to 3 turns per inch. The reinforcing fabric 512 can preferably include 5 to 100 warp strands 514 per centimeter (about 13 to 254 warp strand per inch) and preferably has 6 to 50 weft strands per centimeter (about 15 to about 127 weft strands per inch). The weave construction can be a regular plain weave or mesh (shown in FIG. 5), although any other weaving style well known to those skilled in the art, such as a twill weave or satin weave, can be used.

In one embodiment, a suitable woven reinforcing fabric 512 of the present invention can be formed by using any conventional loom well known to those skilled in the art, such as a shuttle loom, air jet loom or rapier loom, but preferably is formed using an air jet loom. Preferred air jet looms are commercially available from Tsudakoma of Japan as Model Nos. 103, 1031 1033 or ZAX; Sulzer Ruti Model Nos. L-5000, L-5100 or L-5200 which are commercially available from Sulzer Brothers LTD. of Zurich, Switzerland; and Toyoda Model No. JAT610.

Figures 6, 6A:
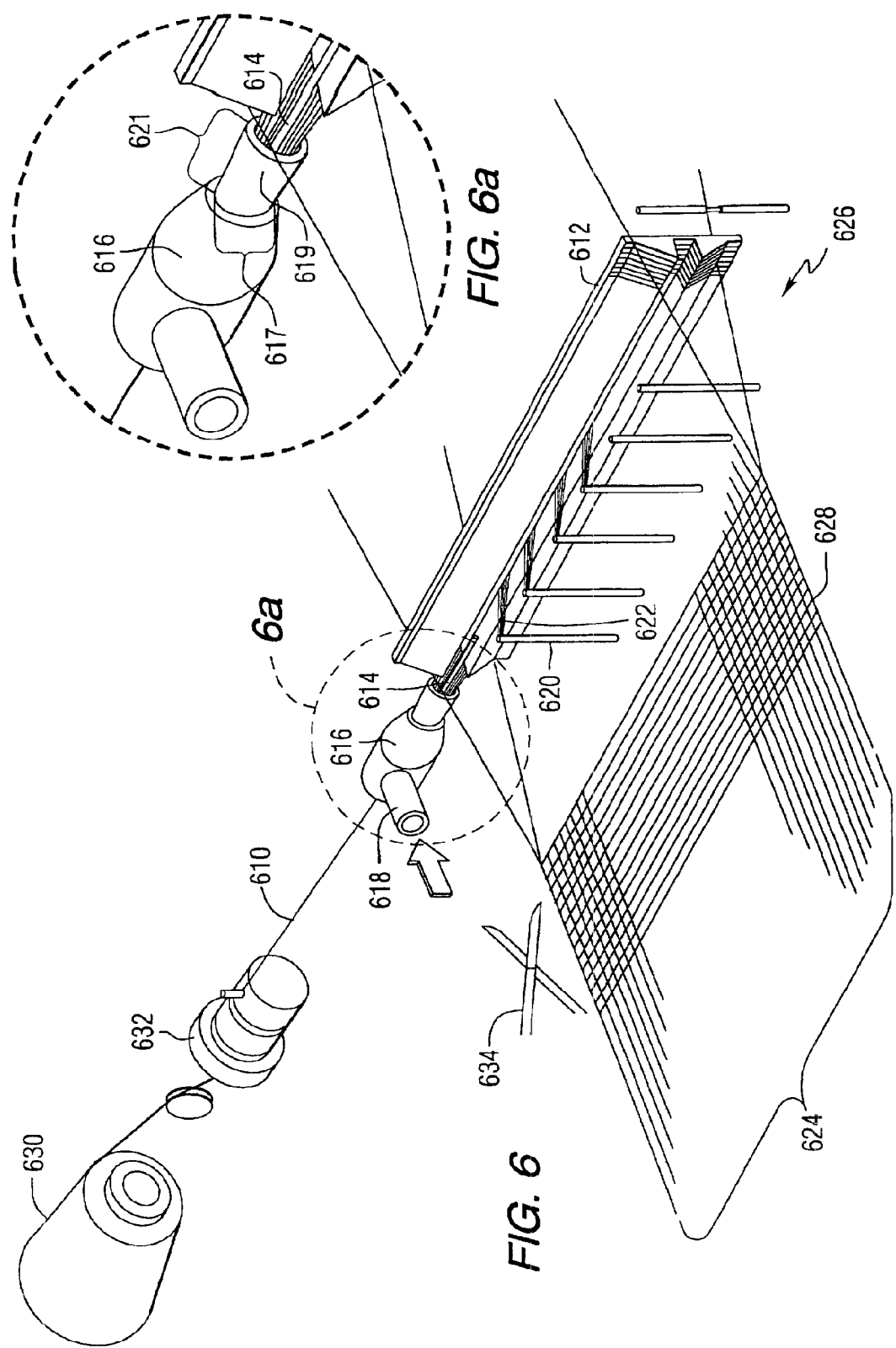
FIG. 6 is a schematic diagram of a method for assembling a fabric and forming a laminate according to the present invention.

As set forth in the figures, air jet weaving refers to a type of fabric weaving using an air jet loom 626 (shown in FIG. 6) in which the fill yarn (weft) 610 is inserted into the warp shed by a blast of compressed air 614 from one or more air jet nozzles 618 (shown in FIGS. 6 and 6a), as discussed above. The fill yarn 610 is propelled across the width 624 of the fabric 628 (about 10 to about 60 inches), and more preferably 0.91 meters (about 36 inches) by the compressed air.

The air jet filling system can have a single, main nozzle 616, but preferably also has a plurality of supplementary, relay nozzles 620 along the warp shed 612 for providing blasts of supplementary air 622 to the fill yarn 610 to maintain the desired air pressure as the yarn 610 traverses the width 624 of the fabric 628. The air pressure (gauge) supplied to the main air nozzle 616 preferably ranges from 103 to 413 kiloPascals (kPa) (about 15 to about 60 pounds per square inch (psi)), and more preferably is 310 kPa (about 45 psi). The preferred style of main air nozzle 616 is a Sulzer Ruti needle air jet nozzle unit Model No. 044 455 001 which has an internal air jet chamber having a diameter 617 of 2 millimeters and a nozzle exit tube 619 having a length 621 of 20 centimeters (commercially available from Sulzer Ruti of Spartanburg, North Carolina). Preferably, the air jet filling system has 15 to 20 supplementary air nozzles 620 which supply auxiliary blasts of air in the direction of travel of the fill yarn 610 to assist in propelling the yarn 610 across the loom 626. The air pressure (gauge) supplied to each supplementary air nozzle 620 preferably ranges from 3 to 6 bars.

The fill yarn 610 is drawn from the supply package 630 by a feeding system 632 at a feed rate of 180 to 550 meters per minute, and preferably 274 meters (about 300 yards) per minute. The fill yarn 610 is fed into the main nozzle 618 through a lamp. A blast of air propels a predetermined length of yarn (approximately equal to the desired width of the fabric) through the confusor guide. When the insertion is completed, the end of the yarn distal to the main nozzle 618 is cut by a cutter 634.

The compatibility and aerodynamic properties of different yarns with the air jet weaving process can be determined by the following method, which will generally be referred to herein as the "Air Jet Transport Drag Force" Test Method. The Air Jet Transport Drag Force Test is used to measure the attractive or pulling force ("drag force") exerted upon the yarn as the yarn is pulled into the air jet nozzle by the force of the air jet. In this method, each yarn sample is fed at a rate of 274 meters (about 300 yards) per minute through a Sulzer Ruti needle air jet nozzle unit Model No. 044 455 001 which has an internal air jet chamber having a diameter 617 of 2 millimeters and a nozzle exit tube 619 having a length 621 of 20 centimeters (commercially available from Sulzer Ruti of Spartanburg, North Carolina) at an air pressure of 310 kiloPascals (about 45 pounds per square inch) gauge. A tensiometer is positioned in contact with the yarn at a position prior to the yarn entering the air jet nozzle. The tensiometer provides a measurement of the gram force (drag force) exerted upon the yarn by the air jet as the yarn is pulled into the air jet nozzle.

The drag force per unit mass can be used as a basis for relative comparison of yarn samples. For relative comparison, the drag force measurements are normalized over a one centimeter length of yarn. The Gram Mass of a one centimeter length of yarn can be determined according to Equation 2:

$$\text{Gram Mass} = (\pi (d/2)^2) \, (N) \, (\rho_{glass}) \, (1 \text{ centimeter length of yarn}) \quad (\text{Eq. 2})$$

where d is the diameter of a single fiber of the yarn bundle, N is the number of fibers in the yarn bundle and $\rho_{glass}$ is the density of the glass at a temperature of 25° C. (about 2.6 grams per cubic centimeter). Table C lists the diameters and number of fibers in a yarn for several typical glass fiber yarn products.

TABLE C

| Yarn type | Fiber Diameter (centimeters) | Number of Fibers in Bundle |
|---|---|---|
| G75 | $9 \times 10^{-4}$ | 400 |
| G150 | $9 \times 10^{-4}$ | 200 |
| E225 | $7 \times 10^{-4}$ | 200 |
| D450 | $5.72 \times 10^{-4}$ | 200 |

For example, the Gram Mass of a one centimeter length of G75 yarn is $(\pi(9\times10^{-4}/2)^2)$ (400) (2.6 grams per cubic centimeter) (1 centimeter length of yarn)=$6.62\times10^{-4}$ gram mass. For D450 yarn, the Gram Mass is $1.34\times10^{-4}$ gram mass. The relative drag force per unit mass ("Air Jet Transport Drag Force") is calculated by dividing the drag force measurement (gram force) determined by the tensiometer by the Gram Mass for the type of yarn tested. For example, for a sample of G75 yarn, if the tensiometer measurement of the drag force is 68.5, then the Air Jet Transport Drag Force is equal to 68.5 divided by $6.62\times10^{-4}$=103,474 gram force per gram mass of yarn.

The Air Jet Transport Drag Force of the yarn used to form a woven fabric for a laminate according to the present invention, determined according to the Air Jet Transport Drag Force Test Method discussed above, is preferably greater than 100,000 gram force per gram mass of yarn, more preferably ranges from 100,000 to 400,000 gram force per gram mass of yarn, and even more preferably ranges from 120,000 to 300,000 gram force per gram mass of yarn.

The fabric of the present invention is preferably woven in a style which is suitable for use in a laminate for an electronic support or printed circuit board, such as are disclosed in "Fabrics Around the World", a technical bulletin of Clark-Schwebel, Inc. of Anderson, South Carolina (1995), which is specifically incorporated by reference herein. The laminates can be a unidirectional laminate wherein most of the fibers, yarns or strands in each layer of fabric are oriented in the same direction.

For example, a non-limiting fabric style using E225 E-glass fiber yarns is Style 2116, which has 118 warp yarns and 114 fill (or weft) yarns per 5 centimeters (60 warp yarns and 58 fill yarns per inch); uses 7 22 1×0 (E225 1/0) warp and fill yarns; has a nominal fabric thickness of 0.094 millimeters (about 0.037 inches); and a fabric weight (or basis weight) of 103.8 grams per square meter (about 3.06 ounces per square yard). A non-limiting example of a fabric style using G75 E-glass fiber yarns is Style 7628, which has 87 warp yarns and 61 fill yarns per 5 centimeters (44 warp yarns and 31 fill yarns per inch); uses 9 68 1×0 (G75 1/0) warp and fill yarns; has a nominal fabric thickness of 0.173 millimeters (about 0.0068 inches); and a fabric weight of 203.4 grams per square meter (about 6.00 ounces per square yard). A non-limiting example of a fabric style using D450 E-glass fiber yarns is Style 1080, which has 118 warp yarns and 93 fill yarns per 5 centimeters (60 warp yarns and 47 fill yarns per inch); uses 5 11 1×0 (D450 1/0) warp and fill yarns; has a nominal fabric thickness of 0.053 millimeters (about 0.0021 inches); and a fabric weight of 46.8 grams per square meter (about 1.38 ounces per square yard). A non-limiting example of a fabric style using D900 E-glass fiber yarns is Style 106, which has 110 warp yarns and 110 fill yarns per 5 centimeters (56 warp yarns and 56 fill yarns per inch); uses 5 5.5 1×0 (D900 1/0) warp and fill yarns; has a nominal fabric thickness of 0.033 millimeters (about 0.013 inches); and a fabric weight of 24.4 grams per square meter (about 0.72 ounces per square yard). Another non-limiting example of a fabric style using D900 E-glass fiber yarns is Style 108, which has 118 warp yarns and 93 fill yarns per 5 centimeters (60 warp yarns and 47 fill yarns per inch); uses 5 5.5 1×2 (D900 1/2) warp and fill yarns; has a nominal fabric thickness of 0.061 millimeters (about 0.0024 inches); and a fabric weight of 47.5 grams per square meter (about 1.40 ounces per square yard). A non-limiting example of a fabric style using both E225 and D450 E-glass fiber yarns is Style 2113, which has 118 warp yarns and 110 fill yarns per 5 centimeters (60 warp yarns and 56 fill yarns per inch); uses 7 22 1×0 (E225 1/0) warp yarn and 5 11 1×0 (D450 1/0) fill yarn; has a nominal fabric thickness of 0.079 millimeters (about 0.0031 inches); and a fabric weight of 78.0 grams per square meter (about 2.30 ounces per square yard). A non-limiting example of a fabric style using both G50 and G75 E-glass fiber yarns is Style 7535 which has 87 warp yarns and 57 fill yarns per 5 centimeters (44 warp yarns and 29 fill yarns per inch); uses 9 68 1×0 (G75 1/0) warp yarn and 9 99 1×0 (G50 1/0) fill yarn; has a nominal fabric thickness of 0.201 millimeters (about 0.0079 inches); and a fabric weight of 232.3 grams per square meter (about 6.85 ounces per square yard).

These and other useful fabric style specification are given in IPC-EG-140 "Specification for Finished Fabric Woven from 'E' Glass for Printed Boards", a publication of The Institute for Interconnecting and Packaging Electronic Circuits (June 1997), which is specifically incorporated by reference herein. Although the aforementioned fabric styles use twisted yarns, it is contemplated that these or other fabric styles using zero-twist yarns or rovings in conjunction with or in lieu of twisted yarns can be made in accordance with the present invention.

In an embodiment of the present invention, some or all of the warp yarn in the fabric can have fibers coated with a first resin compatible sizing composition and some or all of the fill yarn can have fibers coated with a second resin compatible coating differing from the first composition, i.e., the second composition (1) contains at least one component which is chemically different or differs in form from the components of the first sizing composition; or (2) contains at least one component in an amount which is different from the amount of the same component contained in the first sizing composition.

Referring now to FIG. 7, the fabric 712 can be used to form a composite or laminate 714 by coating and/or impregnating with a matrix material, preferably a polymeric film-forming thermoplastic or thermosetting matrix material 716. The composite or laminate 714 is suitable for use as an electronic support. As used herein, "electronic support" means a structure that mechanically supports and/or electrically interconnects elements. Examples include, but are not limited to, active electronic components, passive electronic components, printed circuits, integrated circuits, semiconductor devices and other hardware associated with such elements including but not limited to connectors, sockets, retaining clips and heat sinks.

Preferred embodiments of the present invention are directed to a reinforced composite comprising at least one partial coated fiber strand comprising a plurality of fibers discussed in detail above. Reinforced composites made from each of the disclosed fiber strands comprising a plurality of fibers are therefore contemplated by the present invention. For example, one preferred embodiment of the present invention is directed to a reinforced composite comprising a matrix material and at least one partially coated fiber strand comprising a plurality of fibers, the coating comprising an organic component and lamellar particles having a thermal conductivity of at least 1 Watt per meter K at a temperature of 300 K.

Another preferred embodiment of the present invention is directed to a reinforced composite comprising (a) an at least partially coated fiber strand comprising a plurality of fibers, the coating comprising at least one lamellar particle, and (b) a matrix material.

Yet another preferred embodiment is directed to a reinforced composite comprising (a) an at least partially coated fiber strand comprising a plurality of glass fibers, the coating comprising a residue of an aqueous composition comprising (i) a plurality of discrete particles formed from materials selected from organic materials, inorganic polymeric materials, composite materials and mixtures thereof; (ii) at least one lubricious material different from said plurality of discrete particles; and (iii) at least one film-forming material; and (b) a matrix material.

Still another preferred embodiment of the present invention is directed to a reinforced composite comprising at least one fiber strand and a matrix material, wherein the reinforced composite further comprises a residue of an aqueous composition comprising (a) a plurality of discrete particles formed from materials selected from organic materials, inorganic polymeric materials, composite materials and mixtures thereof; (b) at least one lubricious material different from said plurality of discrete particles; and (c) at least one film-forming material.

Another preferred embodiment of the present invention is directed to a reinforced composite comprising (a) an at least partially coated fiber strand comprising a plurality of glass fibers, the coating comprising a residue of an aqueous u composition comprising greater than 20 weight percent on a total solids basis of discrete particles which have a Mohs' hardness value which does not exceed a Mohs' hardness value of at least one of said glass fibers; and (b) a matrix material.

Another preferred embodiment is directed to a reinforced composite comprising at least one fiber strand comprising a plurality of glass fibers and a matrix material, wherein the reinforced composite further comprises a residue of an aqueous composition comprising greater than 20 weight percent on a total solids basis of discrete particles which have a Mohs' hardness value which does not exceed a Mohs' hardness value of at least one of said glass fibers.

An additional embodiment of the present invention is directed to a reinforced composite comprising (a) at least one fiber strand comprising a plurality of glass fibers, the strand coated with a resin compatible composition comprising a plurality of discrete particles formed from materials selected from organic materials, inorganic polymeric materials, composite materials and mixtures thereof, wherein the discrete particles have an average particle size less than 5 micrometers; and (b) a matrix material. In particular, the plurality of discrete particles are formed from materials selected from non-heat expandable organic materials, inorganic polymeric materials, non-heat expandable composite materials, and mixtures of any of the foregoing.

The components of the coatings and resin compatible compositions used in the foregoing embodiments directed to reinforced composites can be selected from the coating components discussed above, and additional components can also be selected from those recited above.

Preferred matrix materials useful in the present invention include thermosetting materials such as thermosetting polyesters, vinyl esters; epoxides (containing at least one epoxy or oxirane group in the molecule, such as polyglycidyl ethers of polyhydric alcohols or thiols), phenylics, aminoplasts, thermosetting polyurethanes, derivatives of any of the foregoing, and mixtures of any of the foregoing. Preferred matrix materials for forming laminates for printed circuit boards are FR-4 epoxy resins, which are polyfunctional epoxy resins such as difunctional brominated epoxy resins, polyimides and liquid crystalline polymers, the compositions of which are well know to those skilled in the art. If further information regarding such compositions is needed, see *Electronic Materials Handbook*™, ASM International (1989) at pages 534–537, which is specifically incorporated by reference herein.

Non-limiting examples of suitable polymeric thermoplastic matrix materials include polyolefins, polyamides, thermoplastic polyurethanes and thermoplastic polyesters, vinyl polymers, and mixtures of any of the foregoing. Further examples of useful thermoplastic materials include polyimides, polyether sulfones, polyphenyl sulfones, polyetherketones, polyphenylene oxides, polyphenylene sulfides, polyacetals, polyvinyl chlorides and polycarbonates.

A preferred matrix material formulation consists of EPON 1120-A80 epoxy resin (commercially available from Shell Chemical Company of Houston, Tex.), dicyandiamide, 2-methylimidazole and DOWANOL PM glycol ether (commercially available from The Dow Chemical Co. of Midland, Mich.).

Other components which can be included with the polymeric matrix material and reinforcing material in the composite include colorants or pigments, lubricants or processing aids, ultraviolet light (UV) stabilizers, antioxidants, other fillers and extenders. In a preferred embodiment, inorganic materials are included with the polymeric matrix material. These inorganic materials include ceramic materials and metallic materials, and can be selected from the inorganic materials described in detail above.

The fabric 712 can be coated and impregnated by dipping the fabric 712 in a bath of the polymeric matrix material 716, for example, as discussed in R. Tummala (Ed.), *Microelectronics Packaging Handbook*, (1989) at pages 895–896, which are specifically incorporated by reference herein. More generally, chopped or continuous fiber strand reinforcing material can be dispersed in the matrix material by hand or any suitable automated feed or mixing device which distributes the reinforcing material generally evenly throughout the polymeric matrix material. For example, the reinforcing material can be dispersed in the polymeric matrix material by dry blending all of the components concurrently or sequentially.

The polymeric matrix material 716 and strand can be formed into a composite or laminate 714 by a variety of methods which are dependent upon such factors as the type of polymeric matrix material used. For example, for a thermosetting matrix material, the composite can be formed by compression or injection molding, pultrusion, filament winding, hand lay-up, spray-up or by sheet molding or bulk molding followed by compression or injection molding. Thermosetting polymeric matrix materials can be cured by the inclusion of crosslinkers in the matrix material and/or by the application of heat, for example. Suitable crosslinkers useful to crosslink the polymeric matrix material are discussed above. The temperature and curing time for the thermosetting polymeric matrix material depends upon such factors such as, but not limited to, the type of polymeric matrix material used, other additives in the matrix system and thickness of the composite.

For a thermoplastic matrix material, suitable methods for forming the composite include direct molding or extrusion compounding followed by injection molding. Methods and apparatus for forming the composite by the above methods are discussed in 1. Rubin, *Handbook of Plastic Materials and Technology* (1990) at pages 955–1062, 1179–1215 and 1225–1271, which are specifically incorporated by reference herein.

Additional preferred embodiments of the present invention are directed to reinforced laminates adapted for an electronic support comprising an at least partially coated fabric comprising at least one fiber strand discussed in detail above. Thus, reinforced laminate adapted for an electronic support made from each of the disclosed fabrics comprising at least one fiber strand are therefore contemplated by the present invention. For example, one preferred embodiment of the present invention is directed to a reinforced laminate adapted for an electronic support comprising a matrix material and an at least one partially coated fabric comprising at least one fiber strand, the coating comprising an organic component and lamellar particles having a thermal conductivity of at least 1 Watt per meter K at a temperature of 300 K. In a further embodiment, the coating is compatible with the matrix material in the reinforced laminate adapted for an electronic support.

An additional embodiment of the present invention is directed to a reinforced laminate adapted for an electronic support, the laminate comprising (a) a matrix material, and at least one non-degreased fabric comprising at least one fiber strand, at least a portion of the at least one fabric having a coating which is compatible with the matrix material in said reinforced laminate adapted for said electronic support. Another embodiment of the present invention is directed to a reinforced laminate adapted for an electronic support, the laminate comprising (a) a matrix material, and (b) at least one fabric comprising at least one fiber strand and having a non-finishing resin compatible coating composition on at least a portion of a surface of the fabric.

As used herein, a "non-degreased fabric" is a fabric that has not undergone a conventional fiber process removing non-resin compatible sizing materials from the fabric. As discussed above, heat cleaning and waterjet washing, in addition to scrubbing are examples of such conventional fiber processes. As used herein, a "non-finishing" resin compatible coating composition refers to the resin compatible coating compositions discussed above that are not used in conventional fiber finishing processes. For example, a non-finishing resin compatible coating composition refers to the primary, secondary and/or tertiary coating composition discussed above, but does not refer to typical finishing sizes made, for example, from a silane coupling agent and water, and applied to the fiber after degreasing. The present invention, however, does contemplate a coating comprising a resin compatible coating according to the present invention with a finishing size applied to the coating.

Another preferred embodiment of the present invention is directed to a method of forming a laminate for use in an electronic support application, the method comprising the steps of:

(a) obtaining a fabric adapted to reinforce an electronic support formed by weaving at least one fill yarn comprising a plurality of fibers and having a first resin compatible coating on at least a portion of the at least one fill yarn and at least one warp yarn comprising a plurality of fibers and having a second resin compatible coating on at least a portion of the at least one warp yarn;

(b) at least partially coating at least a portion of the fabric with a matrix material resin;

(c) at least partially curing the at least partially coated fabric to form a prepreg layer; and (d) laminating two or more prepreg layers together to form a laminate adapted for use in the electronic support.

The components of the coatings used in the foregoing embodiments directed to reinforced laminates can be selected from the coating components discussed above, and additional components can also be selected from those recited above.

Additional preferred embodiments of the present invention are directed to prepregs for an electronic support comprising an at least partially coated fabric comprising at least one fiber strand discussed in detail above. Thus, prepregs for an electronic support made from each of the disclosed fabrics comprising at least one fiber strand are therefore contemplated by the present invention.

Another embodiment of the present invention is directed a prepreg for an electronic support, the prepreg comprising (a) a matrix material, and at least one non-degreased fabric comprising at least one fiber strand, at least a portion of the at least one fabric having a coating which is compatible with the matrix material in said prepreg for said electronic support. Yet another embodiment of the present invention is directed to a prepreg for an electronic support, the prepreg comprising (a) a matrix material, and (b) at least one fabric comprising at least one fiber strand and having a non-finishing resin compatible coating composition on at least a portion of a surface of the fabric.

As above, the components of the coatings used in the foregoing embodiments can be selected from the coating components discussed above, and additional components can also be selected from those recited above.

In a particular non-limiting embodiment of the invention shown in FIG. 8, composite or laminate 810 includes fabric 812 impregnated with a compatible matrix material 814. The impregnated fabric can then be squeezed between a set of metering rolls to leave a measured amount of matrix material, and dried to form an electronic support in the form of a semicured substrate or prepreg. An electrically conductive layer 820 can be positioned along a portion of a side 822 of the prepreg in a manner to be discussed below in the specification, and the prepreg is cured to form an electronic support 818 with an electrically conductive layer. In another embodiment of the invention, and more typically in the electronic support industry, two or more prepregs are combined with one or more electrically conductive layers and laminated together and cured in a manner well known to those skilled in the art, to form a multilayered electronic support. For example, but not limiting the present invention, the prepreg stack can be laminated by pressing the stack, e.g. between polished steel plates, at elevated temperatures and pressures for a predetermined length of time to cure the polymeric matrix and form a laminate of a desired thickness. A portion of one or more of the prepregs can be provided with an electrically conductive layer either prior to or after lamination and curing such that the resulting electronic support is a laminate having at least one electrically conductive layer along a portion of an exposed surface (hereinafter referred to as a "clad laminate").

Circuits can then be formed from the electrically conductive layer(s) of the single layer or multilayered electronic support using techniques well known in the art to construct an electronic support in the form of a printed circuit board or printed wiring board (hereinafter collectively referred to as "electronic circuit boards").

Additional preferred embodiments of the present invention are directed to electronic supports and electronic circuit boards comprising an at least partially coated fabric comprising at least one fiber strand discussed in detail above. Thus, electronic supports and electronic circuit boards made from each of the disclosed fabrics comprising at least one fiber strand are therefore contemplated by the present invention.

Another embodiment of the present invention is directed to an electronic support comprising (a) at least one non-degreased fabric comprising at least one fiber strand, at least a portion of the at least one non-degreased fabric having a coating which is compatible with a matrix material; and (b) at least one matrix material on at least a portion of the at least one fabric in the electronic support. An additional embodiment is directed to an electronic support comprising (a) at least one fabric comprising at least one fiber strand and having a non-finishing resin compatible coating composition on at least a portion of a surface of the fabric; and (b) at least one matrix material on at least a portion of the at least one fabric in the electronic support.

Yet another embodiment of the present invention is directed to a method of forming an electronic support, the method comprising the steps of:

(a) obtaining a fabric adapted to reinforce an electronic support formed by weaving at least one fill yarn comprising a plurality of fibers and having a first resin compatible coating an at least a portion of the at least one fill yarn and at least one warp yarn comprising a plurality of fibers and having a second resin compatible coating on at least a portion of the at least one warp yarn;

(b) at least partially coating at least a portion of the fabric with a matrix material resin;

(c) at least partially curing the coating into the at least a portion of the fabric to form a prepreg layer; and (d) laminating one or more prepreg layers together with one or more electrically conductive layers to form the electronic support.

In a further preferred embodiment, the at least one fabric and the at least one matrix form a first composite layer in the electronic support. In another further preferred embodiment, the electronic support further comprises a second composite layer different from the first composite layer.

An additional preferred embodiment is directed to an electronic circuit board comprising (a) an electronic support comprising (i) at least one non-degreased fabric comprising at least one fiber strand, at least a portion of the at least one non-degreased fabric having a coating which is compatible with a matrix material, ad (ii) at least one matrix material on at least a portion of the at least one fabric in the electronic support; and (b) an electronically conductive layer, the support and the conductive layer being contained in the electronic circuit board.

An additional embodiment is directed to an electronic circuit board comprising (a) an electronic support comprising (i) at least one fabric comprising at least one fiber strand and having a non-finishing resin compatible coating composition on at least a portion of a surface of the fabric; and (ii) at least one matrix material on at least a portion of the at least one fabric in the electronic support; and (b) an electronically conductive layer, the support and the conductive layer being contained in the electronic circuit board.

In a further preferred embodiment, the electrically conductive layer is positioned adjacent to a selected portion of the electronic support. In another further preferred embodiment, the at least one fabric and the at least one matrix form a first composite layer. In another embodiment, the electronic support further comprises a second composite layer different from the first composite layer. Preferably, the electrically conductive layer is positioned adjacent to a selected portion of the first and/or second composite layers electronic support.

Another embodiment of the present invention is directed to a method of forming a printed circuit board, the method comprising the steps of;

(a) obtaining an electronic support comprising one or more electrically conductive layers and at least one fabric adapted to reinforce the electronic support formed by weaving at least one fill yarn comprising a plurality of fibers and having a first resin compatible coating on at least a portion of the at least one fill yarn and at least one warp yarn comprising a plurality of glass and having a second resin compatible coating on at least a portion of the at least one warp yarn; and (b) patterning at least one of the one or more electrically conductive layers of the electronic support to form a printed circuit board.

The components of the coatings used in the foregoing embodiments directed to electronic supports and electronic circuit boards can be selected from the coating components discussed above, and additional components can also be selected from those recited above.

Figure 10:
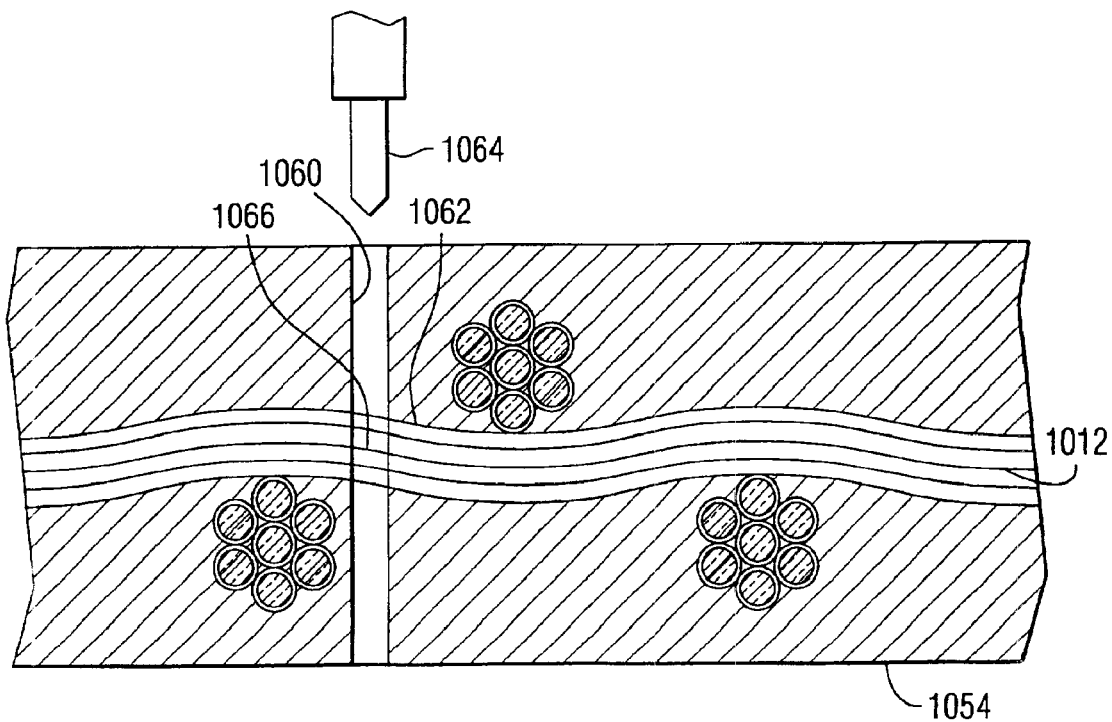
FIG. 10 is a schematic diagram of a method for forming an aperture in a layer of fabric of an electronic support.

If desired, apertures or holes (also referred to as "vias") can be formed in the electronic supports, to allow for electrical interconnection between circuits and/or components on opposing surfaces of the electronic support, by any convenient manner known in the art, including but not limited to mechanical drilling and laser drilling. More specifically, referring to FIG. 10, an aperture 1060 extends through at least one layer 1062 of fabric 1012 of an electronic support 1054 of the present invention. The fabric 1012 comprises coated fiber strands comprising a plurality of glass fibers having a layer that is compatible with a variety of polymeric matrix materials as taught herein. In forming the aperture 1060, electronic support 1054 is positioned in registry with an aperture forming apparatus, such as a drill bit 1064 or laser tip. The aperture 1060 is formed through a portion 1066 of the at least one layer 1062 of fabric 1012 by drilling using the drill 1064 or laser.

In a preferred embodiment, the laminate has a deviation distance after drilling 2000 holes through a stack of 3 laminates at a hole density of 62 holes per square centimeter (400 holes per square inch) and a chip load of 0.001 with a 0.46 mm (0.018 inch) diameter tungsten carbide drill of no greater than 36 micrometers. In an additional embodiment, the laminate has a drill tool % wear after drilling 2000 holes through a stack of 3 laminates at a hole density of 62 holes per square centimeter (400 holes per square inch) and a chip load of 0.001 with a 0.46 mm (0.018 inch) diameter tungsten carbide drill of no greater than 32 percent.

In further embodiment, a fluid stream comprising an inorganic lubricant is dispensed proximate to the aperture forming apparatus such that the inorganic lubricant contacts at least a portion of an interface between the aperture forming apparatus and the electronic support. Preferably, the inorganic lubricant is selected from the inorganic lubricant described in detail above.

Another embodiment of the present invention, is directed to a method for forming an aperture through a layer of fabric of an electronic system support for an electronic circuit board comprising:

(1) positioning an electronic system support comprising a portion of a layer of fabric comprising a coated fiber strand comprising a resin compatible coating composition on at least a portion of a surface of the fabric, in which an aperture is to be formed in registry with an aperture forming apparatus; and (2) forming an aperture in the portion of the layer of fabric.

After formation of the apertures, a layer of electrically conductive material is deposited on the walls of the aperture or the aperture is filled with an electrically conductive material to facilitate the required electrical interconnection between one or more electrically conductive layers (not shown in FIG. 10) on the surface of the electronic support 1054 and/or heat dissipation. The vias can extend partially through or entirely through the electronic support and/or printed circuit board, they can be exposed at one or both surfaces of the electronic support and/or printed circuit board or they can be completed buried or contained within the electronic support and/or circuit board ("buried via").

The electrically conductive layer 820 shown in FIG. 8 can be formed by any method well known to those skilled in the art. For example, but not limiting the present invention, the electrically conductive layer can be formed by laminating a thin sheet or foil of metallic material onto at least a portion of a side of the semi-cured or cured prepreg or laminate. As an alternative, the electrically conductive layer can be formed by depositing a layer of metallic material onto at least a portion of a side of the semi-cured or cured prepreg or laminate using well known techniques including but not limited to electrolytic plating, electroless plating or sputtering. Metallic materials suitable for use as an electrically conductive layer include but are not limited to copper (which is preferred), silver, aluminum, gold, tin, tin-lead alloys, palladium and combinations thereof.

In another non-limiting embodiment of the present invention, the electronic support can be in the form of a multilayered electronic circuit board constructed by laminating together one or more electronic circuit boards (described above) with one or more clad laminates (described above) and/or one or more prepregs (described above). If desired, additional electrically conductive layers can be incorporated into the electronic support, for example along a portion of an exposed side of the multilayered electronic circuit board. Furthermore, if required, additional circuits can be formed from the electrically conductive layers in a manner discussed above. It should be appreciated that depending on the relative positions of the layers of the multilayered electronic circuit board, the board can have both internal and external circuits. Additional apertures are formed, as discussed earlier, partially through or completely through the board to allow electrical interconnection between the layers at selected locations. It should be appreciated that the resulting structure can have some apertures that extend completely through the structure, some apertures that extend only partially through the structure, and some apertures that are completely within the structure.

Preferably, the thickness of the laminate forming the electronic support 254 is greater than 0.051 mm (about 0.002 inches), and more preferably ranges from 0.13 mm (about 0.005 inches) to 2.5 mm (about 0.1 inches). For an eight ply laminate of 7628 style fabric, the thickness is generally 1.32 mm (about 0.052 inches). The number of layers of fabric in a laminate can vary based upon the desired thickness of the laminate.

The resin content of the laminate can preferably range from 35 to 80 weight percent, and more preferably 40 to 75 weight percent. The amount of fabric in the laminate can preferably range from 20 to 65 weight percent and more preferably ranges from 25 to 60 weight percent.

For a laminate formed from woven E-glass fabric and using an FR-4 epoxy resin matrix material having a minimum glass transition temperature of 110° C., the preferred minimum flexural strength in the cross machine or width direction (generally perpendicular to the longitudinal axis of the fabric, i.e., in the fill direction) is greater than. $3 \times 10^7$ kg/m$^2$, more preferably greater than $3.52 \times 10^7$ kg/m$^2$ (about 50 kpsi), and even more preferably greater than $4.9 \times 10^7$ kg/m$^2$ (about 70 kpsi) according to IPC-4101 "Specification for Base Materials for Rigid and Multilayer Printed Boards" at page 29, a publication of The Institute for Interconnecting and Packaging Electronic Circuits (December 1997). IPC-4101 is specifically incorporated by reference herein in its entirety. In the length direction, the desired minimum flexural strength in the length direction (generally parallel to the longitudinal axis of the fabric, i.e., in the warp direction) is preferably greater than $4 \times 10^7$ kg/m$^2$, and more preferably greater than $4.23 \times 10^7$ kg/m$^2$. The flexural strength is measured according to ASTM D-790 and IPC-TM-650 Test Methods Manual of the Institute for Interconnecting and Packaging Electronics (December 1994) (which are specifically incorporated by reference herein) with metal cladding completely removed by etching according to section 3.8.2.4 of IPC-4101. Advantages of the electronic supports of the present invention include high flexural strength (tensile and compressive strength) and high modulus, which can lessen deformation of a circuit board including the laminate.

Electronic supports of the present invention in the form of copper clad FR-4 epoxy laminates preferably have a coefficient of thermal expansion from 50° C. to 288° C. in the z-direction of the laminate ("Z-CTE"), i.e., across the thickness of the laminate, of less than 5.5 percent, and more preferably ranging from 0.01 to 5.0 weight percent, according to IPC Test Method 2.4.41 (which is specifically incorporated by reference herein). Each such laminate preferably contains eight layers of 7628 style fabric, although styles such as, but not limited to, 106, 108, 1080, 2113, 2116 or 7535 style fabrics can alternatively be used. In addition, the laminate can incorporate combinations of these fabric styles. Laminates having low coefficients of thermal expansion are generally less susceptible to expansion and contraction and can minimize board distortion.

The instant invention further contemplates the fabrication of multilayered laminates and electronic circuit boards which include at least one composite layer made according to the teachings herein and at least one composite layer made in a manner different from the composite layer taught herein, e.g. made using conventional glass fiber composite technology. More specifically and as is well known to those skilled in the art, traditionally the filaments in continuous glass fiber strands used in weaving fabric are treated with a starch/oil sizing which includes partially or fully dextrinized starch or amylose, hydrogenated vegetable oil, a cationic wetting agent, emulsifying agent and water, including but not limited to those disclosed in *Loewenstein* at pages 237–244 (3d Ed. 1993), which is specifically incorporated by reference herein. Warp yarns produced from these strands are thereafter treated with a solution prior to weaving to protect the strands against abrasion during the weaving process, e.g. poly(vinyl alcohol) as disclosed in U.S. Pat. No. 4,530,876 at column 3, line 67 through column 4, line 11, which is specifically incorporated by reference herein. This operation is commonly referred to as slashing. The poly(vinyl alcohol) as well as the starch/oil size are generally not compatible with the polymeric matrix material used by composite manufacturers and the fabric is thus cleaned to remove essentially all organic material from the surface of the glass fibers prior to impregnating the woven fabric. This can be accomplished In a variety ways, for example by scrubbing the fabric or, more commonly, by heat treating the fabric in a manner well known in the art. As a result of the cleaning operation, there is no suitable interface between the polymeric matrix material used to impregnate the fabric and the cleaned glass fiber surface, so that a coupling agent must be applied to the glass fiber surface. This operation is sometime referred to by those skilled in the art as finishing. The coupling agents most commonly used in finishing operations are silanes, including but not limited to those disclosed in E. P. Plueddemann, *Silane Coupling Agents* (1982) at pages 146–147, which is specifically incorporated by reference herein. Also see Loewenstein at pages 249–256 (3d Ed. 1993). After treatment with the silane, the fabric is impregnated with a compatible polymeric matrix material, squeezed between a set of metering rolls and dried to form a semicured prepreg as discussed above. It should be appreciated that in the present invention depending on the nature of the sizing, the cleaning operation and/or the matrix resin used in the composite, the slashing and/or finishing steps can be eliminated. One or more prepregs incorporating conventional glass fiber composite technology can then be combined with one or more prepregs incorporating the instant invention to form an electronic support as discussed above, and in particular a multilayered laminate or electronic circuit board. For more information regarding fabrication of electronic circuit boards, see *Electronic Materials Handbook*™, ASM International (1989) at pages 113–115, R. Tummala (Ed.), *Microelectronics Packaging Handbook*, (0.1989) at pages 858–861 and 895–909, M. W. Jawitz, *Printed Circuit Board Handbook* (1997) at pages 9.1–9.42, and C. F. Coombs, Jr. (Ed.), *Printed Circuits Handbook*, (3d Ed. 1988), pages 6.1–6.7, which are specifically incorporated by reference herein.

The composites and laminates forming the electronic supports of the instant invention can be used to form packaging used in the electronics industry, and more particularly first, second and/or third level packaging, such as that disclosed in Tummala at pages 25–43, which is specifically incorporated by reference herein. In addition, the present invention can also be used for other packaging levels.

The present invention, in one non-limiting embodiment, the flexural strength of an unclad laminate, made in accordance with the present invention from 8 layers or plies of prepreg formed from a Style 7628, E-glass fabric and an FR-4 polymeric resin having a $T_g$ of 140° C. and tested according to IPC-TM-650, No. 2.4.4 (which is specifically incorporated by reference herein), is preferably greater than 100,000 pounds per square inch (about 690 megaPascals) when tested parallel to the warp direction of the fabric and preferably greater than 80,000 (about 552 megapascals) when tested parallel to the fill direction of the fabric.

In another non-limiting embodiment of the present invention, the short beam shear strength of an unclad laminate, made in accordance with the present invention from 8 layers or plies of prepreg formed from a Style 7628, E-glass fabric and an FR-4 polymeric resin having a $T_g$ of 140° C. and tested according to ASTM D 2344-84 (which is specifically incorporated by reference herein) using a span length to thickness ratio of 5, is preferably greater than 7400 pounds per square inch (about 51 megaPascals) when tested parallel to the warp direction of the fabric and preferably greater than 5600 pounds per square inch (about 39 megaPascals) when tested parallel to the fill direction of the fabric.

In another non-limiting embodiment of the present invention, the short beam shear strength of an unclad laminate, made in accordance with the present invention from 8 layers or plies of prepreg formed from a Style 7628, E-glass fabric and an FR-4 polymeric resin having a $T_g$ of 140° C. and tested according to ASTM D 2344-84 using a span length to thickness ratio of 5 and after being immersed in boiling water for 24 hours, is preferably greater than 5000 pounds per square inch (about 34 megaPascals) when tested parallel to the warp direction of the fabric and preferably greater than 4200 pounds per square inch (about 30 megapascals) when tested parallel to the fill direction of the fabric.

The present invention also includes a method for reinforcing a matrix material to form a composite. The method comprises: (1) applying to a fiber strand reinforcing material at least one primary, secondary and/or tertiary coating composition discussed in detail above comprising particles which provide interstitial spaces between adjacent fibers of the strand, (2) drying the coating to form a coating upon the reinforcing material; (3) combining the reinforcing material with the matrix material; and (4) at least partially curing the matrix material to provide a reinforced composite. Although not limiting the present invention, the reinforcing material can be combined with the polymeric matrix material, for example by dispersing it in the matrix material. Preferably, the coating or coatings form a substantially uniform coating upon the reinforcing material upon drying. In one non-limiting embodiment of the present invention, the particles comprise at least 20 weight percent of the sizing composition on a total solids basis. In another non-limiting embodiment, the particles have a minimum average particle dimension of at least 3 micrometers, and preferably at least 5 micrometers. In a further non-limiting embodiment, the particles have a Mohs' hardness value that is less than a Mohs' hardness value of any glass fibers that are contained in the fiber strand.

The present invention also includes a method for inhibiting adhesion between adjacent fibers of a fiber strand, comprising the steps of: (1) applying to a fiber strand at least one primary, secondary and/or tertiary coating composition discussed in detail above including particles which provide interstitial spaces between adjacent fibers of the strand; (2) drying the coating to form a coating upon the fibers of the fiber strand, such that adhesion between adjacent fibers of the strand is inhibited. Preferably, the coating or coatings form a substantially uniform coating upon the reinforcing material upon drying. In one non-limiting embodiment of the present invention, the particles comprise at least 20 weight percent of the sizing composition on a total solids basis. In another non-limiting embodiment, the particles have a minimum average particle dimension of at least 3 micrometers, and preferably at least 5 micrometers. In a spherical particle, for example, the minimum average particle dimension will correspond to the diameter of the particle. In a rectangularly shaped particle, for example, the minimum average particle dimension will refer to the average length, width or height of the particle. In a further non-limiting embodiment, the particles have a Mohs' hardness value that is less than a Mohs' hardness value of any glass fibers that are contained in the fiber strand.

The present invention also includes a method for inhibiting hydrolysis of a matrix material of a fiber-reinforced composite. The method comprises: (1) applying to a fiber strand reinforcing material at least one primary, secondary and/or tertiary coating composition discussed in detail above comprising greater than 20 weight percent on a total solids basis of discrete particles; (2) drying the coating to form coating upon the reinforcing material; (3) combining the reinforcing material with the matrix material; and (4) at least partially curing the matrix material to provide a reinforced composite. Preferably, the coating or coatings form a substantially uniform coating upon the reinforcing material upon drying. As discussed above, the reinforcing material can be combined with the matrix material, for example, by dispersing the reinforcing material in the matrix material.

In one, non-limiting embodiment of the present invention, the fabric is preferably woven into a Style 7628 fabric and has an air permeability of less then 10 cubic feet per minute and more preferably less than 5 cubic feet per minute, as measured by ASTM D 737 Standard Test Method for Air Permeability of Textile Fabrics. Although not limiting in the present invention, it is believed that the elongated cross-section and high strand openness of the warp yarns of the present invention (discussed in detail below) reduces the air permeability of the fabrics of the present invention as compared to more conventional fabrics made using slashed warp yarns.

As previously discussed, in conventional weaving operations for electronic support applications, the warp yarns are typically coated with a slashing size prior to weaving to help prevent abrasion of the warp yarns during the weaving process. The slashing size composition is typically applied to the warp yarns by passing the warp yarns through a dip pan or bath containing the slashing size and then through one or more sets of squeeze rolls to remove any excess material. Typical slashing size compositions can include, for example, film forming materials, plasticizers and lubricants. A film-forming material commonly used in slashing size compositions is polyvinyl alcohol. After slashing, the warp yarns are dried and wound onto a loom beam. The number and spacing of the warp yarn ends depends on the style of the fabric to be woven. After drying, the slashed warp yarns will typically have a loss on ignition of greater than 2.0 percent due to the combination of the primary and slashing sizes.

Typically, the slashing sizing, as well as the starch/oil size are generally not compatible with the polymeric resin material used by composite manufacturers when incorporating the fabric as reinforcement for an electronic support so that the fabric must be cleaned to remove essentially all organic material from the surface of the glass fibers prior to impregnating the woven fabric. This can be accomplished in a variety ways, for example by scrubbing the fabric or, more commonly, by heat treating the fabric in a manner well known in the art. As a result of the cleaning operation, there is no suitable interface between the polymeric matrix material used to impregnate the fabric and the cleaned glass fiber surface, so that a coupling agent must be applied to the glass fiber surface. This operation is sometime referred to by those skilled in the art as finishing. Typically, the finishing size provides the fabric with an LOI less than 0.1%.

After treatment with the finishing size, the fabric is impregnated with a compatible polymeric matrix material, squeezed between a set of metering rolls and dried to form a semicured prepreg as discussed above. For more information regarding fabrication of electronic circuit boards, see *Electronic Materials Handbook*™, ASM International (1989) at pages 113–115, R. Tummala (Ed.); *Microelectronics Packaging Handbook*, (1989) at pages 858–861 and 895–909; M. W. Jawitz, *Printed Circuit Board Handbook* (1997) at pages 9.1–9.42; and C. F. Coombs, Jr. (Ed.), *Printed Circuits* Handbook, (3d Ed. 1988), pages 6.1–6.7, which are specifically incorporated by reference herein.

Since the slashing process puts a relatively thick coating on the warp yarns, the yarns become rigid and inflexible as compared to unslashed warp yarns. The slashing size tends to hold the yarn together in a tight bundle having a generally circular cross-section. Although not meant to be limiting in the present invention, it is believed that such a yarn structure (i.e., tight bundles and generally circular cross-sections) can hinder the penetration of polymeric resin materials into the warp yarn bundle during subsequent processing steps, such as pre-impregnation, even after the removal of the slashing size.

Although slashing is not detrimental to the present invention, slashing is not preferred. Therefore, in a preferred embodiment of the present invention, the warp yarns are not subjected to a slashing step prior to weaving and are substantially free of slashing size residue. As used herein, the term substantially free" means that the warp yarns have less than 20 percent by weight, more preferably less than 5 percent by weight of slashing size residue in a more preferred embodiment of the present invention, the warp yarns are not subjected to a slashing step prior to weaving and are essentially free of slashing size residue. As used herein, the term "essentially free" means that the warp yarns have less than 0.5 percent by weight, more preferably less than 0.1 percent by weight and most preferably 0 percent by weight of a residue of a slashing size on the surfaces thereof. However, if the warp yarns are subjected to a secondary coating operation prior to weaving, preferably, the amount of the secondary coating applied to the surface of the warp yarns prior to weaving is less than 0.7 percent by weight of the sized warp yarn.

In one preferred embodiment of the present invention, the loss on ignition of the warp yarns is preferably less than 2.5 percent by weight, more preferably less than 1.5 percent by weight and most preferably less than 0.8 percent during weaving. In addition, the fabric of the present invention preferably has an overall loss on ignition ranging form 0.1 to 1.6 percent, more preferably ranging from 0.4 to 1.3 percent, and even more preferably between 0.6 to 1 percent.

In another, non-limiting embodiment of the present invention, the warp yarn preferably has an elongated cross-section and high strand openness. As used herein, the term "elongated cross-section" means that the warp yarn has a generally flat or ovular cross-sectional shape. High strand openness, discussed above, refers to the characteristic that the individual fibers of the yarn or strand are not tightly held together and open spaces exist between one or more of the individual fibers facilitating penetration of a matrix material into the bundle. Slashed warp yarns (as discussed above) generally have a circular cross-section and low strand openness and thus do not facilitate such penetration. Although not limiting in the present invention, it is believed that good resin penetration into the warp yarn bundles (i.e., good resin wet-out) during lamination can improve the overall hydrolytic stability of laminates and electronic supports made in accordance with the present invention, by reducing or eliminating paths of ingress for moisture into the laminates and electronic supports. This can also have a positive effect in reducing the tendency of printed circuit boards made from such laminates and electronic supports to exhibit electrical short failures due to the formation of conductive anodic filaments when exposed, under bias, to humid conditions.

The degree of strand openness can be measured by an F-index test. In the F-index test, the yarn to be measured is passed over a series of vertically aligned rollers and is positioned adjacent to a horizontally disposed sensing device comprising a light emitting surface and an opposing light sensing surface, such that a vertical axis of the yarn is in generally parallel alignment with the light emitting and light sensing surfaces. The sensing device is mounted at a vertical height that positions it about half-way between the vertically aligned rollers and the horizontal distance between the yarn and the sensing device is controlled by moving the rollers toward or away from the sensing device. As the yarn passes over the rollers (typically at about 30 meters per minute), depending on the openness of the strand, one or more portions of the yarn can eclipse a portion of the light emanating from the emitting surface thereby triggering a response in the light sensing surface. The number of eclipses are then tabulated for a given length of yarn (typically about 10 meters) and the resulting ratio (i.e., number of eclipses per unit length) is considered to be a measure of strand openness.

It is believed that the tight warp yarn structure of fabric woven from conventional, slashed glass fiber yarns as well as the low openness of such yarns as discussed above, results in these conventional fabrics having an air permeability that is higher than the air permeability of the preferred fabrics of the present invention, which preferably include an elongated warp yarn cross-section and higher warp yarn openness. In one, non-limiting embodiment of the present invention, the fabric has an air permeability, as measured by ASTM D 737 Standard Test Method, of no greater than 10 standard cubic feet per minute per square foot (about 0.05 standard cubic meters per minute per square meter), more preferably no greater than 5 cubic feet per minute per square foot (1.52 standard cubic meters per minute per square meter), and most preferably no greater than 3 cubic feet per minute per square foot (0.91 standard cubic meters per minute per square meter). In another embodiment of the invention, the fabric is woven into a 7628 style fabric and has an air permeability, as measured by ASTM D 737 Standard Test Method. of no greater than 10 standard cubic feet per minute per square foot, more preferably no greater than 5 cubic feet per minute per square foot, and most preferably no greater than 3 cubic feet per minute per square foot.

Although not meant to be bound or in any way limited by any particular theory, it is postulated that warp yarns having elongated or flat cross-sections can also lend to improved drilling performance in laminates made from fabrics incorporating the warp yarns. More particularly, since the cross over points between the warp and fill yarns in fabrics having warp yarns with elongated cross-sections will have a lower profile than conventional fabrics incorporating warp yarns having circular cross-sections, a drill bit drilling through the fabric will contact fewer glass fibers during drilling and thereby be subjected to less abrasive wear.

As previously discussed, in one embodiment of the present invention, preferably both the warp yarns and the fill yarns have a resin compatible primary coating composition applied thereto during forming. The resin compatible primary coating composition applied to the warp yarn can be the same as the resin compatible primary coating composition applied to the fill yarn or it can be different from the resin compatible primary coating composition applied to the fill yarn. As used herein, the phrase "different from the resin compatible primary coating composition applied to the fill yarn" in reference to the resin compatible primary coating composition applied to the warp yarn means that at least one component of the primary coating composition applied to the warp yarn is present in an amount different from that component in the primary coating composition applied to the fill yarn or that at least one component present in the primary coating composition applied to the warp yarn is not present in the primary coating composition applied to the fill yarn or that at least one component present in the primary coating composition applied to the fill yarn is not present in the primary coating composition applied to the warp yarn.

In still another, non-limiting embodiment of the present invention, the glass fibers of the yarns of the fabric are E-glass fibers having a density of less than 2.60 grams per cubic centimeter. In still another, non-limiting, preferred embodiment, the E-glass fiber yarns, when woven into a Style 7628 fabric, produce a fabric having a tensile strength parallel to the warp direction that is greater than the strength (in the warp direction) of conventionally heat-cleaned and finished fabrics of the same style. In one non-limiting embodiment of the pre sent invention, preferably the resin compatible primary coating composition is substantially free of "tacky" film-forming materials, i.e., the primary coating composition comprises preferably less than 10 percent by weight on a total solids basis, more preferably less than 5 percent by weight on a total solids basis.

In a preferred embodiment, the resin compatible primary coating composition is essentially free of "tacky" film-forming materials, i.e., the primary coating composition comprises preferably less than 1 percent by weight on a total solids basis, more preferably less than 0.5 percent by weight on a total solids basis, and most preferably less than 0.1 percent by weight on a total solids basis of tacky film-forming materials. Tacky film-forming materials can be detrimental to the weavability of yarns to which they are applied, such as by reducing the air-jet transportability of fill yarns and causing warp yarns to stick to each other. A specific, non-limiting example of a tacky film-forming material is a water-soluble epoxy resin film-forming material.

An alternative method of forming a fabric for use in an electronic support application according to the present invention will now be discussed generally. The method comprises the steps of: (1) obtaining at least one fill yarn comprising a plurality of glass fibers and having a first resin compatible coating applied to at least a portion thereof; (2) obtaining at least one warp yarn comprising a plurality of glass fibers and having a second resin compatible coating applied to at least a portion thereof; and (3) weaving the at least one fill yarn and the at least one warp yarn having a loss on ignition of less than 2.5 percent by weight to form a fabric adapted to reinforce an electronic support.

A method of forming a laminate adapted for use in an electronic support will now be discussed generally. The method comprises a first step of obtaining a fabric formed by weaving at least one fill yarn comprising a plurality of glass fibers and having a first resin compatible coating applied to at least a portion thereof and at least one warp yarn comprising a plurality of glass fibers and having a second resin compatible coating applied to at least a portion thereof wherein the warp yarn had a loss on ignition of less than 2.5 percent by weight during weaving. In one, non-limiting embodiment of the present invention, preferably, the fabric is essentially free of slashing size residue.

As previously discussed, in typical fabric forming operations, the conventional sizing compositions applied to the glass fibers and/or yarns (i.e., primary sizing compositions and slashing size compositions) are not resin compatible and therefore must be removed from the fabric prior to impregnating the fabric with polymeric resin materials. As described above, this is most commonly accomplished by heat cleaning the fabric after weaving. However, heat cleaning degrades the strength of the glass fibers (and therefore the yarns and fabrics formed therefrom) and causes the glass to densify. The resin compatible coatings of the present invention, which are applied to the warp and/or fill yarns prior to weaving, do not require removal prior to impregnation and thereby eliminate the need for heat-cleaning. Therefore, in a preferred, non-limiting embodiment of the present invention, the fabric is free from thermal treatment and thermal degradation prior to impregnation.

Additionally, in conventional fabric forming processes, after removal of the sizing compositions by heat cleaning, a finishing size must be applied to the fabric prior to impregnation to improve the compatibility between the fabric and the polymeric resin. By applying a resin compatible coating to the warp and/or fill yarns prior to weaving in the present invention, the need for fabric finishing is also eliminated. Therefore, in another preferred embodiment of the present invention, the fabric is preferably substantially free of residue from a secondary coating and/or a finishing size, i.e., less than 15 percent by weight, more preferably less than 10 percent by weight of residue from a secondary coating and/or a finishing size. In a more preferred embodiment of the present invention, the fabric is essentially free of residue from a secondary coating and/or a finishing size. As used herein, the term "essentially free" means that the fabric has less than 1 percent by weight, more preferably less than 0.5 percent by weight of residue from a secondary coating and/or a finishing size.

The present invention will now be illustrated by the following specific, non-limiting examples.

EXAMPLE 1

The components in the amounts set forth in Table 1A were mixed to form aqueous forming size compositions A-F according to the present invention in a similar manner to that discussed above. Less than 1 weight percent of acetic acid was included in each composition. Aqueous forming size compositions A–F were coated onto E-glass fiber strands. Each of the forming size compositions had 2.5 weight percent solids. Each coated glass fiber strand was twisted to form a yarn and wound onto bobbins in a similar manner using conventional twisting equipment. Sample $B_{vac}$ was coated with aqueous forming size composition B, but vacuum dried at a temperature of 190° F. for about 46 hours. Samples A–F each had loss on ignition values of less than 1 weight percent. Samples $C_{hi}$ and $D_{hi}$ had loss on ignition values of 1.59 and 1.66 weight percent, respectively.

Sample X1 had 2.5 weight percent solids. Comparative Sample X2 had 4.9 weight percent solids and was air dried for about 8 hours at 25° C. Comparative Sample X3 had 4.6 weight percent solids.

TABLE 1A

| | WEIGHT PERCENT OF COMPONENT ON TOTAL SOLIDS BASIS SAMPLES | | | | | |
|---|---|---|---|---|---|---|
| COMPONENT | A | B | C | D | E | F |
| RD-847A[91] | 28.6 | 29.1 | 31.58 | 50.71 | 0 | 0 |
| DESMOPHEN 2000[98] | 43.7 | 39.1 | 0 | 0 | 0 | 0 |
| EPI-REZ 3522-W-66[99] | 0 | 0 | 21.05 | 0 | 0 | 0 |
| EPON 826[100] | 0 | 0 | 0 | 0 | 16.12 | 63.54 |
| PVP-K30[101] | 0 | 9.7 | 15.79 | 15.21 | 1.31 | 5.18 |
| A-187[102] | 2.3 | 2.3 | 8.42 | 8.11 | 3.17 | 12.51 |
| A-174[103] | 4.7 | 4.8 | 0 | 0 | 0 | 0 |
| A-1100[104] | 0 | 0 | 8.42 | 8.11 | 0 | 0 |
| PLURONIC F-108[105] | 10.7 | 5.6 | 0 | 0 | 0 | 0 |
| IGEPAL CA-630[106] | 0 | 0 | 4.74 | 6.39 | 1.63 | 6.44 |
| VERSAMID 140[107] | 4.8 | 4.8 | 0 | 0 | 0 | 0 |
| ALKAMULS EL-719[108] | 0 | 0 | 0 | 0 | 1.63 | 6.44 |
| KESSCO PEG 600[109] | 0 | 0 | 0 | 0 | 0.79 | 3.11 |
| MACOL NP[110] | 3.6 | 3.6 | 4.74 | 6.39 | 0 | 0 |
| EMERY 6717[111] | 0 | 0 | 0 | 0 | 0.40 | 1.56 |
| EMERY 6760[112] | 0 | 0 | 4.21 | 4.06 | 0 | 0 |
| POLYOX WSR-301[113] | 0.6 | 0 | 0 | 0 | 0 | 0 |
| POLARTHERM PT 160[114] | 1.0 | 1.0 | 0 | 0 | 74.78 | 1.00 |
| RELEASECOAT-CONC 25[115] | 0 | 0 | 1.05 | 1.01 | 0 | 0 |

[97]RD-847A polyester resin which is commercially available from Borden Chemicals of Columbus, Ohio.
[98]DESMOPHEN 2000 polyethylene adipate diol which is commercially available from Bayer Corp. of Pittsburgh, Pennsylvania.
[99]EPI-REZ ® 3522-W-66 which is commercially available from Shell Chemical Co. of Houston, Texas.
[100]EPON 826 which is commercially available from Shell Chemical Co. of Houston, Texas.
[101]PVP K-30 polyvinyl pyrrolidone which is commercially available from ISP Chemicals of Wayne, New Jersey.
[102]A-187 gamma-glycidoxypropyltrimethoxysilane which is commercially available from CK Witco Corporation of Tarrytown, New York.
[103]A-174 gamma-methacryloxypropyltrimethoxysilane which is commercially available from CK Witco Corporation of Tarrytown, New York.
[104]A-1100 amino-functional organo silane coupling agent which is commercially available from CK Witco Corporation of Tarrytown, New York.
[105]PLURONIC ™ F-108 polyoxypropylene-polyoxyethylene copolymer which is commercially available from BASF Corporation of Parsippany, New Jersey.
[106]IGEPAL CA-630 ethoxylated octylphenoxyethanol which is commercially available from GAF Corporation of Wayne, New Jersey.
[107]VERSAMID 140 polyamide which is commercially available from Cognis Corp. of Cincinnati, Ohio.
[108]ALKAMULS EL-719 polyoxyethylated vegetable oil which is commercially available from Rhone-Poulenc.
[109]KESSCO PEG 600 polyethylene glycol monolaurate ester, which is commercially available from Stepan Company of Chicago, Illinois.
[110]MACOL NP-6 nonylphenol surfactant which is commercially available from BASF of Parsippany, New Jersey.
[111]EMERY ® 6717 partially amidated polyethylene imine which is commercially available from Cognis Corp. of Cincinnati, Ohio.
[112]EMERY ® 6760 lubricant which is commercially available from Cognis Corp. of Cincinnati, Ohio.
[113]POLYOX WSR-301 poly(ethylene oxide) which is commercially available from Union Carbide Corp. of Danbury, Connecticut.
[114]POLARTHERM ® PT 160 boron nitride powder particles, which are commercially available from Advanced Ceramics Corporation of Lakewood, Ohio.
[115]ORPAC BORON NITRIDE RELEASECOAT-CONC 25 boron nitride particles in aqueous dispersion which is commercially available from ZYP Coatings, Inc. of Oak Ridge, Tennessee.

Comparative samples of commercial products 631 and 633 D-450 starch-oil coated yarns; 690 and 695 starch-oil coated yarns and 1383 G-75 yarns which are commercially available from PPG Industries, Inc. were also evaluated. In addition, three Comparative Samples X1, X2 and X3, each coated with the same aqueous forming composition X set forth in Table 1B below, were also tested. Comparative

TABLE 1B

| | WEIGHT PERCENT OF COMPONENT ON TOTAL SOLIDS BASIS |
|---|---|
| COMPONENT | SAMPLE X |
| RD-847A[116] | 28.9 |
| DESMOPHEN 2000[117] | 44.1 |
| A-187[118] | 2.3 |
| A-174[119] | 4.8 |
| PLURONIC F-108[120] | 10.9 |
| VERSAMID 140[121] | 4.8 |
| MACOL NP-6[122] | 3.6 |
| POLYOX WSR-301[123] | 0.6 |

[116]RD-847A polyester resin which is commercially available from Borden Chemicals of Columbus, Ohio.
[117]DESMOPHEN 2000 polyethylene adipate diol which is commercially available from Bayer Corp. of Pittsburgh, Pennsylvania.
[118]A-187 gamma-glycidoxypropyltrimethoxysilane which is commercially available from CK Witco Corporation of Tarrytown, New York.
[119]A-174 gamma-methacryloxypropyltrimethoxysilane which is commercially available from CK Witco Corporation of Tarrytown, New York.
[120]PLURONIC ™ F-108 polyoxypropylene-polyoxyethylene copolymer which is commercially available from BASF Corporation of Parsippany, New Jersey.
[121]VERSAMID 140 polyamide which is commercially available from Cognis Corp. of Cincinnati, Ohio.
[122]MACOL NP-6 nonylphenol surfactant which is commercially available from BASF of Parsippany, New Jersey.
[123]POLYOX WSR-301 poly(ethylene oxide) which is commercially available from Union Carbide Corp. of Danbury, Connecticut.

The yarns of Samples A–F and the Comparative Samples were evaluated for loss on ignition (LOI) and air jet compatibility (Air Drag) using the "Air Jet Transport Drag Force" Test Method discussed above in detail.

Each yarn sample was fed at a rate of 274 meters (300 yards) per minute through a Sulzer Ruti needle air jet nozzle unit Model No. 044 455 001 which had an internal air jet chamber having a diameter of 2 millimeters and a nozzle exit tube having a length of 20 centimeters (commercially available from Sulzer Ruti of Spartanburg, North Carolina) at an air pressure of 310 kiloPascals (45 pounds per square inch) gauge. A tensiometer was positioned in contact with the yarn at a position prior to the yarn entering the air jet nozzle. The tensiometer provided measurements of the gram force (drag force) exerted upon each yarn sample by the air jet as th respective yarn sample was pulled into the air jet nozzle. These values are set forth in Table 1C below.

TABLE 1C

| | Yarn Type | LOI (%) | Drag Force (gram$_{force}$) | Air Jet Transport Drag Force (gram$_{force}$ per gram$_{mass}$) |
|---|---|---|---|---|
| Sample No. | | | | |
| A | G-75 | 0.35 | 68.5 | 103,474 |
| B | G-75 | 0.30 | 84.9 | 128,248 |
| B$_{vac}$ | G-75 | 0.35 | 95.0 | 143,587 |
| C | D-450 | 0.52 | 37.33 | 278,582 |
| D | D-450 | 0.40 | 47.1 | 351,493 |
| E | G-75 | 0.35 | 79.3 | 119,789 |
| F | G-75 | 0.35 | 83.2 | 125,680 |
| Comparative Samples | | | | |
| 631* | D-450 | 1.6 | 21.45 | 160,075 |
| 633* | D-450 | 1.3 | 38.1 | 284,328 |

TABLE 1C-continued

| Yarn Type | LOI (%) | Drag Force (gram$_{force}$) | Air Jet Transport Drag Force (gram$_{force}$ per gram$_{mass}$) |
|---|---|---|---|
| 690* | G-75 | 1.0 | 108.23 | 163,489 |
| 695* | G-75 | 1.0 | 100.46 | 151,752 |
| 1383 | G-75 | 0.75 | 14.47 | 21,858 |
| X1 | G-75 | 0.33 | 36.4 | 54,985 |
| X2 | G-75 | 0.75 | 19.0 | 28,701 |
| X3 | D-450 | 1.37 | 12.04 | 89,851 |
| $C_{hI}$ | D-450 | 1.59 | 9.00 | 67,164 |
| $D_{hI}$ | D-450 | 1.66 | 10.43 | 77,836 |

*Coated with starch-oil sizing formulations.

As shown in Table 1C above, each of the yarns A–F coated with polymeric matrix material compatible sizing compositions according to the present invention had Air Jet Transport Drag Values greater than 100,000. Only the starch-oil sized commercial strands, which are generally incompatible with the polymeric matrix materials discussed above, had Air Jet Transport Drag Values greater than 100,000. Sample yarns $C_{hi}$ and $D_{hi}$, which had polymeric matrix compatible coatings, had Air Jet Transport Drag Values less than 100,000 because of high coating levels on the yarns, i.e., loss on ignition greater than 1.5%, which inhibited separation of the fibers, or filamentization, of the yarn by the air jet.

To evaluate laminate strength, 7628 style fabrics (style parameters discussed above) were formed from samples of 695, Sample B and Sample B$_{vac}$ G-75 yarns (discussed above), respectively. Eight plies of each fabric sample were laminated with a FR-4 resin system of EPON 1120-A80 epoxy resin (commercially available from Shell Chemical Company of Houston, Tex.), dicyandiamide, 2-methylimidazole and DOWANOL PM glycol ether (commercially available from The Dow Chemical Co. of Midland, Mich.) to form laminates.

Each laminate was evaluated for flexural strength (maximum failure stress) testing according to ASTM D-790 and IPC-TM-650 Test Methods Manual of the Institute for Interconnecting and Packaging Electronics (December 1994) (which are specifically incorporated by reference herein) with metal cladding completely removed by etching according to section 3.8.2.4 of IPC-4101 and for interlaminar shear strength (short beam shear strength) using a 15.9 millimeter (⅝th inch) span and crosshead speed of 1.27 millimeters (0.05 inches) per minute according to ASTM D-2344, which are specifically incorporated by reference herein. The results of these evaluations are shown in Table 1D below.

TABLE 1D

| Sample | Flexural Strength | | Flexural Modulus | | Short Beam Shear Strength | |
|---|---|---|---|---|---|---|
|  | Pascals | psi | Pascals | Psi | Pascals | psi |
| B | $4.9 \times 10^8$ | 71534 | $2.4 \times 10^{10}$ | 3465000 | $2.6 \times 10^7$ | 3742 |
| B$_{vac}$ | $5.0 \times 10^8$ | 72215 | $2.4 \times 10^{10}$ | 3450600 | $2.5 \times 10^7$ | 3647 |
| 695 | $4.3 \times 10^8$ | 62959 | $2.3 \times 10^{10}$ | 3360800 | $2.3 \times 10^7$ | 3264 |

As shown in Table 1D, Laminate Samples B and B$_{vac}$ prepared according to the present invention had higher flexural strength and modulus values and similar short beam shear strength when compared to laminate samples prepared from 695 starch-oil coated glass fiber yarn.

Samples A and B and Comparative Samples 1383 and X1 were also evaluated for Friction Force by applying a tension of 30 grams to each yarn sample as the sample is pulled at a rate of 274 meters (300 yards) per minute through a pair of conventional tension measurement devices having a stationary chrome post of about 5 centimeters (2 inches) diameter mounted therebetween to displace the yarn 5 centimeters from a straight line path between the tension measurement devices. The difference in force in grams is set forth in Table 1 E below. The Friction Force test is intended to simulate the frictional forces to which the yarn is subjected during weaving operations.

Samples A and B and Comparative Samples 1383 and X1 were also evaluated for broken filaments using an abrasion tester. Two hundred grams of tension were applied to each test sample as each test sample was pulled at a rate of 0.46 meters (18 inches) per minute for five minutes through an abrasion testing apparatus. Two test runs of each sample and comparative sample were evaluated and the average of the number of broken filaments is reported in Table 1 E below. The abrasion tester consisted of two parallel rows of steel reeds, each row being positioned 1 inch apart. Each test yarn sample was threaded between two adjacent reeds of the first row of reeds, then threaded between two adjacent reeds of the second row of reeds, but displaced a distance of one-half inch between the rows of reeds. The reeds were displaced back and forth over a four inch length in a direction parallel to the direction of yarn travel at a rate of 240 cycles per minute.

TABLE 1E

| | Samples | | | |
|---|---|---|---|---|
| | A | B | Comparative Sample No. 1383 | Comparative Sample No. X1 |
| Friction force (grams) | 24.7 | 18.3 | 23.9 | 38.1 |
| Number of broken filaments per yard of yarn | 2.0 | 1.0 | 3.8 | 1.0 |

As shown in Table 1E, Samples A and B, which are coated with sizing compositions containing boron nitride according to the present invention, had few broken filaments and low frictional force when compared to the Comparative Samples.

EXAMPLE 2

Each of the components in the amounts set forth in Table 2A were mixed to form aqueous forming size compositions G and H according to the present invention and a Comparative Sample Y in a similar manner to that discussed above. Less than 1 weight percent of acetic acid on a total weight basis was included in each composition.

Each of the aqueous forming size compositions E and F of Table 1A in Example 1 and G, H and Comparative Sample Y of Table 2A were coated onto G-75 E-glass fiber strands. Each of the forming size compositions had between 6 and 25 weight percent solids.

TABLE 2A

| COMPONENT | WEIGHT PERCENT OF COMPONENT ON TOTAL SOLIDS BASIS SAMPLES | | |
|---|---|---|---|
| | G | H | Comp. Sample Y |
| EPON 826[124] | 16.12 | 63.54 | 60.98 |
| PVP K-30[125] | 1.31 | 5.18 | 4.97 |
| ALKAMULS EL-719[126] | 1.63 | 6.44 | 6.18 |
| IGEPAL CA-630[127] | 1.63 | 6.44 | 6.18 |
| KESSCO PEG 600[128] | 0.79 | 3.11 | 2.98 |
| A-187[129] | 3.17 | 12.51 | 12.00 |
| EMERY 6717[130] | 0.40 | 1.56 | 1.50 |
| PROTOLUBE HD[131] | 0 | 0 | 4.61 |
| POLARTHERM PT 160[132] | 0 | 0 | 0 |
| RELEASECOAT-CONC 25[133] | 74.78 | 1.00 | 0 |

[124]EPON 826 which is commercially available from Shell Chemical of Houston, Texas.
[125]PVP K-30 polyvinyl pyrrolidone which is commercially available from ISP Chemicals of Wayne, New Jersey.
[126]ALKAMULS EL-719 polyoxyethylated vegetable oil which is commercially available from Rhone-Poulenc.
[127]IGEPAL CA-630 ethoxylated octylphenoxyethanol which is commercially available from GAF Corporation of Wayne, New Jersey.
[128]KESSCO PEG 600 polyethylene glycol monolaurate ester, which is commercially available from Stepan Company of Chicago, Illinois.
[129]A-187 gamma-glycidoxypropyltrimethoxysilane which is commercially available from CK Witco Corporation of Tarrytown, New York.
[130]EMERY ® 6717 partially amidated polyethylene imine which is commercially available from Cognis Corporation of Cincinnati, Ohio.
[131]PROTOLUBE HD high density polyethylene emulsion which is commercially available from Sybron Chemicals of Birmingham, New Jersey.
[132]POLARTHERM ® PT 160 boron nitride powder particles, which are commercially available from Advanced Ceramics Corporation of Lakewood, Ohio.
[133]ORPAC BORON NITRIDE RELEASECOAT-CONC 25 boron nitride particles in aqueous dispersion which is commercially available from ZYP Coatings, Inc. of Oak Ridge, Tennessee.

Each coated glass fiber strand was twisted to form yarn and wound onto bobbins in a similar manner using conventional twisting equipment. The yarns of Samples F and H exhibited minimal sizing shedding during twisting and the yarns of Samples E and G exhibited severe sizing shedding during twisting.

The yarns of Samples E–H and Comparative Sample Y were evaluated for Air Drag in a similar manner to Example 1 above, except that the Air Drag values were determined for two bobbin samples at the pressures indicated in Table 2B. Each yarn was evaluated for average number of broken filaments per 1200 meters of yarn at 200 meters per minute using a Shirley Model No. 84 041L broken filament detector, which is commercially available from SDL International Inc. of England. These values represent the average of measurements conducted on four bobbins of each yarn. The broken filament values are reported from sections taken from a full bobbin, 136 grams (3110 pound) and 272 grams (6/10 pound) of yarn unwound from the bobbin.

Each yarn was also evaluated for Gate Tension testing are set forth in Table 2B below. The number of broken filaments measured according to the Gate Tension Method is determined by unwinding a sample of yarn from a bobbin at 200 meters/minute, threading the yarn through a series of 8 parallel ceramic pins and passing the yarn through the Shirley broken filament detector discussed above to count the number of broken filaments.

TABLE 2B

| NUMBER OF BROKEN FILAMENTS PER METER OF YARN | | Sample | | | | |
|---|---|---|---|---|---|---|
| | | E | F | G | H | Comp. Sample Y |
| full bobbin | | 0.887 | 0.241 | greater than 10 | 0.065 | 0.192 |
| 136 grams (3/10 pound) | | 0.856 | 0.017 | greater than 10 | 0.013 | 0.320 |
| 272 grams (6/10 pound) | | 0.676 | 0.030 | greater than 10 | 0.101 | 0.192 |
| GATE TENSION (number of hairs per meter) | | | | | | |
| Gate 2 | | — | 0.039 | — | 0.0235 | 0.721 |
| Gate 3 | | — | 0.025 | — | 0.028 | 0.571 |
| Gate 4 | | — | 0.0125 | — | 0.068 | 0.4795 |
| Gate 5 | | — | 0.015 | — | 0.093 | 0.85 |
| Gate 6 | | — | 0.0265 | — | 0.118 | 0.993 |
| Gate 7 | | — | 0.0695 | — | 0.31 | 1.0835 |
| Gate 8 | | — | 0.117 | — | 0.557 | 1.81 |
| AIR DRAG (grams) | | | | | | |
| 25 psi | Bobbin 1 | — | 10.420 | — | 10.860 | 11.610 |
| | Bobbin 2 | — | 10.600 | — | 7.850 | 11.610 |
| 30 psi | Bobbin 1 | — | 11.690 | — | 12.500 | 13.680 |
| | Bobbin 2 | — | 12.200 | — | 8.540 | 13.850 |
| 35 psi | Bobbin 1 | — | 13.490 | — | 14.030 | 15.880 |
| | Bobbin 2 | — | 13.530 | — | 9.570 | 15.630 |
| 40 psi | Bobbin 1 | — | 14.740 | — | 14.110 | 17.560 |
| | Bobbin 2 | — | 14.860 | — | 11.010 | 17.610 |
| 45 psi | Bobbin 1 | — | 16.180 | — | 16.390 | 19.830 |
| | Bobbin 2 | — | 16.680 | — | 12.700 | 18.950 |
| 50 psi | Bobbin 1 | — | 17.510 | — | 19.280 | 22.410 |
| | Bobbin 2 | — | 17.730 | — | 14.000 | 20.310 |
| 55 psi | Bobbin 1 | — | 19.570 | — | 23.350 | 29.350 |
| | Bobbin 2 | — | 19.660 | — | 20.250 | 26.580 |

While the test results presented in Table 2B appear to indicate that Samples E–H according to the present invention had generally higher abrasion resistance than 5 the Comparative Sample Y, it is believed that these results are not conclusive since it is believed that a polyethylene emulsion component of the Comparative Sample Y, which was not present in Samples E–H, contributed to abrasive properties of the yarn.

EXAMPLE 3

Each of the components in the amounts set forth in Table 3A were mixed to form aqueous forming size compositions K through N according to the present invention. Each aqueous forming size composition was prepared in a similar manner to that discussed above. Less than 1 weight percent of acetic acid on a total weight basis was included in each composition.

Each of the aqueous forming size compositions of Table 3A was coated onto 2G-18 E-glass fiber strands. Each of the forming size compositions had 10 weight percent solids.

TABLE 3A

| COMPONENT | WEIGHT PERCENT OF COMPONENT ON TOTAL SOLIDS BASIS SAMPLES | | | | |
|---|---|---|---|---|---|
| | K | L | M | N | Comparative Sample Z |
| thermoplastic polyurethane film-forming polymer[134] | 34.4 | 34.2 | 33.4 | 31.35 | 34.5 |

TABLE 3A-continued

| COMPONENT | WEIGHT PERCENT OF COMPONENT ON TOTAL SOLIDS BASIS SAMPLES | | | | |
|---|---|---|---|---|---|
| | K | L | M | N | Comparative Sample Z |
| thermoplastic polyurethane film-forming polymer[135] | 51.5 | 51.2 | 50.18 | 46.9 | 51.7 |
| polyoxyalkylene polyol copolymer | 0.3 | 0.3 | 0.3 | 0.3 | 0.33 |
| epoxidized polyester lubricant | 7.2 | 7.1 | 7.0 | 6.55 | 7.22 |
| gamma-aminopropyl triethoxysilane coupling agent | 2.7 | 2.7 | 2.7 | 2.5 | 2.76 |
| gamma-ureidopropyl triethoxysilane coupling agent | 3.3 | 3.3 | 3.2 | 3.0 | 3.34 |
| amino-functional organo silane coupling agent | 0.1 | 0.1 | 0.1 | 0.1 | 0.14 |
| RELEASECOAT-CONC 25[136] | 0.1 | 1.0 | 2.9 | 9.1 | 0 |
| loss on ignition (%) | 1.11 | 1.14 | 1.05 | 1.08 | 1.17 |

[134]Thermoplastic polyester-based polyurethane aqueous emulsion having 65 percent solids, anionic particle charge, particle size of about 2 micrometers, a pH of 7.5 and a viscosity of 400 centipoise (Brookfield LVF) at 25° C.
[135]Thermoplastic polyester-based polyurethane aqueous dispersion having a solids content of 62 percent, pH of about 10 and average particle size ranging from about 0.8 to about 2.5 micrometers.
[136]ORPAC BORON NITRIDE RELEASECOAT-CONC 25 boron nitride particles in aqueous dispersion which is commercially available from ZYP Coatings, Inc. of Oak Ridge, Tennessee.

Composite samples of each of the above coated glass fiber samples and the Comparative Sample Z were extrusion molded at 270° C. for 48 seconds at 7 MPa (975 psi) to produce 254×254×3.175 millimeters (10×10×0.125 inches) plaques. Each specimen was evaluated for: tensile strength, tensile elongation and tensile modulus according to ASTM Method D-638M; flexural strength and flexural modulus according to ASTM Method D-790; and notched and unnotched izod impact strength according to ASTM Method D-256 at the glass contents specified below.

Table 3B presents the results of tests conducted on composites formed using a conventional nylon 6,6 matrix resin.

TABLE 3B

| | units | Samples | | | | |
|---|---|---|---|---|---|---|
| | | K | L | M | N | Comp. Sample Z |
| Tensile Strength | kpsi | 27.1 | 27.6 | 27.3 | 27.4 | 26.2 |
| | MPa | 186.9 | 190.34 | 188.27 | 188.96 | 180.68 |
| Tensile Elongation | % | 3.32 | 3.37 | 3.36 | 3.42 | 3.32 |
| Tensile Modulus | mpsi | 1.48 | 1.55 | 1.47 | 1.44 | 1.51 |
| | GPa | 10.2 | 10.7 | 10.1 | 9.9 | 10.4 |
| Flexural Strength | kpsi | 44.6 | 46.3 | 45.7 | 45.5 | 44.0 |
| | MPa | 307.6 | 319.3 | 315.2 | 313.8 | 303.4 |
| Flexural Modulus | mpsi | 1.52 | 1.56 | 1.54 | 1.54 | 1.5 |
| | GPa | 10.5 | 10.7 | 10.6 | 10.6 | 10.6 |
| notched IZOD Impact | ft lb$_f$/in | 1.86 | 2.24 | 1.94 | 1.63 | 1.16 |
| | kJ/m$^2$ | 7.89 | 9.50 | 8.23 | 6.91 | 4.92 |
| unnotched IZOD Impact | ft lb$_f$/in | 21.8 | 22.9 | 21.1 | 20.5 | 22.0 |
| | kJ/m$^2$ | 92.43 | 97.10 | 89.46 | 86.92 | 93.28 |
| Glass content | % | 32.9 | 32.6 | 32.4 | 32.3 | 32.4 |

As shown in Table 3B, glass fiber strands coated with boron nitride particles (Samples K–N) according to the present invention exhibit improved tensile strength and notched izod impact properties and similar tensile elongation and modulus, flexural strength and modulus and unnotched izod impact properties when compared to a comparative sample having similar components which did not contain boron nitride in nylon 6,6 reinforcement. When evaluated using nylon 6 resin under similar conditions, the improvements in tensile strength and notched Izod impact properties were not observed.

EXAMPLE 4

Each of the components in the amounts set forth in Table 4A were mixed to form aqueous forming size compositions P through S according to the present invention. Each aqueous forming size composition was prepared in a similar manner to that discussed above. Less than 1 weight percent of acetic acid on a total weight basis was included in each composition.

Each of the aqueous forming size compositions of Table 4A was coated onto G-31 E-glass fiber strands. Each of forming size compositions had 10 weight percent solids.

TABLE 4A

| COMPONENT | WEIGHT PERCENT OF COMPONENT ON TOTAL SOLIDS BASIS SAMPLES | | | |
|---|---|---|---|---|
| | P | Q | R | S |
| thermoplastic polyurethane film-forming polymer[137] | 23 | 28.75 | 28.75 | 23 |
| thermoplastic polyurethane film-forming polymer[138] | 34.45 | 43.1 | 43.1 | 34.45 |
| polyoxyalkylene polyol copolymer | 0.22 | 0.27 | 0.27 | 0.22 |
| epoxidized polyester lubricant | 4.8 | 6.0 | 6.0 | 4.8 |
| gamma-aminopropyl triethoxysilane coupling agent | 1.84 | 2.3 | 2.3 | 1.84 |
| gamma-ureidopropyl triethoxysilane coupling agent | 2.22 | 2.78 | 2.78 | 2.22 |
| amino-functional organo silane coupling agent | 0.1 | 0.12 | 0.12 | 0.1 |
| POLARTHERM PT 160[139] | 33.3 | 16.7 | 0 | 0 |
| VANTALC 2003[140] | 0 | 0 | 16.7 | 33.3 |
| loss on ignition (%) | 0.52 | 0.81 | 0.80 | 0.64 |

[137]Thermoplastic polyester-based polyurethane aqueous emulsion having 65 percent solids, anionic particle charge, particle size of about 2 micrometers, a pH of 7.5 and a viscosity of 400 centipoise (Brookfield LVF) at 25° C.
[138]Thermoplastic polyester-based polyurethane aqueaus dispersion having a solids content of 62 percent, pH of about 10 and average particle size ranging from about 0.8 to about 2.5 micrometers.
[139]POLARTHERM ® PT 160 boron nitride powder particles, which are commercially available from Advanced Ceramics Corporatan of Lakewood, Ohio.
[140]VANTALC 2003 talc powder particles, which are commercially available from R. T. Vanderbilt Company, Inc. of Norwalk, Connecticut.

Composite samples of each of the above coated glass fiber samples and the Comparative Sample Z of Table 3A above were extrusion molded to produce 400×400×2.5 millimeters (16×16×0.100 inches) plaques under the conditions set forth in Example 3 above. Each specimen was evaluated for: tensile strength, tensile elongation, tensile modulus, notched and unnotched izod impact strength as discussed in Example 3 above at the glass contents specified below.

The color tests were performed on composites having a thickness of 3.175 millimeters (⅛ inch) and a diameter of 76.2 millimeters (3 inches) using a Hunter calorimeter Model D25-PC2A. To evaluate material handling characteristics, funnel flow tests were conducted on samples of chopped glass fiber. The funnel was eighteen inches long and had a seventeen inch diameter opening at the top and a two inch opening on the bottom. The funnel was vibrated and the time was recorded for 20 pounds of sample material to flow through the funnel. The PD-104 test evaluates the resistance of the chopped glass fiber sample to filamentation. Sixty grams of sample, 140 grams of an abrasive material (ground walnut shell particles No. 6/10 which are commercially available from Hammon Products Company) and a conventional foam type antistatic dryer sheet were enclosed in a 4 liter stainless steel beaker and vibrated using a Red Devil paint shaker Model 5400E3 for six minutes. The vibrated material was screened using No. 5 and No. 6 U.S. Standard testing sieves. The weight percent of fuzz material collected on the screens as a percentage of original sample is reported below.

Table 4B presents the results of tests conducted on composites formed using Samples P—S and Comparative Sample Z using nylon 6,6 matrix resin.

TABLE 4B

|  | units | K | L | M | N | Comp. Sample Z |
|---|---|---|---|---|---|---|
| Tensile Strength | kpsi | 29.5 | 28.6 | 28.7 | 27.7 | 29.6 |
|  | Mpa | 203.5 | 197.2 | 197.9 | 191.0 | 204.1 |
| Tensile Elongation | % | 3.03 | 3.05 | 2.98 | 2.97 | 3.01 |
| Tensile Modulus | kpsi | 1866 | 1779 | 1720 | 1741 | 1748 |
|  | Gpa | 12.86 | 12.26 | 11.86 | 12.0 | 12.05 |
| notched IZOD Impact | ft lb$_f$/in | 2.10 | 1.96 | 1.94 | 1.78 | 2.26 |
|  | kJ/m$^2$ | 8.90 | 8.31 | 8.23 | 7.55 | 9.58 |
| unnotched IZOD Impact | ft lb$_f$/in | 24.9 | 23.4 | 22.8 | 22.2 | 26.4 |
|  | kJ/m$^2$ | 105.58 | 99.22 | 96.67 | 94.13 | 111.94 |
| Actual Loss on Ignition | % | 0.81 | 0.52 | 0.80 | 0.64 | 1.17 |
| PD 104 | % | 1.3 | 0.7 | 0.1 | 1.4 | 0.1 |
| Funnel Flow | seconds | 13.8 | 15.2 | 15.4 | 23.5 | 13.0 |
| Whiteness Index |  | −15.1 | −12.0 | −17.6 | −18.5 | −18.2 |
| Yellowness Index |  | 40.0 | 37.5 | 42.5 | 43.4 | 43.6 |
| Glass content |  | 33.30 | 33 | 32.90 | 31.70 | 33.80 |

As shown in Table 4B, glass fiber strands coated with boron nitride particles (Samples P–S) according to the present invention exhibit improved whiteness and yellowness and similar tensile strength, elongation and modulus, flexural strength and modulus, and notched and unnotched izod impact properties when compared to a Comparative Sample Z having similar components which did not contain boron nitride in nylon 6,6 reinforcement.

EXAMPLE 5

Each of the components in the amounts set forth in Table 5 were mixed to form aqueous forming size compositions T and U according to the present invention. Each aqueous forming size composition was prepared in a similar manner to that discussed above. Less than about 1 weight percent of acetic acid on a total weight basis was included in each composition. Table 5A presents the results of whiteness and yellowness tests conducted on composites formed using Samples T, U and Comparative Sample Z (as discussed in Table 3A of Example 3 and repeated below) using nylon 6,6 matrix resin. The color tests were performed on composites having a thickness of 3.175 millimeters (⅛ inch) and a diameter of 76.2 millimeters (3 inches) using a Hunter calorimeter Model D25-PC2A.

TABLE 5

| | WEIGHT PERCENT OF COMPONENT ON TOTAL SOLIDS BASIS SAMPLES | | |
|---|---|---|---|
| COMPONENT | T | U | Comparative Sample Z |
| thermoplastic polyurethane film-forming polymer[141] | 31.35 | 28.75 | 34.5 |
| thermoplastic polyurethane film-forming polymer[142] | 46.9 | 43.1 | 51.7 |
| polyoxyalkylene polyol copolymer | 0.3 | 0.27 | 0.3 |
| epoxidized polyester lubricant | 6.55 | 6.0 | 7.22 |
| gamma-aminopropyl triethoxysilane coupling agent | 2.5 | 2.3 | 2.76 |
| gamma-ureidopropyl triethoxysilane coupling agent | 3.0 | 2.78 | 3.34 |
| amino-functional organo silane coupling agent | 0.1 | 0.12 | 0.14 |
| RELEASECOAT-CONC 25[143] | 9.1 | 16.7 | 0 |
| Whiteness Index | −16.3 | −15.0 | −20.7 |
| Yellowness Index | 39.3 | 38.1 | 42.7 |

[141]Thermoplastic polyester-based polyurethane aqueous emulsion having 65 percent solids, anionic particle charge, particle size of about 2 micrometers, a pH of 7.5 and a viscosity of 400 centipoise (Brookfield LVF) at 25° C.
[142]Thermoplastic polyester-based polyurethane aqueaus dispersion having a solids content of 62 percent, pH of about 10 and average particle size ranging from about 0.8 to about 2.5 micrometers.
[143]ORPAC BORON NITRIDE RELEASECOAT-CONC 25 boron nitride particles in aqueous dispersion which is commercially available from ZYP Coatings, Inc. of Oak Ridge, Tennessee.

As is shown in Table 5, Samples T and U, each coated with a sizing composition containing boron nitride particles according to the present invention, had lower whiteness indices in nylon 6,6 than a Comparative Sample Z of a similar formulation which did not include boron nitride.

EXAMPLE 6

Five layers of ADFLO-C™ needled chopped glass fiber mat, which is commercially available from PPG Industries, Inc., were stacked to form a mat having a surface weight of 4614 grams per square meter (about 15 ounces per square foot). The thickness of each sample was 25 millimeters (about 1 inch). Four eight-inch square samples of this mat were heated to a temperature of 649° C. (about 1200° F.) to remove essentially all of the sizing components from the samples.

Two uncoated samples were used as comparative samples ("Comparative Samples"). The other two samples ("Sample X") were dipped and saturated in a bath of an aqueous coating composition consisting of 1150 milliliters of ORPAC BORON NITRIDE RELEASECOAT-CONC (25 weight percent boron nitride particles in an aqueous dispersion) and 150 milliliters of a 5 weight percent aqueous solution of A-187 gamma-glycidoxypropyltrimethoxysilane. The total solids of the aqueous coating composition was 18.5 weight percent. The amount of boron nitride particles applied to each mat sample was 120 grams. The coated mat samples were dried in air overnight at a temperature of 25° C. and heated in an oven at 150° C. for three hours.

Each set of samples was evaluated for thermal conductivity and thermal resistance in air at temperatures of 300 K (about 70° F.) according to ASTM Method C-177, which is specifically incorporated by reference herein. The values for thermal conductivity and thermal resistance for each sample are set forth in Table 6 below.

TABLE 6

|  | Sample | |
| --- | --- | --- |
|  | X | Comp. Sample |
| Thickness |  |  |
| (inches) | 1.09 | 1.0 |
| (centimeters) | 2.77 | 2.54 |
| Temperature |  |  |
| (° F.) | 75.62 | 74.14 |
| (° C.) | 24.23 | 23.41 |
| Thermal conductivity |  |  |
| Btu inches per hour square feet ° F. | 0.373 | 0.282 |
| Watts per meter K | 0.054 | 0.041 |
| Thermal r sistanc |  |  |
| Hour square feet ° F. per BTU | 2.92 | 3.55 |
| Meter$^2$ K per Watts | 0.515 | 0.626 |

Referring to Table 6, the thermal conductivity at a temperature 300K of the test sample coated with boron nitride particles according to the present invention was greater than the thermal conductivity of the Comparative Sample which was not 5 coated with boron nitride particles.

EXAMPLE 7

Filament wound cylindrical composites were prepared from samples of G-75 yarn coated with sizing G of Example 2 above and 1062 glass fiber yarn that is commercially available from PPG Industries, Inc. The cylinders were prepared by drawing eight ends of yarn from a yarn supply, coating the yarn with the matrix materials set forth below, and filament winding the yarn into a cylindrical shape using a conventional filament winding apparatus. Each of the cylinders was 12.7 centimeters (5 inches) high, had an internal diameter of 14.6 centimeters (5.75 inches) and a wall thickness of 0.635 centimeters (0.25 inches).

The matrix materials were a mixture of 100 parts EPON 880 epoxy resin (commercially available from Shell Chemical), 80 parts AC-220J methyl tetrahydro phthalic anhydride (commercially available from Anhydrides and Chemicals, Inc. of Newark, N.J.), and 1 part ARALDITE® DY 062 benzyl dimethyl amine accelerator (commercially available from Ciba-Geigy). The filament wound cylinders were cured for two hours at 100° C. and then for three hours at 150° C.

The radial thermal diffusivity (thermal conductivity/(heat capacity×density)) of each test sample in air was determined by exposing one side of the cylinder wall of the sample to a 6.4 kJ flash lamp and sensing the temperature change on the opposite side of the wall using a CCD array infrared camera at a rate of up to 2000 frames per second. Thermal diffusivity values were also determined along a length of the yarn (circumferential) and along a length or height of the cylinder (axial). The test results are set forth below in Table 7.

TABLE 7

|  | Thermal Diffusivity (mm$^2$/sec) | | |
| --- | --- | --- | --- |
|  | radial | axial | circumferential |
| Sample | 0.37 | 0.33 | 0.49 |
| Comparative Sample | 0.38 | 0.38 | 0.57 |

Referring to Table 7, the values of thermal diffusivity for the test sample (which was coated with a small amount of boron nitride) are less than those of the comparative sample, which was not coated with boron nitride. Air voids in the filament wound cylinder and the small sample area tested are factors that may have influenced these results.

EXAMPLE 8

The coefficient of thermal expansion in the z-direction of a laminate ("Z-CTE"), i.e., across the thickness of the laminate, was evaluated for laminate samples, each containing eight layers of 7628 style fabric prepared from samples of $B_{vac}$ coated yarn (discussed in Example 1) and 695 starch-oil coated yarns (discussed in Example 1) (Control). The laminate was prepared using the FR-4 epoxy resin discussed in Example 1 above and clad with copper according to IPC Test Method 2.4.41, which is specifically incorporated by reference herein. The coefficient of thermal expansion in the z-direction was evaluated for each laminate sample at 288° C. according to IPC Test Method 2.4.41. The results of the evaluations are shown in Table 8 below.

TABLE 8

| Sample | Z-CTE (%) |
| --- | --- |
| Sample $B_{vac}1$ | 4.10 |
| Sample $B_{vac}1$ (retest) | 4.41 |
| Sample $B_{vac}2$ | 4.06 |
| Sample $B_{vac}2$ (retest) | 4.28 |
| Sample $B_{vac}3$ | 4.17 |
| Sample $B_{vac}3$ (retest) | 4.26 |
| Control 1 | 5.0 |
| Control 2 | 5.4 |

As shown in Table 8, for laminate Samples A1–A3 according to the present invention, the coefficients of thermal expansion in the z-direction of the laminates are less than those of Control Samples 1 and 2, which were prepared from 695 starch-oil coated yarn.

EXAMPLE 9

Each of the components in the amounts set forth in Table 9A were mixed to form aqueous primary size compositions AA, BB and CC according to the present invention. Each aqueous primary sizing composition was prepared in a similar manner to that discussed above. Less than 1 weight percent of acetic acid on a total weight basis was included in each composition. Each of the aqueous sizing compositions of Table 9A was coated onto fibers forming G-75 E-glass fiber strands.

Each of the coated glass fiber strands was dried, twisted to form yarn, and wound onto bobbins in a similar manner using conventional twisting equipment. The yarns coated with the sizing compositions exhibited minimal sizing shedding during twisting.

TABLE 9A

| COMPONENT | WEIGHT PERCENT OF COMPONENT ON TOTAL SOLIDS BASIS SAMPLES | | |
|---|---|---|---|
| | AA | BB | CC |
| PVP K-30[144] | 14.7 | 14.7 | 13.4 |
| STEPANTEX 653[145] | 30.0 | 29.9 | 27.3 |
| A-187[146] | 1.8 | 1.8 | 1.6 |
| A-174[147] | 3.7 | 3.7 | 3.3 |
| EMERY 6717[148] | 2.4 | 2.4 | 2.2 |
| MACOL OP-10[149] | 1.6 | 1.6 | 1.5 |
| TMAZ-81[150] | 3.3 | 3.3 | 3.0 |
| MAZU DF-136[151] | 0.2 | 0.2 | 0.2 |
| ROPAQUE HP-1055[152] | 0 | 42.4 | 0 |
| ROPAQUE OP-96[153] | 42.3 | 0 | 38.6 |
| RELEASECOAT-CONC 25[154] | 0 | 0 | 6.3 |
| POLARTHERM PT 160[155] | 0 | 0 | 2.6 |

[144]PVP K-30 polyvinyl pyrrolidone which is commercially available from ISP Chemicals of Wayne, New Jersey.
[145]STEPANTEX 653 which commercially available from Stepan Company of Maywood, New Jersey.
[146]A-187 gamma-glycidoxypropyltrimethoxysilane which is commercially available from CK Witco Corporation of Tarrytown, New York.
[147]A-174 gamma-methacryloxypropyltrimethoxysilane which is commercially available from CK Witco Corporation of Tarrytown, New York.
[148]EMERY ® 6717 partially amidated polyethylene imine which is commercially available from Cognis Corporation of Cincinnati, Ohio.
[149]MACOL OP-10 ethoxylated alkylphenol; this material is similar to MACOL OP-10 SP except that OP-10 SP receives a post treatment to remove the catalyst; MACOL OP-10 is no longer commercially available.
[150]TMAZ-81 ethylene oxide derivative of a sorbitol ester which is commercially available from BASF Corp. of Parsippany, New Jersey.
[151]MAZU DF-136 anti-foaming agent which is commercially available from BASF Corp. of Parsippany, New Jersey.
[152]ROPAQUE ® HP-1055, 1.0 micron particle dispersion which is commercially available from Rohm and Haas Company of Philadelphia, Pennsylvania.
[153]ROPAQUE ® OP-96, 0.55 micron particle dispersion which is commercially available from Rohm and Haas Company of Philadelphia, Pennsylvania.
[154]ORPAC BORON NITRIDE RELEASECOAT-CONC 25 boron nitride dispersion which is commercially available from ZYP Coatings, Inc. of Oak Ridge, Tennessee.
[155]POLARTHERM ® PT 160 boron nitride powder which is commercially available from Advanced Ceramics Corporatan of Lakewood, Ohio.

Yarns sized with the each of the sizing compositions (AA, BB and CC) were used as fill yarn in weaving a 7628 style fabric using a Sulzer Ruti Model 5200 air-jet loom. The warp yarn was a twisted G-75 E-glass fiber strand with fiber coated with a different resin compatible sizing composition[156]. The fabrics were subsequently prepregged with an FR-4 epoxy resin having a Tg of 140° C. (designated 4000-2 resin by Nelco International Corporation of Anaheim, Calif.). The sizing compositions were not removed from the fabric prior to prepregging. Laminates were made by stacking 8-plies of the prepregged material between two layers of 1 ounce copper and laminating them together at a temperature of 355° F. (about 179° C.), pressure of 300 pounds per square inch (about 2.1 megapascals) for 150 minutes (total cycle time). The thickness of the laminates without copper ranged from 0.043 inches (about 0.11 centimeters) to 0.050 inches (about 0.13 centimeters).

[156]The warp yarn was PPG Industries, Inc.'s commercially available fiber glass yarn product designated as G-75 glass fiber yarn coated with PPG Industries, Inc.'s 1383 binder.

After forming, the laminates designated AA, BB and CC according to the fiber strands from which they were made) were tested as indicated below in Table 9B. During testing, laminate BB tested at the same time as a first laminate made from glass fiber yarn coated with sizing composition Sample AA (hereinafter designated as Laminate Sample AA1). At a later date, laminate CC was tested at the same time as a second laminate made from glass fiber yarn coated with sizing composition Sample CC (hereinafter designated as Laminate Sample AA2).

TABLE 9B

| Test | Units | Laminate Sample | | | |
|---|---|---|---|---|---|
| | | AA1* | BB* | AA2** | CC** |
| Average Thickness | inches | 0.048 | 0.048 | 0.053–0.055 | 0.053–0.055 |
| Solder Float | seconds | 409 | 386 | 235 | 253 |
| Solder Dip | seconds | 320 | 203 | 243 | 242 |
| Flexural Strength Warp Direction[157] | kpsi | 99 | 102 | 91 | 90 |
| Flexural Strength Weft Direction[158] | kpsi | 86 | 81 | 73 | 72 |

*based on 2 samples
**based on 3 samples
[156]The warp yarn was PPG Industries, Inc.'s commercially available fiber glass yarn product designated as G-75 glass fiber yarn coated with PPG Industries, Inc.'s 1383 binder.
[157]Per IPC-TM-650 "Flexural Strength of Laminates (At Ambient Temperature)", December 1984, Revision B.
[158]Per IPC-TM-650 "Flexural Strength of Laminates (At Ambient Temperature)", December 1984, Revision B.

The solder float test was conducted by floating an 4 inch by 4 inch square (10.16 centimeters by 10.16 centimeters) of the copper dad laminate in a eutectic lead-tin solder bath at 550° F. (about 288° C.) until blistering or delamination was observed. The time until the first blister or delamination was then recorded in seconds.

The solder dip test was conducted by cutting a sample of the laminate, removing the copper from the sample by etching, smoothing the cut edges of the sample by polishing and placing the sample in a pressure cooker at 250° F. (about 121° C.) and 15 pounds per square inch (about 0.1 megaPascals) for 60 minutes. This test is the pressure cooker test referred to in the following table. After the 60 minute exposure, the sample was removed from the pressure cooker, patted dry and dipped into a eutectic lead-tin solder bath at 550° F. (about 288° C.) until blistering or delamination was observed. The time until the first blister or delamination was then recorded in seconds.

The flexural testing was conducted according to the IPC standard indicated.

The laminates M, BB and CC made using fiber strands sized with sizing compositions M, BB and CC respectively, had acceptable properties (shown in Table 9B) for use as electronic supports for printed circuit boards.

The following tests were also performed on samples AA, BB and CC, and are set forth in Table 9C.

TABLE 9C

| Test | Units | Samples | | |
|---|---|---|---|---|
| | | AA | BB | CC |
| Tg by DSC 0/30/60 min | ° C. | 141/140/139 | 140/141/141 | 138/140/139 |
| Pressure Cooker Moisture Uptake | % | 0.37 | 0.37 | 0.38 |
| Water Resistance[159] | % Weight Gain | 0.12 | 0.09 | 0.09 |
| DMF Resistance | % Weight Gain | 0.35 | 0.27 | 0.29 |
| $MeCl_2$ Resistance[160] | % Weight Gain | 0.77 | 0.82 | 0.68 |
| Copper Peel Strength[161] (Warp/Fill) | Pounds | 11.8/11.0 | 12.1/11.1 | 11.2/11.4 |
| Interlaminar Bond Strength[162] | Pounds per inch | 12.8 | 14.2 | 15.4 |

[159]Per IPC-TM-650, No. 2.6.2.1, "Water Absorption, Metal Clad Plasitc Laminates", May 1986, Revision A.
[160]Per IPC-TM-650, No. 2.3.4.3, "Chemical Resistance of Core Materials to Methylene Chloride", May 1986.
[161]Per IPC-TM-650, No. 2.4.8, "Peel Strength: As Received, After Thermal Stress, After Process Chemicals", January 1986, Revision B.
[162]Per IPC-TM-650, No. 2.4.40, "Inner Layer Bond Strength of Multilayer Printed Circuit Boards", October 1987.

EXAMPLE 10

Each of the components in the amounts set forth in Table 10 were mixed to form aqueous size composition Samples DD, EE and FF according to the present invention. Less than 0.5 weight percent of acetic acid on a total weight basis was included in each composition.

TABLE 10

| COMPONENT | WEIGHT PERCENT OF COMPONENT ON TOTAL SOLIDS BASIS SAMPLES | | |
|---|---|---|---|
| | DD | EE | FF |
| PVP K-30[163] | 12.3 | 11.7 | 12.3 |
| STEPANTEX 653[164] | 25.0 | 23.9 | 25.0 |
| TMAZ 81[165] | 3.5 | 3.9 | 2.7 |
| MACOL OP-10[166] | 1.8 | 2.0 | 1.4 |
| POLARTHERM PT 160[167] | 2.4 | 2.3 | 2.4 |
| EMERY 6717[168] | 2.0 | 2.0 | 2.0 |
| A-174[169] | 3.1 | 2.9 | 3.1 |
| A-187[170] | 1.5 | 1.4 | 1.5 |
| RELEASECOAT-CONC 25[171] | 5.7 | 5.5 | 5.6 |
| MAZU DF-136[172] | 0.2 | 0.2 | 0.2 |
| ROPAQUE OP-96[173] | 35.2 | 33.7 | 35.3 |
| FLEXOL LOE[174] | 7.3 | 10.5 | 0 |
| FLEXOL EPO[175] | 0 | 0 | 7.3 |
| Weight percent solids | 3.4 | 3.5 | 3.4 |
| LOI | 0.42 | 0.39 | 0.30 |

[163]PVP K-30 polyvinyl pyrrolidone which is commercially available from ISP Chemicals of Wayne, New Jersey.
[164]STEPANTEX 653 cetyl palmitate which is commercially available from Stepan Company of Chicago, Illinois.
[165]TMAZ 81 ethylene oxide derivative of a sorbitol ester which is commercially available BASF of Parsippany, New Jersey.
[166]MACOL OP-10 ethoxylated alkylphenol; this material is similar to MACOL OP-10 SP except that OP-10 SP receives a post treatment to remove the catalyst; MACOL OP-10 is no longer commercially available.
[167]POLARTHERM ® PT 160 boron nitride powder particles, which are commercially available from Advanced Ceramics Corporation of Lakewood, Ohio.
[168]EMERY ® 6717 partially amidated polyethylene imine which is commercially available from Cognis Corporation of Cincinnati, Ohio.
[169]A-174 gamma-methacryloxypropyltrimethoxysilane which is commercially available from CK Witco Corporation of Tarrytown, New York.
[170]A-187 gamma-glycidoxypropyltrimethoxysilane which is commercially available from CK Witco Corporation of Tarrytown, New York.
[171]ORPAC BORON NITRIDE RELEASECOAT-CONC 25 boron nitride dispersion which is dispersion of about 25 weight percent boron nitride particles in water commercially available from ZYP Coatings, Inc. of Oak Ridge, Tennessee.
[172]MAZU DF-136 anti-foaming agent which is commercially available from BASF Company of Parsippany, New Jersey.
[173]ROPAQUE ® OP-96, 0.55 micron particle dispersion which is commercially available from Rohm and Haas Company of Philadelphia, Pennsylvania.
[174]FLEXOL LOE epoxidized linseed oil commercially available from Union Carbide Corp. of Danbury, Connecticut.
[175]FLEXOL EPO epoxidized soybean oil commercially available from Union Carbide Corp. of Danbury, Connecticut.
[176]The warp yarn was PPG Industries, Inc.'s commercially available fiber glass yarn product designated as G-75 glass fiber yarn coated with PPG Industries, Inc.'s 1383 binder.

Each of the aqueous size compositions of Table 10 was used to coat glass fibers forming G-75 E-glass fiber strands. Each coated glass fiber strand was dried, twisted to form a yarn, and wound onto bobbins in a similar manner using conventional twisting equipment.

The yarn of Sample DD was evaluated by comparing the coated yarn to yarn coated with a sizing composition similar to Sample DD but without the epoxidized linseed oil (hereinafter "Comparative Sample 1"). This comparison included visual inspection of the appearance of a 7628 style fabric woven on an air jet loom. The woven fabric used Sample DD as the fill yarn a twisted G-75 E-glass fiber strand with fiber coated with a different resin compatible sizing composition[176] as the warp yarn. It was observed that fabric woven with yarn coated with Sample DD exhibited less loose fuzz on the fabric as well as less collected fuzz at contact points on the loom, especially at the yarn accumulator, when compared to fabric woven with yarn coated with Comparative Sample 1. No fabric was woven using yarn incorporating fibers coated with Samples EE or FF because of the high initial amount of fuzz observed on the loom. It is believed that this condition was the result of an LOI level lower than required to prevent excess fuzz formation. In the present invention, it is anticipated that an LOI of at least 0.40 for the sizing compositions discussed above is required to reduce fuzz formation during weaving.

[176]The warp yarn was PPG Industries, Inc.'s commercially available fiber glass yarn product designated as G-75 glass fiber yarn coated with PPG Industries, Inc.'s 1383 binder.

EXAMPLE 11

The yarns of Samples AA, BB and CC and a Comparative Sample 2[177] (yarn coated with a starch/oil sizing) were evaluated for several physical properties, such as loss on ignition (LOI), air jet compatibility (Air Drag) and Friction Force. The results are shown in Table 11.

[177] The yarn was PPG Industries, Inc.'s commercially available fiber glass yarn designated as G-75 glass fiber yarn coated with PPG Industries, Inc.'s 695 starch/oil binder.

The loss on ignition (weight percent of solids of the forming size composition divided by the total weight of the glass and dried forming size composition) of each Sample is set forth in Table 11.

Each yarn was evaluated for Air Drag Force or tension by feeding the yarn at a controlled feed rate of 274 meters (300 yards) per minute through a checkline tension meter, which applied a tension to the yarn, and a Ruti two millimeter diameter air nozzle at an air pressure of 138 kPa (20 pounds per square inch).

The Samples and Comparative Sample 2 were also evaluated for Friction Force by applying a tension of 20 grams to each yarn sample as the sample is pulled at a rate of 274 meters (300 yards) per minute through a pair of conventional tension measurement devices having a stationary chrome post of 5 centimeters (about 2 inches) diameter mounted therebetween to displace the yarn 5 centimeters from a straight line path between the tension measurement devices. The difference in force in grams is set forth in Table 11 below. The Friction Force test is intended to simulate the frictional forces to which the yarn is subjected during weaving operations.

During testing, Sample BB and Comparative Sample 2 were tested at the same time as a first quantity of glass fiber yarn coated with sizing composition Sample AA (hereinafter designated as Sample AA3) and Sample CC was tested at the same time as a second quantity of glass fiber yarn coated with sizing composition Sample AA (hereinafter designated as Sample AA4). Samples AA3, AA4 and BB were 2.8 weight percent solids. Sample CC was 3.1 weight percent solid. Comparative Sample 2 was 5.9 weight percent solid.

TABLE 11

|  | Sample | | | | |
| --- | --- | --- | --- | --- | --- |
|  | AA3 | BB | 2 | AA4 | CC |
| LOI (weight percent) | 0.42 | 0.49 | 1.11 | 0.38 | 0.37 |
| Air Drag (grams) | 56.2 | 51.2 | 52.9 | 58.8 | 53.2 |
| Friction force (grams) | 53.6 | 61.5 | 95.1 | 48.8 | 68.9 |

From Table 11, it can be seen that sizing Samples M, BB and CC have an air drag comparable to that of Comparative Sample 2 (starch/oil binder). Furthermore, the lower friction force in Samples AA, BB and CC indicates that the yarn is more easily removed from the loom accumulator during weaving when compared to Comparative Sample 2.

EXAMPLE 12

The yarns of Samples AA, BB and CC and Comparative Sample 2 were evaluated for Air Drag in a similar manner to Example 11 above, except that the Air Drag values were determined for a bobbin sample at the pressures indicated in Table 12.

Each yarn also was evaluated for average number of broken filaments per 1200 meters of yarn at 200 meters per minute using a Shirley Model No. 84 041L broken filament detector, which is commercially available from SDL international Inc. of England (shown in Table 12 as Test 1). The broken filament values are reported from sections taken from a full bobbin, the same bobbin after removing 227 grams (0.5 pounds) and the same bobbin after removing 4540 grams (10 pounds) of yarn. Each yarn was further evaluated for the number of broken filaments at increasing levels of tension and abrasion (shown in Table 12 as Test 2). In Test 2, a sample of yarn was unwound from a bobbin at 200 meters/minute, threaded in a serpentine manner through a series of 8 ceramic pins on a uniform tension control device (sometimes referred to as a gate tensioning device), and passed through the Shirley broken filament detector (discussed above) to count the number of broken filaments. The spacing of the pins on the tensioning device was varied using different dial settings to provide various levels of tension in the yarn. This particular test used a Model UTC-2003 tensioning device commercially available from Steel Heddle Co. of South Carolina. The broken filaments was reported in number of broken filaments per meter of yarn.

The results of these tests for Samples M, BB and CC and Comparative Sample 2 are set forth in Table 12 below. In a manner similar to that discussed above in Example 11, Sample BB and Comparative Sample 2 were tested at the same time as a first quantity of glass fiber yarn coated with sizing composition Sample AA (hereinafter designated as Sample AA5) and at a latter date Sample CC was tested at the same time as a second quantity of glass fiber yarn coated with sizing composition Sample M (hereinafter designated as Sample AA6).

TABLE 12

|  | Sample | | | | |
| --- | --- | --- | --- | --- | --- |
|  | AA5 | BB | 2 | AA6 | CC |
| AIR DRAG (grams) | | | | | |
| 15 psi | 46.10 | 42.50 | 42.23 | 47.47 | 42.33 |
| 20 psi | 56.20 | 51.20 | 52.94 | 58.84 | 53.18 |
| 25 psi | 67.33 | 60.30 | 64.13 | 69.45 | 67.66 |
| 30 psi | 77.34 | 70.84 | 75.74 | 75.29 | 77.63 |
| 35 psi | 89.42 | 89.96 | 85.96 | 83.70 | 82.74 |
| 40 psi | 104.97 | 101.21 | 98.48 | 87.23 | 92.18 |
| 45 psi | 113.41 | 107.74 | 110.34 | 99.91 | 102.91 |
| TEST 1 | | | | | |
| full bobbin | 0.170 | 0.882 | 0.032 | 1.735 | 0.066 |
| 227 grams (0.5 pound) | 0.160 | 0.648 | 0.041 | 0.904 | 0.075 |
| 4540 grams (10 pounds) | 0.098 | 1.348 | 0.008 | 0.518 | 0.022 |
| TEST 2 | | | | | |
| Setting 2 | 0.683 | 5.017 | 0.119 | 0.372 | 0.011 |
| Setting 3 | 0.753 | 4.772 | 0.083 | 0.450 | 0.017 |
| Setting 4 | 0.713 | 3.753 | 0.147 | 0.367 | 0.017 |
| Setting 5 | 1.267 | 4.025 | 0.150 | 0.811 | 0.061 |
| Setting 6 | 1.608 | 8.383 | 0.322 | 0.286 | 0.044 |
| Setting 7 | 4.128 | 6.517 | 0.611 | 0.403 | 0.058 |
| Setting 8 | 4.472 | 14.800 | 0.978 | 0.408 | 0.128 |

As can be seen in Table 5, sizing Samples M, BB and CC have an air drag comparable to that of Comparative Sample 2 (starch/oil binder).

EXAMPLE 13

Electrical grade laminates made from prepregs incorporating fabrics with yarns having different sizing compositions were tested to evaluate their drilling properties, and more specifically (i) the drill tip wear of drills used to drill holes through the laminates and (ii) the locational accuracy of the holes drilled through the laminates. Control GG and Sample HH were laminates incorporating a 7628 style fabric as discussed earlier. The fabric in Control GG was a heat cleaned and silane finished fabric commercially available from Clark Schwebel and identified as 7628-718. The fabric in Sample HH was woven from fill yarn comprising glass fibers coated with a resin compatible sizing as taught herein and shown in Table 13A. It is believed that the fabric also included Sample HH as the warp yarn. However, it is possible that the warp yarn could have been PPG Industries, Inc.'s 1383 commercially available fiber glass yarn product. The glass fibers woven into Sample HH had a loss on ignition of 0.35 percent.

TABLE 13A

Weight Percent of Components on Total Solids Basis for Sizing used in Sample HH

| COMPONENT | SAMPLE HH |
|---|---|
| RD-847A[178] | 27.0 |
| DESMOPHEN 2000[179] | 36.2 |
| PVP K-30[180] | 9.0 |
| A-187[181] | 2.1 |
| A-174[182] | 4.4 |
| PLURONIC F-108[183] | 9.0 |
| VERSAMID 140[184] | 4.4 |
| MACOL NP-6[185] | 5.4 |
| POLARTHERM PT 160[186] | 0.9 |
| RELEASECOAT-CONC 25[187] | 1.5 |
| acetic acid | <0.1 |

[178]RD-847A polyester resin, which is commercially available from Borden Chemicals of Columbus, Ohio.
[179]DESMOPHEN 2000 polyethylene adipate diol, which is commercially available from Bayer Corp. of Pittsburgh, Pennsylvania.
[180]PVP K-30 polyvinyl pyrrolidone, which is commercially available from ISP Chemicals of Wayne, New Jersey.
[181]A-187 gamma-glycidoxypropyltrimethoxysilane, which is commercially available from CK Witco Corporation of Tarrytown, New York.
[182]A-174 gamma-methacryloxypropyltrimethoxysilane, which is commercially available from CK Witco Corporation of Tarrytown, New York.
[183]PLURONIC ™ F-108 polyoxypropylene-polyoxyethylene copolymer, which is commercially available from BASF Corporation of Parsippany, New Jersey.
[184]VERSAMID 140 polyamide, which is commercially available Cognis Corp. of Cincinnati, Ohio.
[185]MACOL NP-6 nonyl phenol surfactant, which is commercially available from BASF Corporation of Parsippany, New Jersey.
[186]POLARTHERM ® PT 160 boron nitride powder particles, which are commercially available from Advanced Ceramics Corporation of Lakewood, Ohio.
[187]ORPAC BORON NITRIDE RELEASECOAT-CONC 25, which is commercially available from ZYP Coatings, Inc. of Oak Ridge, Tennessee.

Prepregs were prepared by a hand lay-up procedure that involved applying standard FR-4 epoxy-resin (EPON 1120-A80 resin available from Shell Chemical Co.) to the fabrics using a paintbrush. The resin saturated fabric was immediately "dried" and B-staged in a vented hot air oven for 3 to 3.25 minutes at 163° C. (about 325° F.) until the desired gel time of 124 seconds at 171° C. (about 340° F.) was reached. The prepregs were trimmed to 46 cm by 46 cm (18 inch by 18 inch) sections and weighed to determine resin content. Only prepregs with resin contents of 44 percent±2 percent were used in the subsequent laminating procedure.

Prepregs were stacked 8 high and molded in a Wabash Press for 70 minutes at 177° C. (350° F.) and at 345 newtons/cm² (500 psi). All the laminates were molded without copper foil layers. The laminates showed various levels of air entrapment. It is believed that the lack of vacuum assist and temperature ramping during lamination contributed to this condition.

Tool Wear Analysis

The first series of tests were conducted to evaluate the wear of the drill tip. The tip wear was expressed in terms of "drill tip percent wear" which was calculated using the formula:

$$\text{drill tip percent wear} = 100 \times (P_i - P_f)/P_i$$

where
$P_i$=initial width of the primary cutting edge
$P_f$=width of the primary cutting edge after the allotted holes were drilled.

Figure 11:
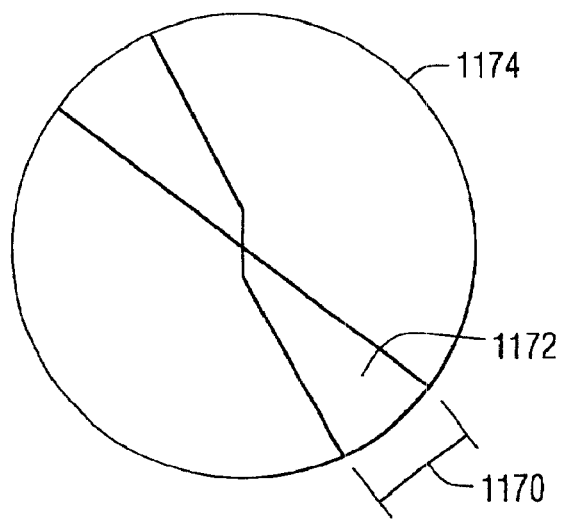
FIG. 11 is an end view of a drill illustrating the primary cutting edge.

Referring to FIG. 11, the width 1170 of the primary cutting edge 1172 of the drill 1174 was measured at the peripheral edge of the drill tip.

The drilling was conducted using a single head drilling machine. The drilling was performed on 3-high stacks of laminates (discussed above) with a 0.203 mm (0.008 inch) thick aluminum entry and 1.88 mm (0.074 inch) thick paper core phenylic coated back-up. Drilling 3 laminates at one time is generally standard practice in the industry. The drill tip percent wear was determined for two drill diameters: 0.35 mm (0.0138 inches) and 0.46 mm (0.018 inches). Both drills were a series 508 tungsten carbide drill available from Tulon Co., Gardenia, Calif. The chip load during drilling was held constant at 0.001 for each tool. As used herein, "chip load" means the ratio of the drill insertion rate measured in inches per minute to the spindle speed measured in revolutions per minute (rpm). For the 0.35 mm drill, the spindle speed was 100,000 rpm and the insertion rate was 100 inches (254 cm) per minutes. For the 0.46 mm drill, the spindle speed was 80,000 rpms and the insertion rate was 80 inches (203 cm) per minute. A retraction rate of 2.54 m (1000 inches) per minute and a 1.65 mm (0.065 inch) upper drill head limit was held constant for both tool diameters. As used herein, "drill head limit" means the distance that the drill tip was withdrawn above the upper surface of the laminate.

Figure 12:
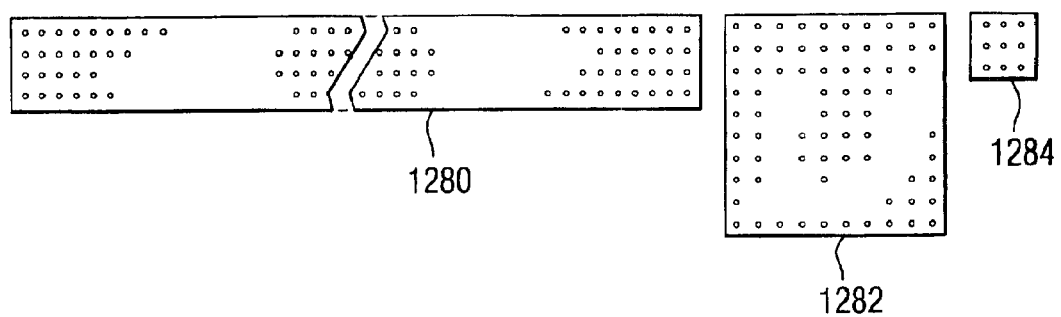
FIG. 12 is a schematic of a drill hole pattern.

The drill tip percent wear was determined based on a 500 hole drilling pattern shown in FIG. 12 which included 391 holes drilled in a 0.635 cm by 10.16 cm (0.25 inch by 4 inch) block (section 1280), followed by 100 holes in a 10 by 10 hole pattern (section 1282), followed by 9 holes in a 3 by 3 hole pattern (section 1284). The holes in each section were drilled at a hole density of 62 holes per square centimeter (400 hole per square inch). The pattern was repeated three additional times for a total of 2000 holes. The drilling for Tests 1 and 2 was done using a Uniline 2000 single head drilling machine and the drilling for Test 3 was done using a CNC-7 single head drilling machine. Both machines are available from Esterline Technologies, Bellevue, Washington.

Table 13B shows the drill tip percent wear of the drill for Control GG and Sample HH for the 0.35 and 0.46 mm diameter drills after drilling 2000 holes in the pattern discussed above. Each test was started with a new drill bit.

TABLE 13B

|  |  | Control GG | Sample HH |
|---|---|---|---|
| Test 1 | Number of tools | 3 | 3 |
| 0.35 mm dia. drill | Average drill tip percent wear | 28.8 | 22.2 |
| Test 2 | Number of tools | 20 | 20 |
| 0.46 mm dia. drill | Average drill tip percent wear | 34.0 | 24.4 |
| Test 3 | Number of tools | 10 | 10 |
| 0.46 mm dia. drill | Average drill tip percent wear | 30.8 | 29.3 |

As can be seen in Table 13B, Sample HH in Tests 1 and 2, which includes glass fiber filaments coated with a sizing as taught herein that is compatible with laminate matrix resins, exhibited significantly less drill tip percent wear after 2000 holes than Control GG, which includes glass fiber filaments that had to be heat cleaned prior to being coated with a silane containing finishing sizing. Test 3 showed only a marginal improvement in drill tip percent wear but it is believed that this is due to the fact that the CNC-7 drilling machine used in this test was older and afforded less control during the drilling test than the Uniline 2000 drilling machine used for Tests 1 and 2.

Locational Accuracy

A common metric used to assess the drilling performance of a laminate is hole locational accuracy. This test measures the deviation in the distance of the actual hole location from its intended location. The measurement was taken on lower surface of the bottom laminate of a 3 laminate stack where the drill exited the laminate stack, since it is expected that this hole location would have the largest discrepancy from the intended or "true" hole location. This difference was assessed in terms of the "deviation distance", i.e., the distance from the actual true center of the drilled hole on the surface of the laminate to the intended true center of the hole. The deviation distance was measured after the 500 hole sequence discussed above was repeated 4 times, i.e., after each tool drilled a total of 2000 holes. The deviation distance was measured for the last drilled 100 hole pattern, i.e., the last drilled section 582. The holes were drilled using a 0.46 mm (0.018 inch) diameter series 508 drill from Tulon Co. of the type discussed above. As was used in the tool wear test, the spindle speed for the drill was 80,000 rpms and the insertion rate was 80 inches per minute for a chip load of 0.001. The test was repeated eight times for each Control GG and Sample HH with each test starting with a new drill.

Table 13C shows the result of the locational accuracy test for Control GG and Sample HH after drilling 2000 holes.

TABLE 13C

|  | Control GG | Sample HH |
|---|---|---|
| number of drills | 8 | 8 |
| average deviation distance (micrometer) | 38 | 28 |

As can be seen, Sample HH exhibited a lower deviation distance than Control GG, which is of particular significance when the laminate is used as an electronic support incorporating a large number of holes and circuits. This is consistent with the drill tip percent wear data shown in Table 13B above. More specifically, it would be expected that laminates that exhibit less drill tip percent wear would also exhibit less deviation distance because the drill tips would be sharper for a longer number of drillings.

EXAMPLE 14

In Example 14, additional drill tool percent wear tests were conducted. Electrical grade laminates Control JJ and Samples AA, BB and KK incorporating a 7628 style fabric as discussed earlier were tested for drill tool percent wear. The fabric in Control JJ was 7628-718 fabric from Clark-Schwebel, Inc. The fabrics in Samples AA, BB and KK were woven from fill yarn comprising glass fibers coated with a resin compatible sizing as taught in Table 9A of Example 9 and Table 14A below, respectively, and warp yarn having glass fibers coated with a different polymeric matrix material compatible coating compositions[188].

[188] The warp yarn was PPG Industries, Inc.'s commercially available fiber glass yarn product designated as G-75 glass fiber yarn coated with PPG Industries, Inc.'s 1383 binder.

TABLE 14A

Weight Percent of Components on Total Solids Basis for Sizing used in Sample KK

| COMPONENT | WEIGHT PERCENT OF COMPONENT ON TOTAL SOLIDS BASIS SAMPLE KK |
|---|---|
| PVP K-30[189] | 13.4 |
| A-187[190] | 1.9 |
| A-174[191] | 3.8 |
| EMERY 6717[192] | 1.9 |
| SAG 10[193] | 0.2 |
| RELEASECOAT-CONC 25[194] | 3.8 |
| POLARTHERM PT[195] | 5.9 |
| RD-847A[196] | 23.0 |
| DESMOPHEN 2000[197] | 31.0 |
| PLURONIC F-108[198] | 8.4 |
| ALKAMULS EL-719[199] | 2.5 |
| ICONOL NP-6[200] | 4.2 |
| LOI (%) | 0.35 |

[189] PVP K-30 polyvinyl pyrrolidone, which is commercially available from ISP Chemicals of Wayne, New Jersey.
[190] A-187 gamma-glycidoxypropyltrimethoxysilane, which is commercially available from CK Witco Corporation of Tarrytown, New York.
[191] A-174 gamma-methacryloxypropyltrimethoxysilane, which is commercially available from CK Witco Corporation of Tarrytown, New York.
[192] EMERY ® 6717 partially amidated polyethylene imine which is commercially available from Cognis Corporation of Cincinnati, Ohio.
[193] SAG 10 anti-foaming material, which is commercially available from CK Witco Corporation of Greenwich, Connecticut.
[194] ORPAC BORON NITRIDE RELEASECOAT-CONC 25 boron nitride dispersion which is commercially available from ZYP Coatings, Inc. of Oak Ridge, Tennessee.
[195] POLARTHERM ® PT 160 boron nitride powder which is commercially available from Advanced Ceramics Corporation of Lakewood, Ohio.
[196] RD-847A polyester resin, which is commercially available from Borden Chemicals of Columbus, Ohio.
[197] DESMOPHEN 2000 polyethylene adipate diol which is commercially available from Bayer Corp. of Pittsburgh, Pennsylvania.
[198] PLURONIC ™ F-108 polyoxypropylene-polyoxyethylene copolymer which is commercially available from BASF Corporation of Parsippany, New Jersey.
[199] ALKAMULS EL-719 polyoxyethylated vegetable oil which is commercially available from Rhone-Poulenc.
[200] ICONOL NP-6 alkoxylated nonyl phenol which is commercially available from BASF Corporation of Parsippany, New Jersey.

The fabrics were subsequently formed into prepregs with an FR-4 epoxy resin having a Tg of 140° C. (designated 4000-2 resin by Nelco International Corporation of Anaheim, Calif.). The sizing compositions were not removed from the fabric prior to prepregging. Laminates were made by stacking 8-plies of the prepreg material and four layers of 1 ounce copper (as shown below) and laminating them together at a temperature of 355° F. (about 179° C.), pressure of 300 pounds per square inch (about 2.1 megaPascals) for 150 minutes (total cycle time). The thickness of the laminates with copper ranged from 0.052 inches (about 0.132 cm) to 0.065 inches (about 0.165 cm). In forming the laminates, eight prepregs were stacked with copper layers in the following arrangement:

one 1 oz/ft² shiny copper layer three prepreg layers
one 1 oz/ft² RTF (reverse treated foil) copper layer two prepreg layers
one 1 oz/ft² RTF copper layer three prepreg layers
one 1 oz/ft² shiny copper layer The finished laminates were trimmed to 40.6 cm by 50.8 cm (16 inches by 20 inches).

The drilling was conducted using a Uniline 2000 single head drilling machine.

The drilling was performed on 3-high stacks of laminates (discussed above) with a 0.010 inch (0.254 mm) thick aluminum entry and 0.1 inch (2.54 mm) thick aluminum clad particle board back-up. The drill tool percent wear was determined for a 0.34 mm (0.0135 inches) tool diameters, series 80 tungsten carbide drill available from Tulon Co., Gardenia, Calif. The chip load during drilling was held constant at 0.001, with a spindle speed of 95,000 rpm and insertion rate of 95 inches (241 cm) per minutes. The drill retraction rate was 90 inches (2.29 m) per minute and the upper drill head limit was 0.059 inches (1.5 mm) upper drill head limit.

The drill tip percent wear was examined based on a 1500 and 2500 hole drilling pattern. The holes in each section were drilled at a hole density of 28 holes per square centimeter (about 178 hole per square inch).

Table 14B shows the drill tip percent wear of the Control JJ and Samples AA, BB and KK after drilling 1500 and 2500 holes. Each set of holes was started with a new drill bit and each stack of laminates had ten 1500 hole groupings and ten 2500 hole groupings. Three stacks of laminates of each fabric type were drilled so that the drill tip percent wear for 30 drills were measured for each sample.

TABLE 14B

| | Drill Tip Percent Wear | | | |
|---|---|---|---|---|
| | Sample AA | Sample BB | Sample KK | Control JJ |
| 1500 holes | 21.5 | 19.5 | 19.8 | 24.9 |
| 2500 holes | 28.0 | 24.3 | 25.3 | 28.3 |

As can be seen in Table 14B, Samples AA, BB and KK, which includes glass fiber filaments coated with a sizing as taught herein that is compatible with laminate matrix resins, exhibited significantly less percent wear after 1500 holes than Control JJ, which includes glass fiber filaments that had to be heat cleaned prior to being coated with a silane containing finishing sizing. After 2500 holes, the amount of drill tool percent wear for Samples AA, BB and KK is still less than for Control JJ but less pronounced. This is to be expected since the majority of the tool wear will occur during the earlier drilled holes rather than the last holes drilled in a grouping.

Based on the above, although not limiting in the present invention, it is preferred that prepregs made with glass fiber fabric coated with a polymeric matrix compatible sizing as taught herein have a drilling tip percent wear of no greater than 32 percent, more preferably no greater than 30 percent, and most preferably no greater than 25 percent, as determined after drilling 2000 holes through a stack of 3 laminates, each laminate including eight prepregs, at a hole density of 400 holes per square inch and a chip load of 0.001 with a 0.46 mm (about 0.018 inch) diameter tungsten carbide drill.

In addition, based in the above, although not limiting in the present invention, it is preferred that prepregs made with glass fiber fabric coated with a polymeric matrix compatible sizing as taught herein have a deviation distance of no greater than 36 micrometers, more preferably not greater than 33 micrometers, and most preferably not greater than 31 micrometers, as determined after drilling 2000 holes through a stack of 3 laminates, each laminate including eight prepregs, at a hole density of 400 holes per square inch and a chip load of 0.001 with a 0.46 mm (about 0.018 inch) diameter tungsten carbide drill.

Although not meaning to be bound by any particular theory, it is believed that the presence of a solid lubricant in the glass fiber coating composition disclosed herein, and in one particular embodiment, the presence of the boron nitride, contributes to the improved drilling properties of the laminates of the present invention. More particularly, the solid lubricant contributes to the reduction in drill wear and improvement in locational accuracy of the drilled holes.

Improved drilling properties in laminate made with glass fibers coated with a resin compatible sizing as taught herein provides several advantages. First, longer drill life means that each drill bit can drill more holes before resharpening or disposal. In addition, because the locational accuracy of the holes drilled through the laminates of the present invention is greater than that for conventional laminates, it is expected that more than three laminates can be stacked for drilling at a single time with the same accuracy as that achieved in a 3 laminate stack of conventional laminates. Both of these advantages result is a more cost effective drilling operation. Furthermore, the locational accuracy of the holes drilled in the laminates is improved so that the quality of the electronic support incorporating the laminate in improved.

EXAMPLE 15

The following samples in Table 15 represent additional embodiments of the invention. Coating sample LL was produced but not tested. Coating samples MM-QQ have not been produced.

TABLE 15

| | WEIGHT PERCENT OF COMPONENT ON TOTAL SOLIDS BASIS SAMPLES | | | | | |
|---|---|---|---|---|---|---|
| COMPONENTS | LL | MM | NN | OO | PP | QQ |
| POLYOX WSR 301[201] | 0.56 | 0.55 | 0.61 | 0.43 | 0.47 | 0.34 |
| A-174[202] | 3.68 | 4.31 | 4.74 | 3.32 | 3.68 | 2.61 |
| A-187[203] | 1.74 | 2.08 | 2.29 | 1.60 | 1.78 | 1.26 |
| DYNAKOLL Si 100[204] | 26.60 | 26.58 | — | 20.46 | — | 16.08 |
| SERMUL EN 668[205] | 3.33 | — | — | — | — | — |
| DESMOPHEN 2000[206] | 40.58 | 39.93 | 43.92 | 30.75 | 34.14 | 24.15 |
| SYNPERONIC F-108[207] | 9.98 | — | — | — | — | — |
| POLARTHERM PT 160[208] | 5.46 | 5.45 | — | — | 6.00 | 6.00 |
| EUREDUR 140[209] | 4.43 | — | — | — | — | — |
| PLURONIC F-108[210] | — | 9.83 | 10.81 | 7.56 | 8.40 | 5.94 |
| MACOL NP-6[211] | — | 3.28 | 3.60 | 2.52 | 2.80 | 1.98 |
| VERSAMID 140[212] | — | 4.36 | 4.80 | 3.36 | 3.73 | 2.64 |
| RELEASECOAT-CONC 25[213] | 3.64 | 3.63 | — | — | 4.00 | 4.00 |

TABLE 15-continued

| | WEIGHT PERCENT OF COMPONENT ON TOTAL SOLIDS BASIS SAMPLES | | | | | |
|---|---|---|---|---|---|---|
| COMPONENTS | LL | MM | NN | OO | PP | QQ |
| ROPAQUE OP-96[214] | — | — | 29.23 | 30.00 | 35.00 | 35.00 |
| est. % solids in coating | 5.4 | 5.6 | 5.1 | 7.3 | 6.5 | 9.3 |

[201]POLYOX WSR 301 poly(ethylene oxide) which is commercially available from Union Carbide Corp. of Danbury, Connecticut.
[202]A-174 gamma-methacryloxypropyltrimethoxysilane which is commercially available from CK Witco Corp. of Tarrytown, New York.
[203]A-187 gamma-glycidoxy-propyltrimethoxysilane which is commercially available from CK Witco Corp. of Tarrytown, New York.
[204]DYNAKOLL Si 100 rosin which is commercially available from Eka Chemicals AB, Sweden.
[205]SERMUL EN 668 ethoxylated nonylphenol which is commercially available from CON BEA, Benelux.
[206]DESMOPHEN 2000 polyester polyol which is commercially available from Bayer. Corp. of Pittsburgh, Pennsylvania.
[207]SYNPERONIC F-108 polyoxypropylene-polyoxyethylene copolymer; it is the European counterpart to PLURONIC F-108.
[208]POLARTHERM PT 160 boron nitride powder which is commercially available from Advanced Ceramics Corporation of Lakewood, Ohio.
[209]EUREDUR 140 is a polyamide resin, which is commercially available from Ciba Geigy, Belgium.
[210]PLURONIC F-108 polyoxypropylene-polyoxyethylene copolymer which is commercially available from BASF Corporation of Parsippany, New Jersey.
[211]MACOL NP-6 nonylphenol surfactant which is commercially available from BASF of Parsippany, New Jersey.
[212]VERSAMID 140 polyamide resin which is commercially available from Cognis Corp. of Cincinnati, Ohio.
[213]ORPAC BORON NITRIDE RELEASECOAT-CONC 25 boron nitride dispersion which is commercially available from ZYP Coatings, Inc. of Oak Ridge, Tennessee.
[214]ROPAQUE OP-96, 0.55 micron particle dispersion which is commercially available from Rohm and Haas Company of Philadelphia, Pennsylvania.

EXAMPLE 16

Unclad laminates were made from the materials and by the processes as described in Example 9, except that no copper was used during lamination. Each of the unclad laminates were then cut into 52, 1 inch×½ inch (about 2.54 centimeter×about 1.27 centimeter) rectangular pieces. About half of the pieces were cut parallel to the warp direction and about half of the piece were cut parallel to the fill direction, 26 rectangular pieces from each laminate (13 cut parallel to the warp direction and 13 cut parallel to the fill direction) were then placed in reflux apparatus with water and the water was brought to a boil. The water was allowed to boil for 24 hours. After 24 hours, the piece were removed from the water and towel dried. The remaining 26 piece from each laminate were not boiled. An unclad control laminate made using a conventional heat-cleaned and finished fabric in the same manner as described above in Example 9 for making the test laminates, was also fabricated and tested according to the above procedure.

The short beam shear strength of both the boiled and unboiled piece were then measured according to ASTM D 2344-84. The result of the testing are given below in Table 9, where Unclad Samples M, BB and CC correspond to laminates made using fabrics (described in Example 9) having fibers sized with sizing compositions M, BB, CC, respectively. As discussed above, the control sample was made using a conventional heat-cleaned and finished fabric. The thickness of the test laminates (Unclad Samples AA, BB and CC) ranged from 0.050 inches (about 0.127 centimeters) to 0.063 inches (about 0.160 centimeters). The ratio of the span length to sample thickness during testing was 5.

TABLE 16

| Test | Units | AA | BB | CC | Control |
|---|---|---|---|---|---|
| Short Beam Shear Strength, No Boil, Warp Direction | Pounds per square inch (megaPascals) | 7787 (54) | 8477 (56) | 7769 (54) | 7382 (51) |
| Sample Thickness N = 13 | Inches (centimeters) | 0.060 (0.152) | 0.050 (0.127) | 0.056 (0.142) | 0.055 (0.140) |
| Short Beam Shear Strength, No Boil, Fill Direction | Pounds per square inch (megaPascals) | 6626 (46) | 7594 (52) | 7118 (49) | 5506 (38) |
| Sample Thickness N = 13 | Inches (centimeters) | 0.061 (0.155) | 0.050 (0.127) | 0.060 (0.152) | 0.055 (0.140) |
| Short Beam Shear Strength, 24 Hour Boil, Warp Direction | Pounds per square inch (megaPascals) | 5695 (39) | 6522 (45) | 5081 (35) | 4929 (34) |
| Sample Thickness N = 13 | Inches (centimeters) | 0.061 (0.155) | 0.051 (0.130) | 0.057 (0.145) | 0.057 (0.145) |
| Short Beam Shear Strength, 24 Hour Boil, Fill Direction | Pounds per square inch (megaPascals) | 5266 (36) | 5832 (40) | 5179 (36) | 4116 (28) |
| Sample Thickness N = 13 | Inches (centimeters) | 0.063 (0.160) | 0.051 (0.130) | 0.062 (0.157) | 0.056 (0.142) |

The short beam shear strengths of the test laminates (Unclad Samples M, BB, CC) in both the warp and fill directions, both before and after water boil, were observed to be higher than the control sample in this testing.

EXAMPLE 17

Fill yarns made from E-glass fiber strands sized with sizing composition CC given in Table 9A of Example 9 and warp yarns made PPG Industries, Inc.'s 1383 commercially available fiber glass yarn product were woven into 7628 style fabric using an air-jet loom. The fabric was subsequently prepregged and laminated to form copper clad laminates as described above in Example 9.

Figure 13:
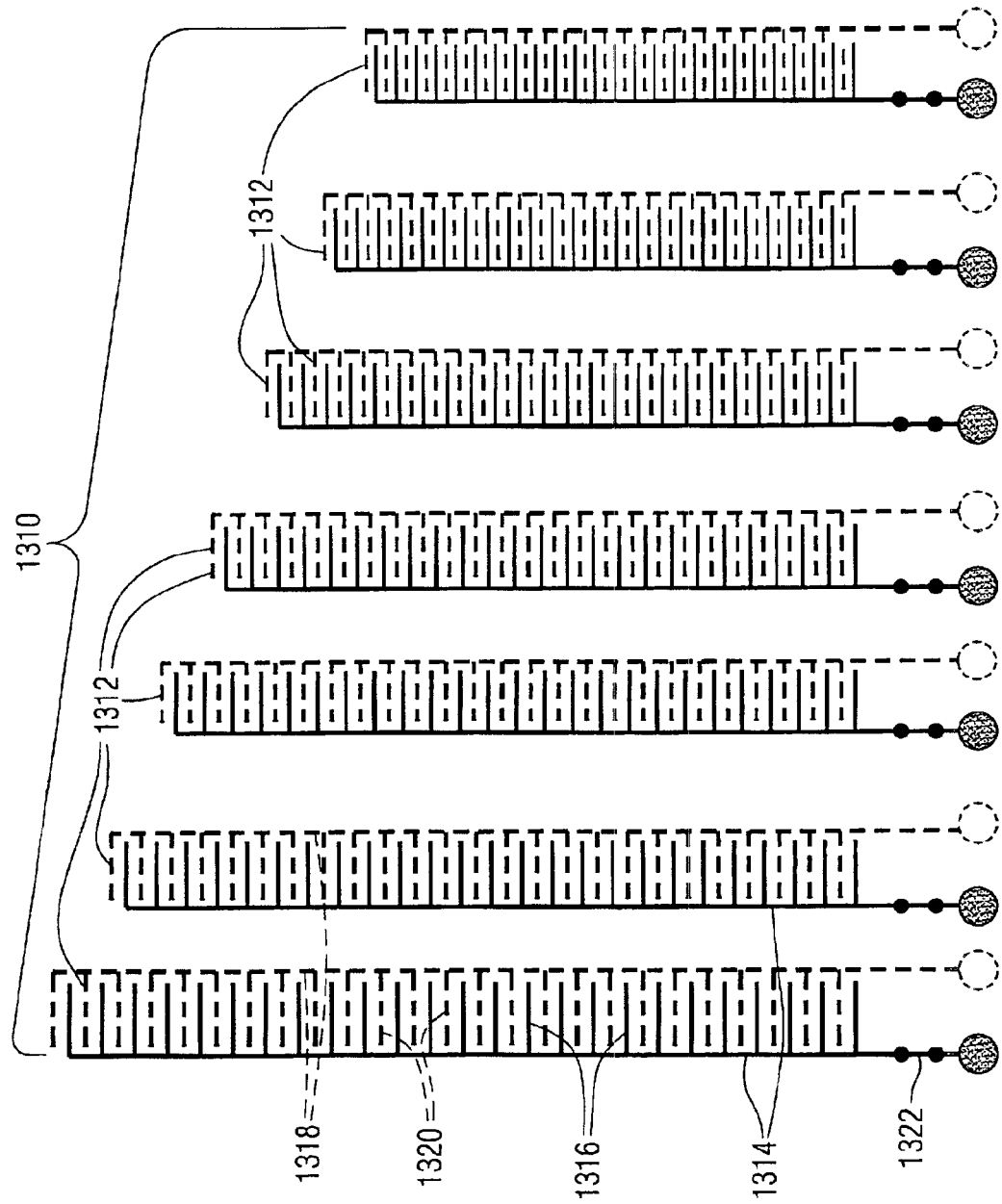
FIG. 13 is a diagram of circuit patterns.

Copper clad laminate CC (as described above in Example 9) was subsequently processed (i.e., drilled, plated and patterned) into test boards having a plurality of least patterns for testing metal migration performance. More particularly, each board included three sets of seven similar circuit patterns 1310 as shown in FIG. 13. One set of patterns was oriented along the X-axis of the board, another along the Y-axis of the board, and a third along a 45° angle across the board. Each circuit pattern 1310 included 50 rows of five drilled holes 1312, each having a diameter of 13.5 mil., and a center-to-center spacing between holes In adjacent rows ranging from 40 to 54.7 mil. In drilling these holes, two boards were stacked together so that both could be drilled in a single drilling operation. Alternating rows of holes in each pattern were interconnected by bus bar 1314 and leads 1316 along a first major surface of the board as shown in FIG. 13. Wire leads were soldered to each bus bar for connection to a power source. Each circuit further included a 1 K ohm surface resistor 1322 to ensure that if one circuit failed, power supply to the remaining circuits would be maintained. Each board was soaked In 76.7° C. (170° F.) deionized water for ten minutes to remove any solder flux residue and dried. The boards were then placed in a chamber at 85° C. (185° F.) and 85% relative humidity, and a 13.5 volt DC current was continuously applied across the patterns. Every 200 hours the chamber was shut down, the chamber door was opened to allow the patterns to stabilize to ambient lab temperature, and the insulation resistance for each pattern was measured.

There were two Sample CC boards and two control boards. The control boards were made in the same way as the Sample CC boards but used conventional heat-cleaned and finished fabrics. Each board included 21 circuit patterns (i.e., three sets of seven circuit patterns) for a total of 42 circuits tested for both the Sample CC boards and the control boards. The results for 200, 400 and 1000 hours are given below in Table 17 where the tabled values are the number of patterns with the specified resistance.

TABLE 17

| Insulation Resistance | Sample CC | | | Control |
|---|---|---|---|---|
| OHMS | 200 Hrs. | 400 Hrs. | 1000 Hrs. | 400 Hrs. |
| Short | 0 | 1 | 7 | 42 |
| $10^5$ | 1 | 4 | 2 | 0 |
| $10^6$ | 1 | 1 | 1 | 0 |
| $10^7$ | 0 | 2 | 0 | 0 |
| $10^8$ | 1 | 0 | 1 | 0 |
| $10^9$ | 3 | 2 | 1 | 0 |
| $\geq 10^{10}$ | 36 | 32 | 30 | 0 |

The Sample CC boards had fewer shorts than the control boards after 200 hours of exposure. After 400 hours of exposure, all the control board patterns had failed. For purposes of this test sample, a "short" refers to an insulation resistance value of less than 105 ohms.

EXAMPLE 18

Each of the components in the amount set forth in Table 18A were mixed to form aqueous resin compatible primary size Sample RR according to the present invention. Less than 1 weight percent of acetic acid on a total weight basis was included in the composition. Sample RR was applied to glass fibers forming G-75 E-glass fiber strands. The coated glass fiber strands were twisted to form a twisted yarn and wound onto bobbins in a similar manner using conventional twisting equipment. The coated yarn had an LOI of 0.35%.

TABLE 18A

Weight Percent of Component on Total Solids Basis for Sample RR Sizing

| COMPONENT | SAMPLE RR |
|---|---|
| RD-847A[215] | 27.0 |
| DESMOPHEN 2000[216] | 36.2 |
| PVP K-30[217] | 9.0 |
| A-187[218] | 2.1 |
| A-174[219] | 4.4 |
| PLURONIC F-108[220] | 9.0 |
| VERSAMID 140[221] | 4.4 |
| MACOL NP-6[222] | 5.4 |
| POLARTHERM PT 160[223] | 0.9 |
| RELEASECOAT-CONC 25[224] | 1.5 |
| acetic acid | <0.1 |

[215]RD-847A polyester resin, which is commercially available from Borden Chemicals of Columbus, Ohio.
[216]DESMOPHEN 2000 polyethylene adipate diol, which is commercially available from Bayer of Pittsburgh, Pennsylvania.
[217]PVP K-30 polyvinyl pyrrolidone, which is commercially available from ISP Chemicals of Wayne, New Jersey.
[218]A-187 gamma-glycidoxypropyltrimethoxysilane, which is commercially available from OSi Specialties, Inc. of Tarrytown, New York.
[219]A-174 gamma-methacryloxypropyltrimethoxysilane, which is commercially available from OSi Specialties, Inc. of Tarrytown, New York.
[220]PLURONIC ™ F-108 polyoxypropylene-polyoxyethylene copolymer, which is commercially available from BASF Corporation of Parsippany, New Jersey.
[221]VERSAMID 140 polyamide, which is commercially available from General Mills Chemicals, Inc.
[222]MACOL NP-6 nonylphenol surfactant, which is commercially available from BASF of Parsippany, New Jersey.
[223]POLARTHERM ® PT 160 boron nitride powder particles, which are commercially available from Advanced Ceramics Corporation of Lakewood, Ohio.
[224]ORPAC BORON NITRIDE RELEASECOAT-CONC 25, which is commercially available from ZYP Coatings, Inc. of Oak Ridge, Tennessee.

Each of the components in the amount set forth in Table 18B was mixed to form aqueous resin compatible primary size Sample SS according to the present invention. Sample SS was applied to glass fibers forming G-75 E-glass fiber strands and the strands were not twisted. The coated, untwisted yarn had an LOI of 0.7%.

TABLE 18B

Pounds of Component per 100 Gallons of Sample SS Sizing

| COMPONENT | SAMPLE SS |
|---|---|
| MAPEG 600 DOT[225] | 9.24 |
| ALUBRASPIN 226[226] | 1.9 |
| A-174[227] | 10.9 |
| A-187[228] | 5.45 |
| A-1100[229] | 2.41 |
| EPON 880[230] | 91.1 |

TABLE 18B-continued

| COMPONENT | Pounds of Component per 100 Gallons of Sample SS Sizing SAMPLE SS |
|---|---|
| PLURONIC F-108[231] | 9.11 |
| ALKAMULS EL-719[232] | 9.11 |
| MACOL OP-10-SP[233] | 4.57 |
| EPIREZ 3522[234] | 20.9 |
| acetic acid | 2.6 |

[225]is an ethyoxylated di-tallate from BASF Corp.
[226]ALUBRASPIN 226 partially amidated polyethylene imine, which is commercially available from BASF Corp. of Parsippany, New Jersey.
[227]A-174 gamma-methacryloxypropyltrimethoxysilane which is commercially available from CK Witco Corporation of Tarrytown, New York.
[228]A-187 gamma-glycidoxypropyltrimethoxysilane which is commercially available from CK Witco Corporation of Tarrytown, New York.
[229]A-1100 amino-functional organo silane coupling agent which is commercially available from CK Witco Corporation of Tarrytown, New York.
[230]EPON ® 880 epoxy resin, which is commercially available from Shell Chemical Company of Houston, Texas.
[231]PLURONIC ™ F-108 polyoxypropylene-polyoxyethylene copolymer which is commercially available from BASF Corporation of Parsippany, New Jersey.
[232]ALKAMULS EL-719 polyoxyethylated vegetable oil which is commercially available from Rhone-Poulenc.
[233]MACOL OP-10 SP ethoxylated alkylphenol which is commercially available from BASF Corp. of Parsippany, New Jersey.
[234]Dispersion of a solid bis-phenol A glycidyl ether epoxy resin from Shell Chemical Company of Houston, Texas.

Yarns sized with Samples RR and SS were used as warp and fill (or weft) yarns and woven into 7628 style fabric. A control yarn, which was a commercially available G-75 E-glass twisted yarn having fibers coated with PPG 695 sizing and available from PPG Industries, Inc., Pittsburgh, Pa. (hereinafter the "Control Sample"), was also woven into a 7628 style fabric. The sized warp and fill control yarns had an LOI of 1%. Prior to weaving, the warp yarn was slashed with a polyvinyl alcohol composition that increased the LOI of the warp yarn to about 2 to about 2.5%. The resulting fabric had an LOI ranging from 1.6 to 1.9%.

Each fabric was tested for air permeability according the test procedures established in ASTM D 737 Standard Test Method for Air Permeability of Textile Fabrics. The average air permeability for the fabric wovens is shown below in Table 18C.

TABLE 18C

|  | Air Permeability (standard cubic feet per minute per square foot) |
|---|---|
| Control Sample | 41 |
| Sample RR | 2.8 |
| Sample SS | 1.6 |

As can be seen in Table 18C, the air permeability for the woven fabrics incorporating Samples A and B is significantly lower than that of the fabric woven with the Control Sample.

EXAMPLE 19

Table 19 includes additional nonlimiting sizing formulations applied to glass fibers that were subsequently woven into a fabric. Less than 1 weight percent of acetic acid was included in each composition.

TABLE 19

| COMPONENT | Weight Percent of Component on a Total Solids Basis | | | | |
|---|---|---|---|---|---|
|  | Sample TT | Sample UU | Sample VV | Sample WW | Sample XX |
| PVP K-30[235] | 13.7 | 13.5 | 15.3 | 14.7 | 14.2 |
| STEPANTEX 653[236] | 27.9 |  | 13.6 |  | 12.6 |
| A-187[237] | 1.7 | 1.9 | 1.9 | 1.8 | 1.7 |
| A-174[238] | 3.4 | 3.8 | 3.8 | 3.7 | 3.5 |
| EMERY 6717[239] | 2.3 | 1.9 | 2.5 | 2.4 | 2.4 |
| MACOL OP-10[240] | 1.5 |  | 1.7 | 1.6 | 1.6 |
| TMAZ-81[241] | 3.0 |  | 3.4 | 3.3 | 3.1 |
| MAZU DF-136[242] | 0.2 |  | 0.3 | 0.2 | 0.2 |
| ROPAQUE OP-96[243] | 39.3 |  | 43.9 | 42.3 | 40.7 |
| RELEASECOAT-CONC 25[244] | 4.2 | 6.4 |  |  | 4.5 |
| POLARTHERM PT 160[245] | 2.7 | 2.6 |  |  | 2.8 |
| SAG 10[246] |  | 0.2 |  |  |  |
| RD-847A[247] |  | 23.2 |  |  |  |
| DESMOPHEN 2000[248] |  | 31.2 |  |  |  |
| PLURONIC F-108[249] |  | 8.5 |  |  |  |
| ALKAMULS EL-719[250] |  | 3.4 |  |  |  |

TABLE 19-continued

Weight Percent of Component on a Total Solids Basis

| COMPONENT | Sample TT | Sample UU | Sample VV | Sample WW | Sample XX |
|---|---|---|---|---|---|
| ICONOL NP-6[251] | | 3.4 | | | |
| FLEXOL EPO[252] | | | 13.6 | 30.0 | 12.6 |

[235]PVP K-30 polyvinyl pyrrolidone which is commercially available from ISP Chemicals of Wayne, New Jersey.
[236]STEPANTEX 653 which is commercially available from Stepan Company of Maywood, New Jersey.
[237]A-187 gamma-glycidoxypropyltrimethoxysilane which is commercially available from CK Witco Corporation of Tarrytown, New York.
[238]A-174 gamma-methacryloxypropyltrimethoxysilane which is commercially available from CK Witco Corporation of Tarrytown, New York.
[239]EMERY ® 6717 partially amidated polyethylene imine which is commercially available from Cognis Corporation of Cincinnati, Ohio.
[240]MACOL OP-10 ethoxylated alkylphenol; this material is similar to MACOL OP-10 SP except that OP-10 SP receives a post treatment to remove the catalyst; MACOL OP-10 is no longer commercially available.
[241]TMAZ-81 ethylene oxide derivative of a sorbitol ester which is commercially available from BASF Corp. of Parsippany, New Jersey.
[242]MAZU DF-136 anti-foaming agent which is commercially available from BASF Corp. of Parsippany, New Jersey.
[243]ROPAQUE ® OP-96, 0.55 micron particle dispersion which is commercially available from Rohm and Haas Company of Philadelphia, Pennsylvania.
[244]ORPAC BORON NITRIDE RELEASECOAT-CONC 25 boron nitride dispersion which is commercially available from ZYP Coatings, Inc. of Oak Ridge, Tennessee.
[245]POLARTHERM ® PT 160 boron nitride powder which is commercially available from Advanced Ceramics Corporation of Lakewood, Ohio.
[246]SAG 10 anti-foaming material, which is commercially available from CK Witco Corporation of Greenwich, Connecticut.
[247]RD-847A polyester resin which is commercially available from Borden Chemicals of Columbus, Ohio.
[248]DESMOPHEN 2000 polyethylene adipate diol which is commercially available from Bayer Corp. of Pittsburgh, Pennsylvania.
[249]PLURONIC ™ F-108 polyoxypropylene-polyoxyethylene copolymer which is commercially available from BASF Corporation of Parsippany, New Jersey.
[250]ALKAMULS EL-719 polyoxyethylated vegetable oil which is commercially available from Rhone-Poulenc.
[251]ICONOL NP-6 alkoxylated nonyl phenol which is commercially available from BASF Corporation of Parsippany, New Jersey.
[252]FLEXOL EPO epoxidized soybean oil commercially available from Union Carbide Corp. of Danbury, Connecticut.

From the foregoing description, it can be seen that the present invention provides glass fiber strands having an abrasion-resistant coating which provide good thermal stability, low corrosion and reactivity in the presence of high humidity, reactive acids and alkalies and compatibility with a variety of polymeric matrix materials. These strands can be twisted or chopped, formed into a roving, chopped mat or continuous strand mat or woven or knitted into a fabric for use in a wide variety of applications, such as reinforcements for composites such as printed circuit boards.

It will be appreciated by those skilled in the art that changes could be made to the embodiments described above without departing from the broad inventive concept thereof. It is understood, therefore, that this invention is not limited to the particular embodiments disclosed, but it is intended to cover modifications that are within the spirit and scope of the invention, as defined by the appended claims.

What is claimed is:

1. An at least partially coated fiber strand comprising a plurality of glass fibers having a powdered coating composition on at least a portion of at least one of the glass fibers, the powdered coating composition comprising at least one coating comprising greater than 20 weight percent on a total solids basis of a plurality of particles selected from inorganic particles, organic hollow particles, composite particles, and mixtures of any of the foregoing, wherein the plurality of particles have a Mohs' hardness value which does not exceed the Mohs' hardness value of the glass fibers.

2. An at least partially coated fiber strand according to claim 1, wherein the coating composition is a resin compatible coating composition.

3. An at least partially coated fiber strand according to claim 1, wherein the plurality of particles have a Mohs' hardness value ranging from 0.5 to 6.

4. An at least partially coated fiber strand according to claim 1, wherein the plurality of glass fibers are selected from E-glass fibers, D-glass fibers, S-glass fibers, Q-glass fibers, E-glass derivative fibers, and mixtures of any of the foregoing.

5. An at least partially coated fiber strand according to claim 4, wherein the plurality of glass fibers are selected from E-glass fibers.

6. An at least partially coated fiber strand according to claim 4, wherein the plurality of glass fibers are selected from E-glass derivative fibers.

7. An at least partially coated fiber strand according to claim 1, wherein the inorganic particles are selected from boron nitride, graphite, molybdenum disulfide, talc, mica, kaolinite, gypsum, calcium carbonate, calcium fluoride, zinc oxide, aluminum, copper, iron, gold, nickel, palladium, platinum, silver, zinc sulfide, and mixtures of any of the foregoing.

8. An at least partially coated fiber strand according to claim 7, wherein the inorganic particles comprise at least one particle selected from boron nitride particles.

9. An at least partially coated fiber strand according to claim 8, wherein the inorganic particles comprise at least one particle selected from hexagonal crystal structure boron nitride particles.

10. An at least partially coated fiber strand according to claim 1, wherein the organic hollow particles are selected from acrylic polymers.

11. An at least partially coated fiber strand according to claim 10, wherein the acrylic polymers are selected from copolymers formed from at least one styrene monomer and at least one acrylic acid monomer, and polymers formed from at least one methacrylate monomer.

12. An at least partially coated fiber strand according to claim 1, wherein the composite particles are selected from particles that have a hardness at their surface that is different from the hardness of the internal portions of the particle beneath its surface.

13. An at least partially coated fiber strand according to claim 12, wherein the composite particles are selected from particles formed from a primary material that is coated, clad or encapsulated with at least one secondary material.

14. An at least partially coated fiber strand according to claim 12, wherein the composite particles are selected from particles formed from a primary material that is coated, clad or encapsulated with a differing form of the primary material.

15. An at least partially coated fiber strand according to claim 1, wherein the composite particles are selected from particles formed from an inorganic material coated with a material selected from silicas, carbonates and nanoclays.

16. An at least partially coated fiber strand according to claim 1, wherein the plurality of particles are present in the coating composition in an amount ranging from 25 to 80 weight percent on a total solids basis.

17. An at least partially coated fiber strand according to claim 16, wherein the plurality of particles are present in the coating composition in an amount ranging from 50 to 60 weight percent on a total solids basis.

18. An at least partially coated fiber strand according to claim 1, wherein the coating composition further comprises at least one lubricious material different from said plurality of particles.

19. An at least partially coated fiber strand according to claim 1, wherein the coating composition further comprises at least one film-forming material.

20. An at least partially coated fiber strand according to claim 1, wherein the coating composition comprises a primary coating of at least one sizing composition on at least a portion of a surface of at least one of the glass fibers and a secondary coating composition, on at least a portion of the primary coating, comprising the plurality of particles having a Mohs' hardness value which does not exceed the Mohs' hardness value of the glass fibers.

21. An at least partially coated fiber strand according to claim 1, wherein the coating composition comprises a primary coating of at least one sizing composition on at least a portion of a surface of at least one of the glass fiber, a secondary coating on at least a portion of the primary coating, and a tertiary coating composition, on at least a portion of the secondary coating, comprising the plurality of particles having a Mohs' hardness value which does not exceed the Mohs' hardness value of the glass fibers.

22. An at least partially coated fiber strand according to claim 1, wherein the coating composition comprises a resin reactive diluent.

23. An at least partially coated fiber strand according to claim 22, wherein the resin reactive diluent is a lubricant comprising one or more functional groups capable of reacting with an epoxy resin system and selected from the group consisting of amine groups, alcohol groups, anhydride groups, acid groups and epoxy groups.

24. An at least partially coated fiber strand according to claim 1, wherein the plurality of lamellar particles have a thermal conductivity of at least 1 Watt per meter ° K at a temperature of 300° K.

25. An at least partially coated fiber strand according to claim 24, wherein the plurality of lamellar particles have a thermal conductivity ranging from 5 to 2000 Watts per meter °K at a temperature of 300° K.

26. An at least partially coated fiber strand comprising a plurality of glass fibers having a powdered coating composition on at least a portion of a surface of at least one of said glass fibers, the powdered coating composition comprising:

(a) a plurality of hollow organic particles having a Mohs' hardness value which does not exceed the Mohs' hardness value of the glass fibers; and (b) at least one polymeric material different from at least one of the hollow organic particles.

27. An at least partially coated fiber strand according to claim 26, wherein the coating composition is a resin compatible coating composition.

28. An at least partially coated fiber strand according to claim 26, wherein the plurality of particles have a Mohs' hardness value ranging from 0.5 to 6.

29. An at least partially coated fiber strand according to claim 26, wherein the at least one polymeric material is selected from polymeric organic materials, polymeric inorganic materials, and mixtures thereof.

30. A glass fiber comprising a powdered coating composition comprising at least one coating comprising greater than 20 weight percent on a total solids basis of a plurality of particles selected from inorganic particles, organic hollow particles, and composite particles, wherein the plurality of particles have a Mohs' hardness value which does not exceed the Mohs' hardness value of the glass fiber.

31. A fiber according to claim 30, wherein the coating composition is a resin compatible coating composition.

32. A fiber according to claim 30, wherein the plurality of particles have a Mohs' hardness value ranging from 0.5 to 6.

33. A glass fiber comprising a powdered coating composition comprising:

(a) a plurality of hollow organic particles having a Mohs' hardness value which does not exceed the Mohs' hardness value of the glass fiber; and (b) at least one polymeric material different from at least one of the hollow organic particles.

34. A fiber according to claim 33, wherein the coating composition is a resin compatible coating composition.

35. A fiber according to claim 33, wherein the plurality of particles have a Mohs' hardness value ranging from 0.5 to 6.

* * * * *